(12) United States Patent
Kijima et al.

(10) Patent No.: US 9,028,718 B2
(45) Date of Patent: *May 12, 2015

(54) LIGHT-EMITTING DEVICE, WHITE LIGHT-EMITTING DEVICE, ILLUMINATOR, AND IMAGE DISPLAY

(75) Inventors: Naoto Kijima, Yokohama (JP); Yasuo Shimomura, Yokohama (JP); Hideaki Kaneda, Ushiku (JP); Kimiya Takeshita, Yokohama (JP)

(73) Assignee: Mitsubishi Chemical Corporation, Tokyo (JP)

(*) Notice: Subject to any disclaimer, the term of this patent is extended or adjusted under 35 U.S.C. 154(b) by 156 days.

This patent is subject to a terminal disclaimer.

(21) Appl. No.: 13/533,242

(22) Filed: Jun. 26, 2012

(65) Prior Publication Data

US 2012/0267997 A1   Oct. 25, 2012

Related U.S. Application Data

(62) Division of application No. 11/909,009, filed as application No. PCT/JP2006/305455 on Mar. 17, 2006, now Pat. No. 8,269,410.

(30) Foreign Application Priority Data

| Mar. 18, 2005 | (JP) | ................................ 2005-080033 |
| Mar. 28, 2005 | (JP) | ................................ 2005-092976 |
| Mar. 31, 2005 | (JP) | ................................ 2005-103148 |
| May 24, 2005 | (JP) | ................................ 2005-151175 |
| Jun. 17, 2005 | (JP) | ................................ 2005-178377 |

(51) Int. Cl.
*H01L 33/50* (2010.01)
*H01L 33/52* (2010.01)
(Continued)

(52) U.S. Cl.
CPC ........... *C09K 11/7721* (2013.01); *C09K 11/661* (2013.01); *C09K 11/7734* (2013.01);
(Continued)

(58) Field of Classification Search
USPC .............................. 313/498, 512; 252/301.4 F
See application file for complete search history.

(56) References Cited

U.S. PATENT DOCUMENTS 3,468,801 A   9/1969   Wilson et al.
4,093,890 A   6/1978   Verriet et al.
(Continued)

FOREIGN PATENT DOCUMENTS

EP   1 413 619 A1   4/2004
EP   1 777 280 A1   4/2007
(Continued)

OTHER PUBLICATIONS

Office Action issued Mar. 19, 2013 in Japanese Patent Application No. 2006-088610 with English language translation.
(Continued)

*Primary Examiner* — Carol M Koslow
(74) *Attorney, Agent, or Firm* — Oblon, Spivak, McClelland, Maier & Neustadt, L.L.P.

(57) ABSTRACT

To achieve a light-emitting device emitting light with high brightness, closer to natural light, and less color shift due to a small change in intensity of emitted light, in a light-emitting device including a light source emitting light by driving current and at least one wavelength-converting material absorbing at least part of the light from the light source and emitting light having a different wavelength, the color coordinate $x_1(17.5)$ and the color coordinate $y_1(17.5)$ of the light emitted at a driving current density of 17.5 A/cm² and the color coordinate $x_1(70)$ and the color coordinate $y_1(70)$ of the light emitted at a driving current density of 70 A/cm² satisfy the following Expressions (D) and (E):

$-0.006 \leq x_1(17.5) - x_1(70) \leq 0.006$ (D), $-0.006 \leq y_1(17.5) - y_1(70) \leq 0.006$ (E).

18 Claims, 16 Drawing Sheets

(51) Int. Cl.
  *C09K 11/77* (2006.01)
  *C09K 11/66* (2006.01)
  *H01L 23/00* (2006.01)

(52) U.S. Cl.
  CPC ......... *C09K11/7739* (2013.01); *C09K 11/7774* (2013.01); *C09K 11/778* (2013.01); *C09K 11/7784* (2013.01); *C09K 11/7788* (2013.01); *C09K 11/7794* (2013.01); *H01L 33/502* (2013.01); *Y02B 20/181* (2013.01); *H01L 2224/73265* (2013.01); *H01L 2224/32245* (2013.01); *H01L 2224/48091* (2013.01); *H01L 2224/48247* (2013.01); *H01L 2224/48257* (2013.01); *H01L 2224/45144* (2013.01); *H01L 24/45* (2013.01); *H01L 2224/45015* (2013.01); *H01L 2224/45124* (2013.01)

(56) References Cited

U.S. PATENT DOCUMENTS

| | | | |
|---|---|---|---|
| 5,608,554 | A | 3/1997 | Do et al. |
| 6,252,254 | B1 | 6/2001 | Soules et al. |
| 6,521,915 | B2 | 2/2003 | Odaki et al. |
| 6,717,353 | B1 | 4/2004 | Mueller et al. |
| 6,844,903 | B2 | 1/2005 | Mueller-Mach et al. |
| 7,094,362 | B2 | 8/2006 | Setlur et al. |
| 7,189,340 | B2 | 3/2007 | Shimomura et al. |
| 7,432,642 | B2 | 10/2008 | Murazaki |
| 7,474,050 | B2 | 1/2009 | Kaneda et al. |
| 7,830,472 | B2 * | 11/2010 | Kawana et al. .......... 349/61 |
| 7,965,031 | B2 | 6/2011 | Brunner et al. |
| 8,030,840 | B2 | 10/2011 | Kaneda et al. |
| 8,268,410 | B2 * | 9/2012 | Moelle et al. .......... 427/569 |
| 2002/0043926 | A1 | 4/2002 | Takahashi et al. |
| 2003/0030368 | A1 | 2/2003 | Ellens et al. |
| 2003/0155856 | A1 | 8/2003 | Shiiki et al. |
| 2004/0251809 | A1 * | 12/2004 | Shimomura et al. .......... 313/485 |
| 2005/0046334 | A1 | 3/2005 | Fujiwara |
| 2005/0073845 | A1 | 4/2005 | Matsui |
| 2005/0093442 | A1 * | 5/2005 | Setlur et al. .......... 313/512 |
| 2005/0156496 | A1 * | 7/2005 | Takashima et al. .......... 313/237 |
| 2005/0179364 | A1 | 8/2005 | Murazaki |
| 2005/0189863 | A1 * | 9/2005 | Nagatomi et al. .......... 313/486 |
| 2006/0006782 | A1 | 1/2006 | Nagatomi et al. |
| 2006/0017041 | A1 | 1/2006 | Tian et al. |
| 2006/0017365 | A1 | 1/2006 | Nagatomi et al. |
| 2006/0022573 | A1 | 2/2006 | Gotoh et al. |
| 2006/0033083 | A1 | 2/2006 | Sakane et al. |
| 2006/0043337 | A1 | 3/2006 | Sakane et al. |
| 2006/0045832 | A1 | 3/2006 | Nagatomi et al. |
| 2006/0065878 | A1 | 3/2006 | Sakane et al. |
| 2006/0071589 | A1 * | 4/2006 | Radkov .......... 313/487 |
| 2006/0091790 | A1 | 5/2006 | Nagatomi et al. |
| 2006/0097245 | A1 | 5/2006 | Aanegola et al. |
| 2006/0181192 | A1 | 8/2006 | Radkov et al. |
| 2006/0192178 | A1 | 8/2006 | Hirosaki |
| 2006/0197432 | A1 | 9/2006 | Nagatomi et al. |
| 2006/0255710 | A1 | 11/2006 | Mueller-Mach et al. |
| 2007/0007494 | A1 | 1/2007 | Hirosaki et al. |
| 2007/0040152 | A1 | 2/2007 | Oshio |
| 2007/0085466 | A1 | 4/2007 | Shimomura et al. |
| 2007/0108896 | A1 | 5/2007 | Hirosaki |
| 2007/0159091 | A1 | 7/2007 | Hirosaki et al. |
| 2007/0222360 | A1 | 9/2007 | Kaneda et al. |
| 2007/0257596 | A1 | 11/2007 | Shimomura et al. |
| 2007/0259206 | A1 | 11/2007 | Oshio |
| 2008/0315235 | A1 | 12/2008 | Murazaki |

FOREIGN PATENT DOCUMENTS

| | | |
|---|---|---|
| EP | 1 837 386 A1 | 9/2007 |
| EP | 1 845 146 A1 | 10/2007 |
| JP | 7-288341 | 10/1995 |
| JP | 8-63119 | 3/1996 |
| JP | 2526407 | 6/1996 |
| JP | 10-207395 | 8/1998 |
| JP | 2001-148516 A | 5/2001 |
| JP | 2002-363554 A | 12/2002 |
| JP | 2003-179259 | 6/2003 |
| JP | 2003-249694 | 9/2003 |
| JP | 2003-332631 A | 11/2003 |
| JP | 2004-71726 | 3/2004 |
| JP | 2004-115633 A | 4/2004 |
| JP | 2004-182781 | 7/2004 |
| JP | 2004-184852 | 7/2004 |
| JP | 2004-210921 | 7/2004 |
| JP | 2004-348096 | 12/2004 |
| JP | 2005-008844 | 1/2005 |
| JP | 2005-302920 | 10/2005 |
| JP | 2005-336253 | 12/2005 |
| JP | 2006-8948 | 1/2006 |
| JP | 2006-28295 | 2/2006 |
| JP | 2006-63286 | 3/2006 |
| JP | 2006-70088 | 3/2006 |
| JP | 2006-70109 | 3/2006 |
| JP | 2006-306981 | 11/2006 |
| JP | 2006-306982 | 11/2006 |
| WO | WO 00/33390 | 6/2000 |
| WO | WO 03/092081 A1 | 11/2003 |
| WO | WO 2005/019376 A1 | 3/2005 |
| WO | WO 2005/031797 A2 | 4/2005 |
| WO | WO 2005/044947 A2 | 5/2005 |
| WO | WO 2005/103199 * | 11/2005 |
| WO | WO 2005/111707 * | 11/2005 |
| WO | WO 2006/077740 A1 | 7/2006 |
| WO | WO 2006/080535 A1 | 8/2006 |

OTHER PUBLICATIONS

U.S. Appl. No. 13/831,945, filed Mar. 15, 2013, Shimomura, et al.
Office Action issued May 22, 2012 in Japanese Patent Application No. 2006-144321 (with English-language translation).
Tokyo University of Technology, et al., "Temperature Dependence of Excitation Spectra of Red Nitride Phosphor, $CaAlSiN_3:EU^{2+}$ for White LEDs", Extended Abstracts (The $52^{nd}$ Spring Meeting): The Japan Society of Applied Physics and Related Societies, $3^{rd}$ part, 2005, p. 1614 (with English translation).
Satoshi Yasuda, et al., "Temperature dependence of photo luminescence intensity above room temperature of a red phosphor, $CaAlSiN_3:Eu^{2+}$", Extended Abstracts (The $65^{th}$ Autumn, Meeting, 2004); The Japan Society of Applied Physics, No. 3, Sep. 2004, p. 1282 and a front page.
Young-Duk Huh, et al., "Optical properties of three-band white light emitting diodes", Journal of Electrochemical Society, vol. 150, No. 2, 2003, pp. H57-H60.
K. Bando, Monthly Display, vol. 9, No. 4, Apr. 2003, pp. 20-26, two cover pages and p. 96.
"Success in Development of Red Phosphor for White Led—Beacon of New Era", National Institute for Materials Science, Aug. 31, 2004, 21 pages.
The Electrochemical Society, Inc., 2004 Joint International Meeting, Abs. 2073, $206^{th}$ Meeting, The Society for Solid-State and Electrochemical Science and Technology, Jun. 3, 2004, 3 pages.
K. Uheda, et al., "The Crystal Structure and Photoluminescence Properties of a New Red Phosphor, Calcium Aluminum Silicon Nitride Doped with Divalent Europium, $CaAlSiN_3:Eu^{2+}$", 2004 Joint International Meeting, ECS, Y1-Thirteenth International Symposium on the Physics and Chemistry of Luminescent Materials, Oct. 3-8, 2004, 17 pages.
The Japan Society of Applied Physics, "Nitride Phosphor-Related Presentation", Sep. 2004, 78 pages.
Office Action issued Jul. 12, 2011, in Japanese Patent Application No. 2006-144321.
Extended European Search Report issued Dec. 18, 2012, in Patent Application No. 06729444.7.
Rong-Jun Xie, et al., "$Eu^{2+}$-doped Ca-α-SiAlON: A yellow phosphor for white light-emitting diodes", Applied Physics Letters, vol. 84, No. 26, XP 012073129, Jun. 28, 2004, pp. 5404-5406.

* cited by examiner

LIGHT-EMITTING DEVICE, WHITE LIGHT-EMITTING DEVICE, ILLUMINATOR, AND IMAGE DISPLAY

CROSS-REFERENCE TO RELATED APPLICATIONS

The present application is a division of and claims the benefits of priority to U.S. Ser. No. 11/909,009, filed Sep. 18, 2007, now U.S. Pat. No. 8,269,410, which is a national stage of International Application No. PCT/JP2006/305445, filed Mar. 17, 2006. The International Application is based on and claims the benefits of priority to Japanese Patent Application Nos. 2005-080033, 2005-092976, 2005-103148, 2005-151175 and 2005-178377. The contents of all of the above applications are incorporated herein by reference in their entireties.

TECHNICAL FIELD

The present invention relates to a light-emitting device and white-light emitting device and relates to a lighting system and display including the light-emitting device or white-light emitting device. In particular, the present invention relates to a light-emitting device and white-light emitting device including a combination of a light source such as a light-emitting diode (LED) or laser diode (LD) and a wavelength-converting material such as a phosphor which absorbs light from the light source and emits light with a different wavelength and relates to a lighting system and image display apparatus including such a light-emitting device or white-light emitting device.

It is well known that a white-light emitting device formed of a combination of a semiconductor light-emitting element such as a gallium nitride (GaN) light-emitting diode (LED) and a phosphor functioning as a wavelength-converting material consumes less power and has a long operation time.

However, it is reported that the light intensity in the red region (600 nm or more) and in the blue-green region (480 nm to 510 nm) of this light-emitting device are small and thus the device exhibits low color rendering. Further, in this light-emitting device, when the current flowing in the light-emitting device is increased in order to obtain light with high intensity, the fluorescence intensity of the phosphor is decreased with an increase in the temperature of the phosphor by the heat generated in the light-emitting device, i.e., temperature quenching becomes significant. Therefore, the balance in the color mixture of blue light from a blue LED and yellow light from a phosphor is disrupted during the operation of this light-emitting device, and thereby the color of the light emitted from the white-light emitting device significantly deviates in some cases. In addition, the general color rendering index (Ra) of the light-emitting device is low, the color shift of the emitted light is increased during the operation of the light-emitting device, and then a stable color of the emitted light cannot be readily obtained. Consequently, further improvements have been required.

In order to improve the light-emitting device exhibiting low color rendering, Patent Document 1 discloses that a light-emitting device which emits synthetic white light can be obtained by using a $(Ca_{1-a-b}Sr_aEu_b)S:Eu^{2+}$ red phosphor for enhancing a red component in addition to the emission color from a $(Y_{1-a-b}Gd_aCe_b)_3(Al_{1-c}Ga_c)_5O_{12}$ green phosphor and exciting these phosphors with a blue LED.

In addition, Nonpatent Document 1 discloses a white-light emitting device using $SrGa_2S_4:Eu^{2+}$ as a green phosphor and ZnCdS:Ag, Cl as a red phosphor. Patent Document 2 discloses a white-light emitting device using $(Sr,Ca,Ba)(Al,Ga)_2S_4:Eu^{2+}$ as a green phosphor and $(Ca,Sr)S:Eu^{2+}$ as a red phosphor.

Furthermore, particularly in white-light emitting devices, cold-cathode fluorescent lams had been used as light sources such as lighting sources and backlight sources of liquid crystal displays. However, recently, as alternative light sources of these, white-light emitting devices including a combination of blue light-emitting elements and wavelength-converting materials absorbing blue light and emitting yellow light have been developed. In the white-light emitting devices, for example, an InGaN light-emitting diode (LED) is used as a blue light-emitting element and cerium-activated yttrium aluminate is used as a wavelength-converting material. However, the light spectrum generated by the conventional white-light emitting device is inherently lacking in blue-green light and red light components. Therefore, the conventional white-light emitting device exhibits low color rendering and low color reproducibility.

In order to solve these problems, it is suggested to compensate for the lack of the red component of the light emitted from a white-light emitting device and to improve the color rendering and color reproducibility by improving the yttrium aluminate (wavelength-converting material emitting yellow light) so as to emit yellow-green light by adjusting the components and adding a material absorbing blue light and emitting red light to the yttrium aluminate.

Furthermore, in Nonpatent Document 1, described above, discloses a white-light emitting device using a $SrGa_2S_4:Eu^{2+}$ green phosphor and a ZnCdS:Ag, Cl red phosphor as wavelength-converting materials.

Nonpatent Document 2 and Patent Document 3 also disclose white-light emitting devices each utilizing a combination of a light-emitting element and a wavelength-converting material.

Furthermore, in conventional image display apparatuses, color displays using LED (light-emitting diodes) are used as large screen displays of sign boards or advertising pillars (Patent Document 4). In addition, it is suggested to use an LED in a projective color display that projects an image on a screen (Patent Document 5). In these image display apparatuses such as color displays, images are displayed by using LED pixels, each emitting light of red, blue, or green.

In addition, as LED used in these image display apparatuses, generally, an InGaN LED are used for blue and green pixels and InAlGaP LED are used for red pixels.

[Patent Document 1] Japanese Unexamined Patent Application Publication No. 2003-243715
[Patent Document 2] Japanese Patent Application Laid-open (Translation of PCT Application) No. 2002-531956
[Patent Document 3] Japanese Patent Application Laid-open No. 2004-71726
[Patent Document 4] Japanese Patent Application Laid-open No. HEI 7-288341
[Patent Document 5] Japanese Patent Application Laid-open No. 2004-184852
[Nonpatent Document 1] J. Electrochem. Soc. 2003, 150, H57-H60.
[Nonpatent Document 2] Bando, K.; Gekkan Display (Monthly DISPLAY) 2003, April, pp 20-26.

DISCLOSURE OF INVENTION

Problem to be Solved by the Invention

According to the conventional technology disclosed in Patent Document 1, though the color rendering of a white-light emitting device are improved by a combination of these phosphors, each phosphor used in the combination is a material noticeably exhibiting temperature quenching. Therefore, there are problems that the luminous emitted from this light-emitting device is decreased and the color of the emitted light largely varies by increasing the value of current supplied to the white-light emitting device.

Furthermore, the red phosphors are sulfide red phosphors which have low moisture resistance, resulting in easy-degradation and they cannot be readily synthesized, resulting in high manufacturing costs. Consequently, a white-light emitting device using this has disadvantages in low durability and expensiveness. Furthermore, since light emitted from the green phosphor contains a large amount of yellow color component, the emission of blue-green light is insufficient, and the color rendering are inadequate.

Further, the conventional techniques disclosed in Nonpatent Document 1 and Patent Document 2 have problems that a sufficient luminous flux and color rendering cannot be achieved by the combination of those phosphors; the sulfide is readily degradable during the operation of the white-light emitting device; and the color of the emitted light largely varies as the current to the white-light emitting device increases due to noticeable temperature quenching of these phosphors.

A first object of the present invention is to solve the above-described problems in the conventional techniques and to provide a light-emitting device having high brightness, good color rendering, and less color shift of emitted light. That is, the present invention provides a light-emitting device emitting light with high brightness, closer to natural light, and less color shift due to a small change in intensity of emitted light and provides an image display apparatus and lighting system including the light-emitting device as a light source.

A second object of the present invention is to solve the above-described problems in the conventional techniques and to provide a light-emitting device having high emission efficiency, good color rendering, and less color shift of emitted light. That is, the present invention provides a light-emitting device emitting light with high brightness, closer to natural light, and less color shift due to a small change in intensity of emitted light and provides a lighting system and image-forming apparatus including such a light-emitting device as a light source.

Meanwhile, in conventional white-light emitting devices including those disclosed in Nonpatent Documents 1 and 2 and Patent Document 3, the color rendering have not been sufficiently high.

The present invention has been accomplished by also taking the above-mentioned problems into consideration, and a third object of the present invention is to provide a white-light emitting device exhibiting higher color rendering than those of conventional devices and including a light source such as a light-emitting element and a wavelength-converting material and to provide a lighting system including such a white-light emitting device.

Further, in conventional image display apparatuses such as LED color displays, the reduction rate of emission intensity due to an increase in the temperature of an LED (such as an InAlGaP LED) used as red pixels is larger than that of an LED (such as an InGaN LED) used as non-red pixels such as green and blue pixels. Therefore, the conventional LED image display apparatuses have disadvantages in that the color tone of a displayed image changes and thereby a color shift occurs with variable ambient temperature or by the heat generated in the LED with lapse of time after turning on the light.

For example, according to "Monthly DISPLAY 2003, April, 42-46", the ratio, I(B,100)/I(B,25), of the emission intensity I(B,100) at 100° C. to the emission intensity I(B,25) at 25° C. of an InGaN blue LED is about 95. Furthermore, the ratio, I(G,100)/I(G,25), of the emission intensity I(G,100) at 100° C. to the emission intensity I(G,25) at 25° C. of an InGaN green LED is about 70. However, the ratio, I(R,100)/I(R,25), of the emission intensity I(R,100) at 100° C. to the emission intensity I(R,25) at 25° C. of an AlInGaP red LED is about 45. Thus, in the conventional image display apparatus such as an LED color display, the decrease in the emission intensity of a red pixel of a red LED is larger than those of non-red pixels, resulting in a change in color tone and a color shift in the image display apparatus.

Technology to prevent such a change in the color tone is also developed in which a change in the color tone is corrected by feedback control based on the measurement of the color of emitted light and the temperature of an LED. However, a sensor or feedback circuit for measuring, for example, the temperature is complicated and the cost thereof is high. Consequently, it is difficult to reduce the price of the image display apparatus such as a color display.

The present invention has been accomplished by also taking the above-mentioned problems into consideration, and a fourth object of the present invention is to provide an image display apparatus with less color shift due to a change in the temperature.

Means for Solving the Problem

The present inventors have conducted intensive studies for solving the above-mentioned problems, have found the following facts, and have completed the present invention.

That is, first, the present inventors have conducted intensive studies to solve the above-mentioned problems and found the facts that a light-emitting device having high brightness, good color rendering, and less color shift due to a small change in light intensity can be obtained by using a phosphor mixture of which the ratio of brightnesses when it is excited by blue light at two different specific temperatures is within a prescribed range and of which differences in color at the specific temperatures are within prescribed ranges. Thus, the present inventors have accomplished the present invention.

Second, the present inventors have conducted intensive studies to solve the above-mentioned problems and found the fact that a light-emitting device satisfying all of the following three characteristics corresponds to the above-described desirable light-emitting device.

A first characteristic is that the emission efficiency of the light-emitting device is 32 μm/W or more;

A second characteristic is that the general color rendering index (Ra) is 85 or more; and A third characteristic is that the differences in color coordinates at two different driving current values of 17.5 A/cm² and 70 A/cm² are within the following ranges (F) and (G):

$$-0.01 \leq x_1(17.5) - x_1(70) \leq 0.01 \tag{F},$$

$$-0.01 \leq y_1(17.5) - y_1(70) \leq 0.01 \tag{G}.$$

The present inventors have found the fact that a light-emitting device having high emission efficiency, good color rendering, and less color shift due to a change in light intensity can be obtained by satisfying these conditions and have accomplished the present invention.

Third, the present inventors have conducted intensive studies to solve the above-mentioned problems and found the facts that the color rendering of a white-light emitting device can be improved by making the emission spectrum shape of white light emitted from the white-light emitting device more flat in the range of 500 nm to 650 nm than those in conventional devices and have completed the present invention.

Fourth, the present inventors have conducted intensive studies to solve the above-mentioned problems and found the facts that the temperature dependencies of emission intensity of three color pixels of red, blue, and green can be equalized by using a red-pixel element formed of a combination of a light-emitting element and a high-performance phosphor (wavelength-converting material) absorbing light emitted by the light-emitting element and emitting red light, instead of an InAlGaP LED, as a red pixel, and thereby a color display with less change in the color tone and less color shift can be provided. Thus, the present invention has been completed. Here, in the high-performance phosphor, preferably, a decrease in the emission efficiency due to an increase of temperature is small and the quantum yield is high. More preferably, the degradation of the phosphor in use is also small.

That is, a gist of the present invention is a light-emitting device including a light source emitting light by driving current and at least one wavelength-converting material absorbing at least part of the light from the light source and emitting light having a different wavelength, and the color coordinate $x_1(17.5)$ and the color coordinate $y_1(17.5)$ of the light emitted at a driving current density of 17.5 A/cm² and the color coordinate $x_1(70)$ and the color coordinate $y_1(70)$ of the light emitted at a driving current density of 70 A/cm² satisfy the following Expressions (D) and (E):

$$-0.006 \leq x_1(17.5) - x_1(70) \leq 0.006 \quad (D),$$

$$-0.006 \leq y_1(17.5) - y_1(70) \leq 0.006 \quad (E).$$

Another gist of the present invention is a light-emitting device including a light source emitting light by driving current and at least one wavelength-converting material absorbing at least part of the light from the light source and emitting light having a different wavelength. The light-emitting device has an emission efficiency of 32 lm/W or more and a general color rendering index (Ra) of 85 or more, and the color coordinate $x_1(17.5)$ and the color coordinate $y_1(17.5)$ of the light emitted at a driving current density of 17.5 A/cm² and the color coordinate $x_1(70)$ and the color coordinate $y_1(70)$ of the light emitted at a driving current density of 70 A/cm² satisfy the following Expressions (F) and (G) relating to the shift amounts $[x_1(17.5)-x_1(70)]$ and $[y_1(17.5)-y_1(70)]$ in the color coordinates x and y:

$$-0.01 \leq x_1(17.5) - x_1(70) \leq 0.01 \quad (F),$$

$$-0.01 \leq y_1(17.5) - y_1(70) \leq 0.01 \quad (G).$$

Here, the special color rendering index ($R_9$) is preferably 64 or more.

Preferably, the wavelength-converting material is a mixture of two or more phosphors, and the brightness BR(25), the color coordinate $x_2(25)$, and the color coordinate $y_2(25)$ of the fluorescence obtained by exciting the phosphor mixture with blue light having a peak wavelength of 455 nm at 25° C. and the brightness BR(125), the color coordinate $x_2(125)$, and the color coordinate $y_2(125)$ of the fluorescence obtained by exciting the phosphor mixture with the blue light at 125° C. satisfy following Expressions (A), (B), and (C):

$$0.85 \leq BR(125)/BR(25) \leq 1.15 \quad (A),$$

$$-0.03 \leq x_2(25) - x_2(125) \leq 0.03 \quad (B),$$

$$-0.03 \leq y_2(25) - y_2(125) \leq 0.03 \quad (C).$$

Preferably, the wavelength-converting material preferably contains at least one green phosphor having a fluorescence intensity peak value in the wavelength range of 500 to 550 nm.

Preferably, the wavelength-converting material preferably contains at least one red phosphor having a fluorescence intensity peak value in the wavelength range of 610 to 680 nm.

Another gist of the present invention is a lighting system including the above-mentioned light-emitting device.

Another gist (an eighth aspect) of the present invention is an image display apparatus including the above-mentioned light-emitting device.

Another gist of the present invention is a white-light emitting device which includes a light source and at least one wavelength-converting material absorbing at least part of the light from the light source and emitting light having a different wavelength and which emits white light containing the light emitted by the wavelength-converting material. The maximum intensity of the emission spectrum of the white light at the prescribed wavelength range of 500 to 650 nm is not higher than 150% of the minimum intensity in the prescribed wavelength range.

The brightness of the wavelength-converting material at 100° C. is preferably not less than 80% of that at 25° C.

In the white-light emitting device, preferably, the absorption efficiency of the wavelength-converting material for the light with the peak wavelength emitted by the light source is 50% or more and the internal quantum efficiency of the wavelength-converting material is 40% or more.

Another gist of the present invention is a lighting system including the white-light emitting device.

Another gist of the present invention is an image display apparatus including a red pixel and at least one non-red pixel. The red pixel includes a red light-emitting device including a light-emitting element for the red-pixel and a red phosphor having a temperature-dependent coefficient of 85 or more. The non-red pixel includes a blue pixel and/or a green pixel, which includes a light-emitting element for the green-pixel and a green phosphor having a temperature-dependent coefficient of 85 or more. When I(R,25) and I(R,100) denote the emission intensities of the red pixel at 25° C. and at 100° C., respectively, and when I(N,25) and I(N,100) denote the emission intensities of the non-red pixel at 25° C. and at 100° C., respectively, the ratio of the value I(N,100)/I(N,25) to the value I(R,100)/I(R,25) is 90% or more.

Advantages of the Invention

According to the present invention, at least one among the following advantages can be achieved.

As a first advantage, a light-emitting device having high brightness, good color rendering, and less color shift due to a small change in light intensity can be obtained by using a phosphor mixture having characteristics satisfying prescribed relationships regarding the brightness and color coordinates according to the present invention. In addition, an image display apparatus and a lighting system including such a light-emitting device as a light source exhibit excellent color reproducibility in the color range of emission and have sufficient brightness.

As a second advantage according to the present invention, a light-emitting device emits light with high brightness, closer to natural light, and less shift of the emission color due to a change in the emitted light intensity. A lighting system and an image display apparatus including such a light-emitting device as a light source are also provided.

As a third advantage according to the present invention, a white-light emitting device excellent in the color rendering and a lighting system including the device are obtained.

As a fourth advantage, in the image display apparatus of the present invention exhibits a reduced color shift due to a change in the temperature.

Figure 1:
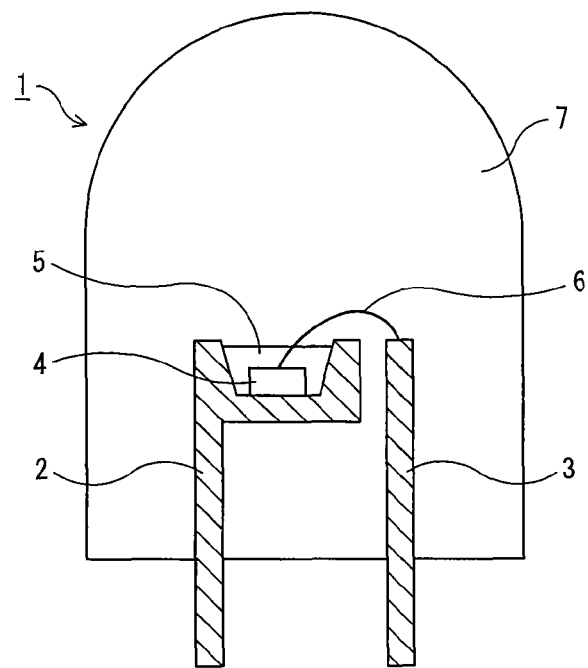
FIG. 1 is a schematic cross-sectional view illustrating a first light-emitting device comprising a phosphor mixture of the present invention as a wavelength-converting material and a semiconductor light-emitting element according to an embodiment of the present invention.

REFERENCE NUMERALS 1 light-emitting device
2 mount lead
3 inner lead
4 semiconductor light-emitting element
5 phosphor-containing resin pad
6 electrically conductive wire
7 molded article
8 surface-emitting lighting system
9 diffusion plate
10 holding case
101, 110 light-emitting device
102, 112 frame
103, 113 blue LED
104, 114 fluorescent unit
105, 115 silver paste
109 surface-emitting lighting system
109A holding case
109B diffusion plate
201 white-light emitting device 202 light-emitting element
203, 204 wavelength-converting material
205 frame
205A concave
206, 207 electrically conductive terminal
208 wire
209, 209A, 209B binder
210 beam
211 surface-emitting lighting system
212 holding case
213 diffusion plate
221 display apparatus
222 optical waveguide
223 reflection film
224 diffusion plate
225 image-forming unit
301 red pixel
302 green pixel (non-red pixel)
303 blue pixel (non-red pixel)
311 red-light emitting device
312, 322, 332 frame
313 light-emitting element for red pixel
314 red phosphor
315, 316, 325, 326, 335, 336 electrically conductive terminal
317, 327, 337 wire
318, 328 binder
321 green-light emitting device
323 light-emitting element for green pixel
324 green phosphor
331 blue-light emitting device
333 light-emitting element for blue pixel
338, 403 mold
400, 507 unit pixel
401, 501 substrate
402 cover
502 light-distributing lens
503 combine lens
504 transmissive LCD
505 projector lens
506 screen
601, 601', 601" display apparatus
602 light source
603R, 603G phosphor unit
603B light-transmissive unit
604 frame
605 polarizer
606 light shutter
607 light analyzer
631 transparent substrate
632 black matrix
661, 663 transparent electrode
662 liquid crystal layer

BEST MODE FOR CARRYING OUT THE INVENTION

[I. Description of First Light-Emitting Device]

A first light-emitting device of the present invention will now be described. However, the following description on the elements is an exemplary embodiment of the first light-emitting device of the present invention, and therefore the first light-emitting device of the present invention is not limited thereto.

The first light-emitting device of the present invention includes a light source and at least one wavelength-converting material which absorbs at least part of the light from the light source and emits light with a different wavelength.

The light source may be of any type that emits light by driving current. For example, semiconductor light-emitting devices, such as an LED and an LD, which emits visible light, can be used.

Furthermore, the wavelength-converting material used in the first light-emitting device of the present invention may be any wavelength-converting material that can absorb at least part of the light emitted from the light source and emit light with a different wavelength. In general, the wavelength-converting material used is a phosphor mixture containing at least two phosphors.

Furthermore, the first light-emitting device of the present invention includes a wavelength-converting material that absorbs the visible light emitted by the light source such as a semiconductor light-emitting device and emits visible light with a longer wavelength. The first light-emitting device has high brightness, good color rendering, and less color shift due to a small change in light intensity. Therefore, the first light-emitting device having such characteristics according to the present invention can be suitably used in image display apparatuses such as color liquid crystal displays and in lighting systems such as surface-emitting lighting systems.

[I-1. Characteristics of First Light-Emitting Device]

In the first light-emitting device of the present invention, the color coordinate $x_1(17.5)$ of the light emitted at a driving current density of 17.5 A/cm$^2$ and the color coordinate $x_1(70)$ of the light emitted at a driving current density of 70 A/cm$^2$ satisfy the following Expression (D):

$$-0.006 \le x_1(17.5) - x_1(70) \le 0.006. \tag{D}$$

In addition, in the first light-emitting device of the present invention, the color coordinate $y_1(17.5)$ of the light emitted at a driving current density of 17.5 A/cm$^2$ and the color coordinate $y_1(70)$ of the light emitted at a driving current density of 70 A/cm$^2$ satisfy the following Expression (E):

$$-0.006 \le y_1(17.5) - y_1(70) \le 0.006 \tag{E}$$

In other words, it is preferable that the amounts of shift in the color coordinates x and y of the light emitted at a driving current density of 70 A/cm$^2$ from those of the light emitted at a driving current density of 17.5 A/cm$^2$, i.e., differences in the color coordinates, $[x_1(17.5)-x_1(70)]$ and $[y_1(17.5)-y_1(70)]$, are each within ±0.006. When the shift in the color coordinates of emitted light due to a change in the driving current density is larger than ±0.006, the color shift may increase with a change in driving current density for the control of the emitted light intensity, resulting in the unstable color of the emitted light.

A lower shift in the color coordinates x and y is preferred, and at least one of the shifts $[x_1(17.5)-x_1(70)]$ and $[y_1(17.5)-y_1(70)]$ is more preferably within ±0.005, further preferably within ±0.004, and most preferably within ±0.003. In addition, both the shifts $[x_1(17.5)-x_1(70)]$ and $[y_1(17.5)-y_1(70)]$ are preferably within ±0.006, more preferably within ±0.005, further preferably within ±0.004, and most preferably within ±0.003.

[I-2. Embodiment of Specific Structure of First Light-Emitting Device]

Figure 2:
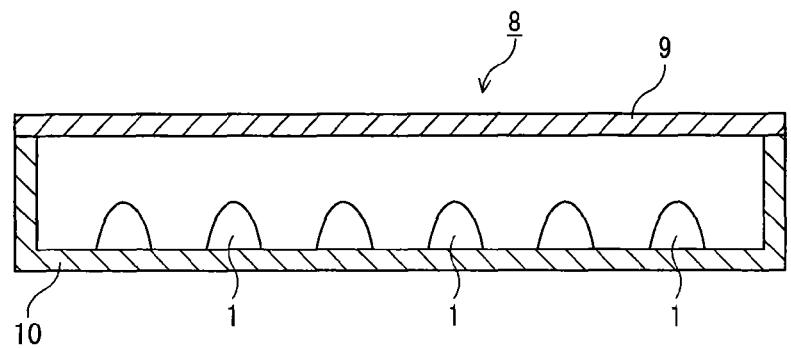
FIG. 2 is a schematic cross-sectional view illustrating a surface-emitting lighting system including the first light-emitting device shown in FIG. 1, according to an embodiment of the present invention.

The first light-emitting device of the present invention will be described with reference to the drawings. FIG. 1 is a schematic cross-sectional view illustrating an embodiment of the first light-emitting device including a phosphor as a wavelength-converting material and a semiconductor light-emitting element as a light source. FIG. 2 is a schematic cross-sectional view illustrating a surface-emitting lighting system including the first light-emitting device shown in FIG. 1. In FIGS. 1 and 2, reference numeral 1 denotes a first light-emitting device, reference numeral 2 denotes a mount lead, reference numeral 3 denotes an inner lead, reference numeral 4 denotes a semiconductor light-emitting element, reference numeral 5 denotes a phosphor-containing resin pad, reference numeral 6 denotes an electrically conductive wire, reference numeral 7 denotes a molded article, reference numeral 8 denotes a surface-emitting lighting system, reference numeral 9 denotes a diffusion plate, and reference numeral 10 denotes a holding case.

As shown in FIG. 1, the first light-emitting device of the present invention has a general shell shape. The semiconductor light-emitting element 4 consisting of, for example, a GaN blue light-emitting diode is fixed to the upper portion of a mount lead 2 by cladding with the phosphor-containing resin pad 5 in the cup. The phosphor-containing resin pad 5 is formed by dispersing a wavelength-converting material such as a phosphor mixture in a binder such as an epoxy or acrylic resin and pouring the resulting mixture into the cup. The semiconductor light-emitting element 4 and the mount lead 2 are electrically connected with a brazing filler such as a silver paste, while the semiconductor light-emitting element 4 and the inner lead 3 are electrically connected with the electrically conductive wire 6. These components are entirely covered and protected by a molded article 7 of, for example, as an epoxy resin.

FIG. 2 shows the surface-emitting lighting system 8 including the light-emitting device 1. As shown in FIG. 2, the lighting system includes a large number of light-emitting devices 1 arrayed on the bottom face of a box holding case 10, a power supply and a circuit (not shown) for driving the light-emitting devices 1 at the exterior of the case, and a diffusion plate 9 such as a milky white acrylic plate fixed at a position corresponding to a lid of the holding case 10 for uniform light emission. The inner face of the holding case 10 is, for example, white and smooth and does not transmit light.

In the operation of the surface-emitting lighting system 8, a voltage is applied to the semiconductor light-emitting element 4 of the light-emitting device 1 to emit blue light, for example, and a phosphor mixture as a wavelength-converting material in the phosphor-containing resin pad 5 absorbs part of the emitted light and emits light with a longer wavelength. At the same time, the color mixture of the emitted light and the blue light which is not absorbed by the phosphor mixture produces light emission with high color rendering, and this light is transmitted upwardly in the drawing through the diffusion plate 9. Thus, the illumination light has uniform brightness over the entire plane of the diffusion plate 9 of the holding case 10.

Similarly, the first light-emitting device of the present invention can be used as a light source for image display apparatuses such as color liquid crystal displays.

[I-3. Components of First Light-Emitting Device]

The light source and the wavelength-converting material used in the first light-emitting device of the present invention will now be described. The first light-emitting device of the present invention may include any component in addition to the light source and the wavelength-converting material.

[I-3-1. Light Source of First Light-Emitting Device]

Any light source emitting light by driving current can be used without limitation, and light sources having an emission peak wavelength in the range from ultraviolet to visible light regions are preferable. The emission peak wavelength of the light source is usually in the range of 370 nm or more and preferably 380 nm or more, and is usually in the range of 500 nm or less and preferably 480 nm or less. An emission peak wavelength higher than the upper limit or lower than the lower limit of this range reduces the emission efficiency of the light-emitting device.

Usable excitation light sources having an emission peak wavelength within the above-mentioned range are, for example, semiconductor light-emitting elements, lamps, electron beams, plasmas, electroluminescent elements. In particular, semiconductor light-emitting elements, such as light-emitting diodes (LED) and laser diodes (LD), are preferred.

Examples of the material for the semiconductor light-emitting element having an emission peak wavelength in the range from ultraviolet to visible light regions include various types of semiconductors such as boron nitride (BN), silicon carbide (SiC), ZnSe, GaN, InGaN, InAlGaN, AlGaN, BAlGaN, and BInAlGaN. Furthermore, Si or Zn as a activator element may be added to these elements as a light emission center. In particular, an Al- or Ga-activated nitride semiconductor represented by $In_XAl_YGa_{1-X-Y}N$ (where $0<X<1$, $0<Y<1$, $X+Y\leq 1$) and an In- or Ga-activated nitride semiconductor (hereinafter referred to as "(In,Al,Ga)N compound semiconductor") can efficiently emit light with a short wavelength in the range from ultraviolet to visible light regions, and the emitted light is stable even if the temperature or the driving current varies during the operation. Therefore, they are suitable as materials for the light-emitting layer.

Preferable structures of the semiconductor light-emitting device are homostructures, heterostructures, and double-heterostructures that have MIS junctions, PIN junctions, or pn junctions. In semiconductor light-emitting devices, the wavelength of emitted light can be significantly modified by selecting the material for the semiconductor layer and the mixed crystal ratio. The output can also be improved by forming a thin active layer with a single- or multi-quantum well structure having a quantum effect.

Among them, (In,Al,Ga)N LED and LD including (In,Al,Ga)N compound semiconductors are preferred for the following reasons. (In,Al,Ga)N LED have an emission output and external quantum efficiency significantly higher than those of SiC LED which emit light of the same region and can provide very bright emission light by very low electric power in a combination with a wavelength-converting material such as the above-mentioned phosphor. For example, an (In,Al,Ga)N LED generally has an emission intensity that is 100 times or more that of a SiC LED at a current load of 20 mA. In addition, with regard to the light emission, the (In,Al,Ga)N LED is more stable than that a GaAs LED against fluctuation of the temperature and the driving current during the operation. The (In,Al,Ga)N LED preferably includes an $Al_XGa_YN$ emission layer, a GaN emission layer, or an $In_{X'}Ga_{Y'}N$ emission layer. Above all, a GaN LED with an $In_XGa_YN$ emission layer has significantly high emission intensity and therefore is particularly preferred. In (In,Al,Ga)N LD, an (In,Al,Ga)N LD with a multi-quantum well structure of an $In_XGa_YN$ layer and a GaN layer have significantly high emission intensity and therefore is particularly preferred.

Furthermore, the value of X+Y in the above-described compounds is usually in the range of 0.8 to 1.2. An (In,Al,Ga)N LED having a light emission layer activated with Zn or Si or without a activator is preferred in view of control of its light emission characteristics.

The (In,Al,Ga)N LED has one of these light emission layers, a p-layer, an n-layer, electrodes, and a substrate as principal components. A heterostructure including the light emission layer sandwiched between n-type and p-type $Al_XGa_YN$ layers, GaN layers, or $In_XGa_YN$ layers is preferred because of high emission efficiency. Furthermore, an (In,Al, Ga)N LED with a quantum well structure instead of the heterostructure is more preferred because of higher emission efficiency. Preferred examples of the material for the substrate are sapphire, spinel, SiC, Si, ZnO, GaAs, and GaN, etc. In particular, sapphire, ZnO, and GaN are preferred.

The shape and size of the semiconductor light-emitting element are not especially limited. In a preferred embodiment, the element has a face perpendicular to the flow direction of the driving current in the form of a square the side of which is usually 100 μm, more and preferably 200 μm or more. For example, "ES-CEBL912" manufactured by EPISTAR Corp. or "C460 MB" manufactured by Cree Inc. may be used.

Furthermore, the semiconductor light-emitting element may be used alone or in a combination thereof. In addition, semiconductor light-emitting elements of one type or two or more different types may be used.

The term "driving current density" of a light source means driving current per unit area of a face perpendicular to the flow direction of the driving current. The driving current density can be determined by dividing the driving current value supplied to a light source by the area of the face perpendicular to the flow direction of the driving current. When two or more semiconductor light-emitting elements are connected in parallel, the driving current density can be determined by dividing the driving current value supplied to a light source by the sum of areas of the faces perpendicular to the flow direction of the driving current.

Furthermore, the light source may have a structure in provided with a heat sink or an improved package so as to efficiently dissipate heat, according to need.

[I-3-2. Wavelength-Converting Material of First Light-Emitting Device]

The first light-emitting device of the present invention may include arbitrary wavelength-converting material which absorbs at least part of the light from a light source and emits light with a wavelength different from that of the absorbed light. The type of the wavelength-converting material to be used may be determined according to its application. In general, phosphor mixtures according to the present invention are used as the wavelength-converting material, as is described below.

The phosphor mixture according to the present invention contains at least two phosphors, and the brightness BR(25), the color coordinate $x_2(25)$ and the color coordinate $y_2(25)$ of the fluorescence obtained by exciting the phosphor mixture with blue light having a peak wavelength of 455 nm at 25° C. and the brightness BR(125), the color coordinate $x_2(125)$ and the color coordinate $y_2(125)$ of the fluorescence obtained by exciting the phosphor mixture with the blue light at 125° C. satisfy the following Expressions (A), (B), and (C):

$$0.85 \leq BR(125)/BR(25) \leq 1.15 \quad (A),$$

$$-0.03 \leq x_2(25)-x_2(125) \leq 0.03 \quad (B),$$

$$-0.03 \leq y_2(25)-y_2(125) \leq 0.03 \quad (C).$$

That is, in the phosphor mixture according to the present invention, the ratio [BR(125)/BR(25)] of the brightness [BR(125)] of the fluorescence obtained by exciting the phosphor mixture with blue light having a peak wavelength of 455 nm at 125° C. to the brightness [BR(25)] of the fluorescence obtained by exciting the phosphor mixture with the blue light at 25° C. satisfies the above-mentioned Expression (A). When the ratio is lower than 0.85 or higher than 1.15, in a white-light emitting device including such a phosphor mixture, the color of the emitted light largely shifts by changing the current level supplied to the blue LED in order to change the light intensity. Therefore, the color of the emitted light may be unstable.

This is caused by that the temperature of the phosphor disposed near a blue LED varies with a change in the amount of heat generated by the blue LED when the blue light intensity is changed by controlling the current amount supplied to the blue LED and thereby the intensity of the fluorescence from the phosphor largely deviates from the fluorescence intensity expected from the light intensity of the blue LED. In other words, the color mixture between the emission intensity from the blue LED and the fluorescence intensity from the phosphor gets an imbalance by the change of the current supplied to the blue LED in order to change the light intensity of a white-light emitting device. Consequently, the color of the light emitted from the white-light emitting device significantly varies.

Therefore, in the phosphor mixture according to the present invention, the ratio of brightness [BR(125)/BR(25)] is usually 0.85 or more and preferably 0.9 or more, and is usually 1.15 or less, preferably 1.1 or less, and more preferably 1.05 or less. In order to achieve such a ratio of the brightness, the phosphor in the phosphor mixture preferably has low temperature quenching, namely, the fluorescence intensity less decreases with an increase in the temperature of the phosphor.

In the phosphor mixture according to the present invention, the color coordinate $x_2(25)$ and the color coordinate $y_2(25)$ of the fluorescence obtained by exciting the phosphor mixture with blue light having a peak wavelength of 455 nm at 25° C. and the color coordinate $x_2(125)$ and the color coordinate $y_2(125)$ of the fluorescence obtained by exciting the phosphor mixture with the blue light at 125° C. satisfy the Expression (B), i.e., $-0.03 \leq x_2(25)-x_2(125) \leq 0.03$, representing the difference in the color coordinate x and the Expression (C), i.e., $-0.03 \leq y_2(25) \leq y_2(125) \leq 0.03$, representing the difference in the color coordinate y. When the difference in the color coordinate x $[x_2(25)-x_2(125)]$ or the difference in the color coordinate y $[y_2(25)-y_2(125)]$ is lower than −0.03 or higher than 0.03, a significant color shift may be resulted from a change in the light intensity of a white-light emitting device including this phosphor mixture.

The differences in the color coordinates x $[x_2(25)-x_2(125)]$ and y $[y_2(25)-y_2(125)]$ are caused by a significant difference in temperature quenching between the two or more phosphors contained in the phosphor mixture. In other words, in a mixture containing two or more phosphors which emit light of different colors and have different degrees of temperature quenching, for example, if one phosphor shows a small decrease in the fluorescence intensity with an increase in the temperature while another phosphor shows a large decrease, the color of emission light shifts and changes with such an increase in the temperature due to combination of these different intensities of emission light.

Therefore, it is preferred that each of the differences in the color coordinates $[x_2(25)-x_2(125)]$ and $[y_2(25)-y_2(125)]$ due to temperature change of a phosphor mixture be as much as small, namely, be closer to zero. The difference is usually −0.03 or more, preferably −0.02 or more, and more preferably −0.015 or more. Further, the difference is usually 0.03 or less, preferably 0.02 or less, and more preferably 0.015 or less.

In order to obtain such a phosphor mixture with smaller difference in the color coordinates x and y due to temperature change, it is preferred that the phosphors constituting the phosphor mixture and having different fluorescent colors have substantially the same rate of change in the fluorescence intensity caused by the temperature quenching. The mixed color such as white obtained by combining fluorescence intensities of the phosphors can be the same regardless of a change in temperature, when the phosphors have approximately the same rate of change in the fluorescence intensity by the temperature quenching. Thus, the color shift of emitted light can be reduced even if the temperature changes with a change in the light intensity of the light-emitting device.

In the description of the first light-emitting device of the present invention, the brightness and the color coordinates x and y obtained by exciting a phosphor mixture with blue light having a peak wavelength of 455 nm are measured with a fluorescence spectrophotometer provided with a cooling unit including a Peltier element and a heating unit including a heater and equipped with a high-precision double monochrometer after sensitivity correction and wavelength correction. The brightness and the color coordinates are measured after a sufficient time for confirming, with a radiation thermometer, that the surface temperature of the phosphor remains constant at 25° C. or 125° C. by controlling the temperature with the cooling and heating units. In order to minimize the influence of the blue light used as excitation light, the half width of the excitation light is reduced to 20 nm or less and the brightness Y and the color coordinates x and y are calculated based on tristimulus-value defined in JIS Z 8724 using only a fluorescence spectrum region not less than 470 nm without using a fluorescence spectrum region less than 470 nm.

[I-3-2-1. Green Phosphor]

In order to achieve a light-emitting device having less color shift and specifically high color rendering, it is preferred that the wavelength-converting material such as a phosphor mixture used in the first light-emitting device of the present invention contain at least one green phosphor having a peak value of fluorescence intensity in the wavelength range of 500 nm to 550 nm. The light-emitting device including the green phosphor having such a peak value can have high color reproducibility in a green color region such as blue-green, green, and yellow-green. Furthermore, display backlights, image display apparatuses (displays), and lighting systems having such light-emitting devices exhibit excellent color reproducibility in the green color region. In a combination with a blue LED, a green phosphor having a peak value of fluorescence intensity in the range of wavelength shorter than 500 nm or longer than 550 nm causes a decrease in the color reproducibility, and therefore is not preferred.

The at least one green phosphor having a peak value of fluorescence intensity in a wavelength range of 500 nm to 550 nm and contained in the wavelength-converting material according to the present invention is not particularly be limited only if the green phosphor satisfies the above-mentioned Expressions (A) to (C) when it is used in the phosphor mixture as the wavelength-converting material. For example, oxides, nitrides, and oxynitrides excellent in the heat stability are preferred. Examples of the green phosphor include MSi$_2$N$_2$O$_2$:Eu, M-Si—Al—O—N:Ce, and M-Si—Al—O—N:Eu (where M denotes one or more alkaline-earth metals). SrSi$_2$N$_2$O$_2$:Eu, Ca—Si—Al—O—N:Ce, and Ca—Si—Al—O—N:Eu are preferred. Other preferred examples are phosphors containing at least Ce in the form of luminescent center ions in the host crystal and represented by the following General Formula (1) or (2). These phosphors have high brightness, high fluorescence intensity in the green region, and low temperature quenching.

$$M^1_aM^2_bM^3_cO_d \quad (1)$$

where $M^1$ denotes a bivalent metal element, $M^2$ denotes a trivalent metal element, and $M^3$ denotes a tetravalent metal element, and a, b, c, and d are numbers within the following ranges:

2.7≤a≤3.3,
1.8≤b≤2.2,
2.7≤c≤3.3, and
11.0≤d≤13.0;

$$M^4_eM^5_fO_g \quad (2)$$

where $M^4$ denotes a bivalent metal element and $M^5$ denotes a trivalent metal element, and e, f, and g are numbers within the following ranges:

0.9≤e≤1.1,
1.8≤f≤2.2, and
3.6≤g≤4.4.

General Formula (1) will now be described in detail.

The green phosphor preferably used in the present invention contains at least Ce in the form of luminescent center ions in the host crystal represented by the following General Formula (1):

$$M^1_aM^2_bM^3_cO_d \quad (1)$$

where $M^1$ denotes a bivalent metal element, $M^2$ denotes a trivalent metal element, and $M^3$ denotes a tetravalent metal element.

The bivalent metal element represented by $M^1$ in General Formula (1) is preferably at least one selected from the group consisting of Mg, Ca, Zn, Sr, Cd, and Ba, from the viewpoint of emission efficiency and others; more preferably at least one selected from the group consisting of Mg, Ca, and Zn; and most preferably Ca. In this case, Ca may be used alone or in a combination with Mg. $M^1$ is basically selected from these preferred elements and may contain another bivalent metal element within a range that does not impair the performance.

The trivalent metal element represented by $M^2$ in General Formula (1) is preferably at least one selected from the group consisting of Al, Sc, Ga, Y, In, La, Gd, and Lu, from the viewpoint of emission efficiency and others as in above; more preferably at least one selected from the group consisting of Al, Sc, Y, and Lu; and most preferably Sc. In this case, Sc may be used alone or in a combination with Y or Lu. $M^2$ is basically selected from these preferred elements and may contain another trivalent metal element within a range that does not impair the performance.

The tetravalent metal element represented by $M^3$ in General Formula (1) preferably contains at least Si, from the viewpoint of emission efficiency and others. The Si content in the tetravalent metal element represented by $M^3$ is usually 50% by mole or more, preferably 70% by mole or more, more preferably 80% by mole or more, and most preferably 90% by mole or more. The tetravalent metal element represented by $M^3$ other than Si is preferably at least one selected from the group consisting of Ti, Ge, Zr, Sn, and Hf; more preferably at least one selected from the group consisting of Ti, Zr, Sn, and Hf; and particularly preferably Sn. In particular, the tetravalent metal element represented by $M^3$ is preferably Si. $M^3$ is basically selected from these preferred elements and may contain another tetravalent metal element within a range that does not impair the performance.

Here, the term "contain in a range that does not impair the performance" means that the content of the other element is 10% by mole or less, preferably 5% by mole or less, and more preferably 1% by mole or less to each of the $M^1$, $M^2$, and $M^3$ metal elements.

In General Formula (1), a, b, c, and d are numbers within the following ranges:

2.7≤a≤3.3,
1.8≤b≤2.2,
2.7≤c≤3.3, and
11.0≤d≤13.0.

The green phosphor preferably used in the present invention contains at least Ce as a luminescent center ion element in the host crystal represented by General Formula (1). The values of a, b, c, and d vary within the above-mentioned ranges by replacing positions of any metal element of $M^1$, $M^2$, and $M^3$ in the crystal lattices with the luminescent center ion element or by disposing the luminescent center ion element at spaces between the crystal lattices. This phosphor generally has a garnet crystal structure having a body-centered cubic lattice of a=3, b=2, c=3, and d=12.

The luminescent center ion element contained in the host compound of this crystal structure contains at least Ce and may optionally contain one or more bivalent to tetravalent elements selected from the group consisting of Cr, Mn, Fe, Co, Ni, Cu, Pr, Nd, Sm, Eu, Tb, Dy, Ho, Er, Tm, and Yb for fine adjustment of light emission properties. In particular, one or more bivalent to tetravalent elements selected from the group consisting of Mn, Fe, Co, Ni, Cu, Pr, Sm, Eu, Tb, Dy, and Yb are preferred. In particular, bivalent Mn, bi- or trivalent Eu, trivalent Tb, and trivalent Pr are desirable.

It is desirable that the amount of Ce as the luminescent center element (activator) be controlled to a proper range. A significantly small amount of Ce causes a decrease in the number of ions that can emit light, resulting in a decrease in emission intensity. A significantly large amount of Ce causes strong concentration quenching, resulting in a decrease in emission intensity. From the viewpoint of emission intensity, the molar ratio of Ce for 1 mole of the host crystal represented by General Formula (1) is preferably in the range of 0.0001 to 0.3, more preferably 0.001 to 0.1, and most preferably 0.005 to 0.05.

The phosphor containing at least Ce as an emission center ion in the host crystal represented by General Formula (1) is generally excited by light of 420 nm to 480 nm. The emission spectrum has a peak at 500 nm to 510 nm and includes wavelength components of 450 nm to 650 nm.

Next, General Formula (2) will now be described in detail.

The green phosphor preferably used in the present invention contains at least Ce as a luminescent center ion element in the host crystal represented by the following General Formula (2):

$$M^4_e M^5_f O_g \quad (2)$$

where $M^4$ denotes a bivalent metal element and $M^5$ denotes a trivalent metal element.

The bivalent metal element represented by $M^4$ in General Formula (2) is desirably at least one selected from the group consisting of Mg, Ca, Zn, Sr, Cd, and Ba; preferably at least one selected from the group consisting of Mg, Sr, Ca, and Zn; more preferably Sr or Ca; and most preferably Ca, from the viewpoint of emission efficiency and others. In this case, Ca may be used alone or in a combination with Mg. $M^4$ is basically selected from these preferred elements and may contain another bivalent metal element within a range that does not impair the performance.

The trivalent metal element represented by $M^5$ in General Formula (2) is preferably at least one selected from the group consisting of Al, Sc, Ga, Y, In, La, Gd, and Lu; more preferably at least one selected from the group consisting of Al, Sc, Y, and Lu; and most preferably Sc, from the viewpoint of emission efficiency. In this case, Sc may be used alone or in a combination with Y or Lu. $M^5$ is basically selected from these preferred elements and may contain another trivalent metal element may within a range that does not impair the performance.

Here, the term "contain in a range that does not impair the performance" means that the other element is 10% by mole or less, preferably 5% by mole or less, and more preferably 1% by mole or less to each of the $M^4$ and $M^5$ metal elements.

In General Formula (2), e, f, and g are numbers within the following ranges:
0.9≤e≤1.1,
1.8≤f≤2.2, and
3.6≤g≤4.4.

The green phosphor preferably used in the present invention contains at least Ce as a luminescent center ion element in the host crystal represented by General Formula (2). The values of e to g vary within the above-mentioned ranges by replacing positions of any metal element of $M^4$ and $M^5$ in crystal lattices with the luminescent center ion element or by disposing the luminescent center ion element at spaces between the crystal lattices, and preferably e=1, f=2, and g=4.

The luminescent center ion element contained in the host compound of this crystal structure contains at least Ce and may optionally contain one or more bivalent to tetravalent elements selected from the group consisting of Cr, Mn, Fe, Co, Ni, Cu, Pr, Nd, Sm, Eu, Tb, Dy, Ho, Er, Tm, and Yb for fine adjustment of light emission properties. In particular, one or more bivalent to tetravalent elements selected from the group consisting of Mn, Fe, Co, Ni, Cu, Pr, Sm, Eu, Tb, Dy, and Yb are preferred. In particular, bivalent Mn, bivalent or trivalent Eu, trivalent Tb, and trivalent Pr are desirable.

It is desirable that the amount of Ce as the luminescent center ion element (activator) be controlled to a proper range. A significantly small amount of Ce causes a decrease in the number of ions that emit light, resulting in a decrease in emission intensity. A significantly large amount of Ce causes strong concentration quenching, resulting in a decrease in emission intensity. From the viewpoint of emission intensity, the molar ratio of Ce for 1 mole of the host crystal represented by General Formula (2) is preferably in the range of 0.0001 to 0.3, more preferably 0.001 to 0.1, and most preferably 0.005 to 0.05.

Preferred phosphors containing at least Ce as a luminescent center ion element in the host crystal represented by General Formula (2) are $Ca_3Sc_2Si_3O_{12}$:Ce and Mg-activated $Ca_3Sc_2Si_3O_{12}$:Ce.

Among these phosphors, Mg-activated phosphors are preferred. The molar ratio of Mg to the host crystal is 0.001 or more and preferably 0.01 or more, and 0.5 or less and preferably 0.3 or less. Examples of such phosphors include
$Ca_{2.97}Ce_{0.03}Sc_{1.97}Mg_{0.03}Si_3O_{12}$,
$Ca_{2.97}Ce_{0.03}Sc_{1.94}Mg_{0.06}Si_3O_{12}$,
$Ca_{2.94}Ce_{0.03}Sc_{1.94}Mg_{0.06}Si_3O_{12}$,
$Ca_{2.94}Ce_{0.06}Sc_{1.97}Mg_{0.03}Si_3O_{12}$,
$Ca_{2.94}Ce_{0.06}Sc_{1.94}Mg_{0.06}Si_3O_{12}$,
$Ca_{2.94}Ce_{0.06}Sc_{1.9}Mg_{0.1}Si_3O_{12}$,
$Ca_{2.9}Ce_{0.1}Sc_{1.97}Mg_{0.03}Si_3O_{12}$, and
$Ca_{2.9}Ce_{0.1}Sc_{1.94}Mg_{0.06}Si_3O_{12}$.

In particular, preferred phosphors containing at least Ce as a luminescent center ion element in the host crystal represented by General Formula (2) are $Ce_{0.01}Ca_{0.99}Sc_2O_4$, $Ce_{0.007}Ca_{0.993}Sc_2O_4$, and $Ce_{0.013}Ca_{0.987}Sc_2O_4$ Also, $Ce_{0.01}Ca_{0.94}Sr_{0.05}Sc_2O_4$, $Ce_{0.01}Ca_{0.89}Sr_{0.1}Sc_2O_4$, and $Ce_{0.01}Ca_{0.84}Sr_{0.15}Sc_2O_4$, which are obtained by partially replacing Ca with Sr, are preferred. Since the color purity of green can be improved by increasing the Sr content, these phosphors can be preferably used in image display apparatuses.

These phosphors are preferred because of a peak at a relatively long emission wavelength and high brightness.

These phosphors may be used alone or in an arbitrary combination of two or more at an arbitrary proportion.

[I-3-2-2. Red Phosphor]

In order to achieve decreased color shift and particularly high color rendering in the first light-emitting device of the present invention, it is preferred that the wavelength-converting material such as a phosphor mixture used in the light-emitting device contain at least one red phosphor having a peak value of fluorescence intensity in the wavelength range of 610 nm to 680 nm. The light-emitting device including the red phosphor having such a peak value can have high color reproducibility in a red color region such as orange, red, and deep red. Furthermore, display backlights, image display apparatuses (displays), and lighting systems including such a light-emitting device exhibit excellent color reproducibility in the red color region. In a combination with a blue LED, when the peak value of fluorescence intensity is in a wavelength shorter than 610 nm, the color reproducibility in the red color region is impaired. When the peak value is in a wavelength of longer than 680 nm, the color rendering are enhanced but the brightness tends to decrease.

The at least one red phosphor having a peak value of fluorescence intensity in a wavelength range of 610 nm to 680 nm and contained in the wavelength-converting material according to the present invention only if the red phosphor satisfies the above-mentioned Expressions (A) to (C) when it is used in the phosphor mixture as the wavelength-converting material. For example, oxides, nitrides, and oxynitrides, which are excellent in heat stability, are preferred. Examples of the red phosphor include $MSi_7N_{10}$:Eu and $M_2Si_5N_8$:Eu (where M denotes one or more alkaline-earth metals). $BaSi_7N_{10}$:Eu and $(Ca,Ea,Sr)_2Si_8N_8$:Eu are preferred. Other preferred examples are phosphors represented by the following General Formula (3). The phosphor mixtures containing these phosphors have high brightness, high fluorescence intensity in the red region, and low temperature quenching and are preferred as the wavelength-converting material.

$$M_a A_b D_c E_d X_e \quad (3)$$

In General Formula (3), M denotes one or more elements selected from the group consisting of Mn, Ce, Pr, Nd, Sm, Eu, Tb, Dy, Ho, Er, Tm, and Yb; A denotes one or more elements selected from the group consisting of bivalent metal elements other than the elements represented by M; D denotes one or more elements selected from the group consisting of tetravalent metal elements; E denotes one or more elements selected from the group consisting of trivalent metal elements; and X denotes one or more elements selected from the group consisting of O, N, and F.

In General Formula (3), a, b, c, d, and e are numbers within the following ranges:
$0.00001 \le a \le 0.1$,
$a+b=1$,
$0.5 \le c \le 4$,
$0.5 \le d \le 8$,
$0.8 \times (\frac{2}{3}+\frac{4}{3} \times c+d) \le e$, and
$e \le 1.2 \times (\frac{2}{3}+\frac{4}{3} \times c+d)$.

In General Formula (3), M denotes one or more elements selected from the group consisting of Mn, Ce, Pr, Nd, Sm, Eu, Tb, Dy, Ho, Er, Tm, and Yb; preferably one or more elements selected from the group consisting of Mn, Ce, Sm, Eu, Tb, Dy, Er, and Yb; and most preferably phosphors containing at least Eu.

In General Formula (3), A denotes one or more elements selected from the group consisting of bivalent metal elements other than the elements represented by M; preferably one or more elements selected from the group consisting of Mg, Ca, Sr, and Ba; and most preferably Ca.

In General Formula (3), D denotes one or more elements selected from the group consisting of tetravalent metal elements; preferably one or more elements selected from the group consisting of Si, Ge, Sn, Ti, Zr, and Hf; and most preferably Si.

In General Formula (3), E denotes one or more elements selected from the group consisting of trivalent metal elements; preferably one or more elements selected from the group consisting of B, Al, Ga, In, Sc, Y, La, Gd, and Lu; and most preferably Al.

In General Formula (3), X denotes one or more elements selected from the group consisting of O, N, and F; and preferably N or N and O. When X contains N and O, the ratio of O to (O+N) in the phosphor is preferably $0 < \{$(the number of O atoms)/(the total number of O atoms and N atoms)$\} \le 0.5$. A large ratio exceeding this range may reduce emission intensity. From the viewpoint of emission intensity, the ratio is more preferably 0.3 or less and most preferably 0.1 or less to achieve red phosphors that have an emission peak wavelength in the range of 640 nm to 660 nm and high color purity. Furthermore, the emission peak wavelength can be adjusted to 600 nm to 640 nm, near the human-visible wavelength, by controlling this ratio to 0.1 to 0.3. Consequently, a light-emitting device with high brightness can be obtained, which is preferable from another viewpoint.

In General Formula (3), a denotes the content of element M which functions as luminescent centers. The ratio a of the number of M atoms to the total number of (M+A) atoms $\{$i.e., a=(the number of M atoms)/[(the number of M atoms and the number of A atoms)]$\}$ is preferably 0.00001 or more and 0.1 or less. When the value a is less than 0.00001, a small number of M atoms that functions as the luminescent centers may reduce emission brightness. When the value a is higher than 0.1, interference between M ions may cause concentration quenching to reduce brightness. In particular, since the emission brightness is high when M is Eu, a ratio a of 0.002 or more and 0.03 or less is preferred.

In General Formula (3), c denotes the content of D element such as Si and is within the range of $0.5 \le c \le 4$, preferably $0.5 \le c \le 1.8$, and most preferably c=1. When c is less than 0.5 or is higher than 4, the emission brightness may decrease. The emission brightness is high within the range of $0.5 \le c \le 1.8$ and is particularly high at c=1.

In General Formula (3), d denotes the content of E element such as Al and is in the range of $0.5 \le d \le 8$, preferably $0.5 \le d \le 1.8$, and most preferably d=1. When the number d is less than 0.5 or is higher than 8, the emission brightness may decrease. The emission brightness is high in the range of $0.5 \le d \le 1.8$ and is particularly high at d=1.

In General Formula (3), e denotes the content of X element such as N, and is not less than $0.8 \times (\frac{2}{3}+\frac{4}{3} \times c+d)$ and not higher than $1.2 \times (\frac{2}{3}+\frac{4}{3} \times c+d)$, and preferably is equal to 3. When the value of e is outside the above-mentioned range, the emission brightness may decrease.

Among the compositions described above, preferred compositions having high emission brightness contain at least Eu in the M element, Ca in the A element, Si in the D element, Al in the E element, and N in the X element. Above all, inorganic compounds composed of Eu as the M element, Ca as the A element, Si as the D element, Al as the E element, and N or a mixture of N and O as the X element are preferred.

This phosphor is excited by at least light of 580 nm or less. In particular, the excitation with light of 400 to 550 nm is most efficient. The emission spectrum has a peak in 580 nm to 720 nm.

Red phosphors having a crystal structure close to a close-packed structure have high heat stability and are therefore preferable. In particular, red phosphors containing a tricoordinate nitrogen atom, which have high heat stability, are preferred. The ratio of the tricoordinate nitrogen atoms to the nitrogen atoms contained in the red phosphor is 20% or more, preferably 40% or more, and most preferably 60% or more. For example, the content of tricoordinate nitrogen atoms in $M_2Si_5N_8$:Eu (where M denotes one or more alkaline-earth metals) is 50%, and that in a phosphor represented by Formula (3), for example, in (Ca,Sr)AlSiN$_3$:Eu, is 66%.

These phosphors may be used alone or in an arbitrary combination of two or more thereof at an arbitrary proportion.

The particle size of the above-mentioned phosphors is usually 150 μm or less, preferably 50 μm or less, and more preferably 30 μm or less. When the particle size exceeds this range, the emission color of a white-light emitting device including such a phosphor cannot be uniform. In addition, such a phosphor cannot be homogeneously dispersed in a mixture of the phosphor and a binder (sealant). The lower limit of the particle size is usually 1 μm or more, and preferably 5 μm or more. Particle sizes below this range may cause a reduction in emission efficiency. Phosphors with a relatively narrow particle size distribution are preferred.

In a mixture of a green phosphor and a red phosphor, the percentage by weight of the green phosphor to the total weight of the green phosphor and the red phosphor is usually 65% or more, preferably 70% or more, more preferably 80% or more, and most preferably 85% or more, though it depends on the emission efficiency balance of the green phosphor and the red phosphor and the degree of absorption by the red phosphor of light emitted from the green phosphor. At a percentage by weight of the green phosphor lower than this range, the white-light emitting device cannot emit desirable white light with high brightness and excellent color rendering and will emit light with reddish tone in some cases. In a white-light emitting device, the percentage by weight of the green phosphor is usually 99% or less, preferably 98% or less, and more preferably 97% or less.

In addition, it is preferred that the absorption efficiency of the red phosphor at the emission wavelength from a semiconductor light-emitting element be larger than that at the emission peak wavelength of the green phosphor. In such a case, the probability that the red phosphor absorbs the light from the semiconductor light-emitting element and emits light by being excited by the absorbed light is higher than that the red phosphor absorbs the light from the green phosphor and emits light by being excited by the absorbed light. Consequently, the light-emitting element can have higher emission efficiency and therefore is preferred.

[I-3-2-3. Emission Efficiency of Phosphor]

The phosphors used as the wavelength-converting materials such as a phosphor mixture according to the present invention preferably have an emission efficiency of 20% or more, more preferably 30% or more, and most preferably 40% or more. Thus, higher emission efficiency is desirable. When the emission efficiency of the phosphor is less than 20%, the light-emitting device cannot exhibit high luminance. Here, the emission efficiency is defined as the ratio the number of quanta of light emitted from the phosphor to the number of quanta of light incident on the phosphor.

Then, a method for determining the emission efficiency of a phosphor defined in the first light-emitting device of the present invention using the product of the quantum absorption efficiency $\alpha_q$ and the internal quantum efficiency $\eta_1$ will now be described.

First, the surface of a phosphor sample (for example, in a powdered state) to be measured is sufficiently smoothed up to ensure high measurement precision. Then, the phosphor sample is put into a cell, and the cell is mounted on a light condenser such as an integrating sphere, which is used for counting all photons reflected by the sample and emitted by photoluminescence from the sample, i.e., for preventing photons from flying out to the outside of the measurement system without being counted.

A light source for exciting the phosphor is installed to this integrating sphere, for example. This light source is, for example, a xenon lamp which is adjusted with a filter or a monochrometer so that the emission peak wavelength is, for example, 455 nm. The sample to be measured is irradiated with light from the light source adjusted so as to have a wavelength peak of 455 nm, and the emission spectrum is measured with a spectrometer, for example, MCPD2000 manufactured by Otsuka Electronics Co., Ltd. The spectrum actually obtained by the measurement includes the contribution of photons of excitation light reflected by the sample in addition to photons emitted by photoluminescence from the sample, by light from the excitation light source (hereinafter simply referred to as excitation light).

The absorption efficiency $\alpha_q$ is a value obtained by dividing the number ($N_{abs}$) of photons of excitation light absorbed by the sample with the total number (N) of photons of the excitation light.

First, the total number N of photons of excitation light is determined as follows: A reflection plate, as a subject to be measured, having a reflectance R of substantially 100% for the excitation light is installed to a spectrophotometer, and a reflection spectrum $I_{ref}(\lambda)$ is measured. As the reflection plate, for example, "Spectralon" (having a reflectance of 98% for the excitation light of 450 nm) manufactured by Labsphere may be used. Here, the value calculated by the following expression (Expression I) based on the reflection spectrum $I_{ref}(\lambda)$ is proportional to the total number N.

[Numerical Expression 1]

$$\frac{1}{R}\int \lambda \cdot I_{ref}(\lambda)d\lambda \qquad (I)$$

Here, the integral may be conducted only for a range in which $I_{ref}(\lambda)$ substantially has a significant value.

The number $N_{abs}$ of photons of excitation light absorbed by the sample is proportional to the value calculated by the following expression (Expression II).

[Numerical Expression 2]

$$\frac{1}{R}\int \lambda \cdot I_{ref}(\lambda)d\lambda - \int \lambda \cdot I(\lambda)d\lambda \qquad (II)$$

where $I(\lambda)$ denotes the reflection spectrum when the subject is installed to the spectrophotometer to determine its absorption efficiency $\alpha q$. The integral in Expression (II) is conducted in the same range as that in Expression (I). As the result of such limitation of the integral range, the second term of Expression (II) corresponds to the number of photons generated by the reflection of excitation light by the subject, i.e., the number of photons obtained by subtracting the number of photons generated by photoluminescence by the excitation light from the total number of photons from the subject. Since the actual value of the spectrum is usually obtained as digital data divided at a certain bandwidth relating to the reflection spectrum λ, the integrals of Expressions (I) and (II) are determined by summation based on the bandwidth.

From the above, $\alpha_q = N_{abs}/N = $ [Expression (II)]/[Expression (I)] is conducted.

Next, a method for determining the internal quantum efficiency $\eta_i$ will be described. The value $\eta_i$ is obtained by dividing the number ($N_{PL}$) of photons generated by photoluminescence with the number ($N_{abs}$) of photons absorbed by the sample.

Here, the number $N_{PL}$, is proportional to the value obtained by the following expression (Expression III).

[Numerical Expression 3]

$$\int \lambda \cdot I(\lambda) d\lambda \quad \text{(III)}$$

Here, the integral is conducted in the wavelength range of photons generated by photoluminescence from a sample, in order to remove the influence of photons reflected by the sample from the value $I(\lambda)$. Specifically, the lower limit of the integral in Expression (III) is the higher limit of the integral in Expression (I), and the higher limit is determined by the range suitable for containing the spectrum derived from photoluminescence.

As a result, $\eta_i=$[Expression (III)]/[Expression (II)] is evolved.

Similarly, the integral of spectrum converted to digital data is carried out as in $\alpha_q$.

The product of the thus obtained quantum absorption efficiency $\alpha_q$ and the internal quantum efficiency $\eta_i$ denotes the emission efficiency defined in the present invention.

The phosphor in the present invention can be synthesized by a usual solid state reaction. For example, raw material compounds providing metal elements for a phosphor are pulverized and mixed by a dry or wet process to prepare a pulverized mixture. The resulting pulverized mixture is heated for reaction to produce a phosphor.

For example, a phosphor of a nitride or oxynitride can be produced by preparing an alloy containing at least two metal elements constituting the phosphor, preferably by preparing an alloy containing all metal elements constituting the phosphor, and heating the resulting alloy in a nitrogen-containing atmosphere under pressure. Alternatively, for example, a phosphor can be produced by preparing an alloy containing a part of metal elements constituting the phosphor, heating the resulting alloy in a nitrogen-containing atmosphere under pressure, then mixing the alloy with other raw material compounds which are sources for the remaining metal elements constituting the phosphor, and further heating the resulting mixture. The phosphor obtained using an alloy or alloys contains a reduced amount of impurities and has high brightness.

[II. Description of Second Light-Emitting Device]

A second light-emitting device according to an embodiment of the present invention will now be described in detail. However, the following description of the elements is merely an exemplary embodiment of the second light-emitting device (representative example) of the present invention, and therefore the second light-emitting device of the present invention is not limited thereto within the scope of the present invention.

The second light-emitting device of the present invention includes a light source and at least one wavelength-converting material (usually, a phosphor) which absorbs at least part of the light from the light source and emits light with a different wavelength. The light-emitting device has an efficiency of 32 µm/W or more and a general color rendering index Ra of 85 or more. In the color coordinate $x_1(17.5)$ and the color coordinate $y_1(17.5)$ of the light emitted at a driving current density of 17.5 A/cm² and the color coordinate $x_1(70)$ and the color coordinate $y_1(70)$ of the light emitted at a driving current density of 70 A/cm², differences in the color coordinates, $[x_1(17.5)-x_1(70)]$ and $[y_1(17.5)-y_1(70)]$ satisfy the following Expressions (F) and (G):

$$-0.01 \leq x_1(17.5) - x_1(70) \leq 0.01 \quad \text{(F)},$$

$$-0.01 \leq y_1(17.5) - y_1(70) \leq 0.01 \quad \text{(G)}.$$

Here, the efficiency of a light-emitting device is defined in JIS Z 8113 "Lighting vocabulary" and obtained by dividing the entire luminous flux emitted from a light source by the power consumption of the light source. The unit is "lm/W". In the present invention, the efficiency is measured according to JIS Z 8724 "Methods of Color Measurement: Light-Source Color".

Conventional light-emitting devices with an emission efficiency of 30 lm/W or less are known. However, a higher emission efficiency is required in order to reduce the heat generation in a case of a large amount of electric power consumption, for example, in lighting. The present inventors have conducted intensive studies and achieved a light-emitting device with a high efficiency of 32 lm/W or more, which cannot be achieved by the conventional devices.

In the second light-emitting device of the present invention, the general color rendering index Ra and the special color rendering index $R_9$ are measured according to JIS Z 8726 "Method of Specifying Color rendering of Light Sources", and the color rendering index is classified into a normal type and a high color rendering type based on JIS Z 9112 "Classification of Fluorescent Lamps by Chromaticity and Color Rendering Property". The second light-emitting device of the present invention has an general color rendering index Ra of 85 or more and can achieve a special color rendering index $R_9$ of 64 or more, which is the lowest value in warm white color rendition AA, and further achieve a special color rendering index $R_9$ of 88, which is a requirement value of daylight color rendition AAA, by selecting materials or structure of the light-emitting device.

Any light source emitting light by driving current can be used without limitation, and light sources may be the same as those used in the first light-emitting device.

Though white-light emitting devices by a combination of an In-activated GaN blue LED and a Ce-activated yttrium-aluminum-garnet yellow phosphor have been widely used, they have a problem of low color rendering, as described above. In order to solve this problem, it is suggested to constitute a light-emitting device emitting desired color by a combination of a light source and at least one phosphor shown in the following manners <1> to <3>:

<1> A combination of an ultraviolet LED device emitting light with a wavelength of 330 nm to 420 nm and a blue phosphor, a green phosphor, and a red phosphor which are excited with this wavelength and emit fluorescent light having an emission peak wavelength of 420 nm to 480 nm, 500 nm to 550 nm, and 550 nm to 700 nm, respectively. In this combination, the phosphors are irradiated with the ultraviolet light emitted from the LED and emit light of three colors of blue, green, and red to make white light composed of these colors. Thus, a white-light emitting device is given.

<2> A combination of a blue LED emitting light with a wavelength of 420 nm to 500 nm and a yellow or red phosphor which is excited with this wavelength and emits fluorescent light having an emission peak wavelength of 550 nm to 600 nm. In this combination, the phosphor is irradiated with the blue light emitted from the LED and emits light of two colors of yellow and red. The light with these colors and the blue light from the LED are mixed. Thus, a device emitting white or reddish incandescent lamp color is given.

<3> A combination of a blue LED emitting light with a wavelength of 420 nm to 500 nm and a green phosphor and a red phosphor which are excited with this wavelength and emit fluorescent light having an emission peak wavelength of 500 nm to 550 nm and 610 nm to 680 nm, respectively. In this combination, the phosphors are irradiated with the blue light emitted from the LED and emit light of two colors of green and red. The light with these colors and the blue light from the LED are mixed. Thus, a device emitting white light is given.

In the second light-emitting device of the present invention, any combination of the above manners <1> to <3> can be employed, and the color coordinate $x_1(17.5)$ and the color coordinate $y_1(17.5)$ of the light emitted at a driving current density of 17.5 A/cm² and the color coordinate $x_1(70)$ and the color coordinate $y_1(70)$ of the light emitted at a driving current density of 70 A/cm² satisfy the following Expressions (F) and (G):

$$-0.01 \leq x_1(17.5) - x_1(70) \leq 0.01 \quad (F),$$

$$-0.01 \leq y_1(17.5) - y_1(70) \leq 0.01 \quad (G).$$

In other words, differences in the color coordinates, $[x_1(17.5)-x_1(70)]$ and $[y_1(17.5)-y_1(70)]$, which correspond to the shifts in the color coordinates x and y of the light emitted at a driving current density of 70 A/cm² from the color coordinates x and y of the light emitted at a driving current density of 17.5 A/cm², are each within ±0.01. When the shift in the color coordinates of light due to a change in the driving current density is larger than ±0.01, the color shift may increase with a change in driving current density for the control of the emitted light intensity, resulting in the unstable color of the emitted light.

A lower shift in the color coordinates x and y is preferred. That is, the shift $[x_1(17.5)-x_1(70)]$ is usually −0.005 or more, preferably −0.004 or more, more preferably −0.003 or more, and is usually 0.005 or less, preferably 0.004 or less, more preferably 0.003 or less. Also the shift $[y_1(17.5)-y_1(70)]$ is usually −0.005 or more, preferably −0.004 or more, more preferably −0.003 or more, and is usually 0.005 or less, preferably 0.004 or less, more preferably 0.003 or less.

In order to achieve the second light-emitting device of the present invention, any wavelength-converting material such as a phosphor can be used without limitation, and the phosphor mixtures described in the first light-emitting device of the present invention are preferred.

That is, in the second light-emitting device of the present invention, preferably, the wavelength-converting material is a mixture of two or more phosphors, and the brightness BR(25), the color coordinate $x_2(25)$, and the color coordinate $y_2(25)$ of the fluorescence obtained by exciting the phosphor mixture with blue light having a peak wavelength of 455 nm at 25° C. and the brightness BR(125), the color coordinate $x_2(125)$, and the color coordinate $y_2(125)$ of the fluorescence obtained by exciting the phosphor mixture with the blue light at 125° C. satisfy the following Expressions (A), (B), and (C):

$$0.85 \leq BR(125)/BR(25) \leq 1.15 \quad (A),$$

$$-0.03 \leq x_2(25) - x_2(125) \leq 0.03 \quad (B),$$

$$-0.03 \leq y_2(25) - y_2(125) \leq 0.03 \quad (C).$$

In the phosphor mixture according to the present invention, when the ratio [BR(125)/BR(25)] of the brightness [BR(125)] of the fluorescence obtained by exciting the phosphor mixture with blue light having a peak wavelength of 455 nm at 125° C. to the brightness [BR(25)] of the fluorescence obtained by exciting the phosphor mixture with the blue light at 25° C. is lower than 0.85 or higher than 1.15, in a white-light emitting device including such a phosphor mixture, the color of the emitted light largely shifts by changing the current level supplied to the blue LED in order to change the light intensity. Therefore, the color of the emitted light may be unstable.

This is caused by the following phenomenon. The temperature of the phosphor disposed near a blue LED varies with a change in the amount of heat generated by the blue LED when the blue light intensity is changed by controlling the current supplied to the blue LED and thereby the intensity of the fluorescence from the phosphor largely shifts from the fluorescence intensity expected from the light intensity of the blue LED. In other words, the color mixture between the emission intensity from the blue LED and the fluorescence intensity from the phosphor gets an imbalance by the change of the current supplied to the blue LED in order to change the light intensity of a white-light emitting device. Consequently, the color of the light emitted from the white-light emitting device significantly varies.

Therefore, the ratio of brightness [BR(125)/BR(25)] is usually 0.85 or more and preferably 0.9 or more, and is usually 1.15 or less, preferably 1.1 or less, and more preferably 1.05 or less. In order to achieve such a ratio of the brightness, the phosphors in the phosphor mixture preferably has low temperature quenching, namely, the fluorescence intensity less decreases with an increase in the temperature of the phosphor.

In the color coordinate $x_2(25)$ and the color coordinate $y_2(25)$ of the fluorescence obtained by exciting the phosphor mixture according to the present invention with blue light having a peak wavelength of 455 nm at 25° C. and the color coordinate $x_2(125)$ and the color coordinate $y_2(125)$ of the fluorescence obtained by exciting the phosphor mixture with the blue light at 125° C., when the difference in the color coordinate x, $[x_2(25)-x_2(125)]$ or the difference in the color coordinate y, $[y_2(25)-y_2(125)]$ is lower than −0.03 or higher than 0.03, a significant color shift may be resulted from a change in the light intensity of a white-light emitting device including this phosphor mixture.

The differences in the color coordinates x, $[x_2(25)-x_2(125)]$ and y, $[y_2(25)-y_2(125)]$ are caused by a significant difference in temperature quenching between the two or more phosphors contained in the phosphor mixture. In other words, in a mixture containing two or more phosphors which emit light of different colors and have different degrees of temperature quenching, for example, if one phosphor shows a small decrease in the fluorescence intensity with an increase in the temperature while another phosphor shows a large decrease, the color of emission light shifts and changes with such an increase in the temperature due to combination of these different intensities of emission light.

Therefore, it is preferred that each of the differences in the color coordinates x, $[x_2(25)-x_2(125)]$ and y, $[y_2(25)-y_2(125)]$ due to temperature change of a phosphor mixture be as much as small. The difference is usually −0.03 or more, preferably −0.02 or more, more preferably −0.015 or more and usually 0.03 or less, preferably 0.02 or less, more preferably 0.15 or less.

In order to obtain such a phosphor mixture with smaller difference in the color coordinates x and y due to temperature change, it is preferred that the phosphors constituting the phosphor mixture and having different fluorescent colors have substantially the same rate of change in the fluorescence intensity caused by the temperature quenching. The color mixture such as white obtained by combining fluorescence intensities of the phosphors can be the same regardless of a change in temperature, when the phosphors have approximately the same rate of change in the fluorescence intensity by the temperature quenching. Thus, the color shift of emitted light can be reduced even if the temperature changes with a change in the light intensity of the light-emitting device.

In the description of the second light-emitting device of the present invention, the brightness and the color coordinates x and y obtained by exciting a phosphor mixture with blue light having a peak wavelength of 455 nm are measured with a fluorescence spectrophotometer provided with a cooling unit including a Peltier element and a heating unit including a heater and equipped with a high-precision double monochrometer after sensitivity correction and wavelength correction. The brightness and the color coordinates are measured after a sufficient time for confirming, with a radiation thermometer, that the surface temperature of the phosphor remains constant at 25° C. or 125° C. by controlling the temperature with the cooling and heating units. In order to minimize the influence of the blue light used as excitation light, the half width of the excitation light is reduced to 20 nm or less and the brightness Y and the color coordinates x and y are calculated based on tristimulus-value defined in JIS Z 8724 using only a fluorescence spectrum region not less than 470 nm without using a fluorescence spectrum region less than 470 nm.

[Green Phosphor]

The wavelength-converting material according to the second light-emitting device of the present invention can contain at least one green phosphor having a peak value of fluorescence intensity in the wavelength range of 500 nm to 550 nm. The green phosphors may be those used in the first light-emitting devices of the present invention.

[Red Phosphor]

In the second light-emitting device of the present invention, in order to achieve a light-emitting device having less color shift and specifically high color rendering, it is preferred that the wavelength-converting material such as a phosphor mixture used in the light-emitting device contain at least one red phosphor having a peak value of fluorescence intensity in the wavelength range of 610 nm to 680 nm. The light-emitting device including the red phosphor having such a peak value can have high color reproducibility in a red color region such as orange, red, and deep red. Furthermore, display backlights, image display apparatuses (displays), and lighting systems having such light-emitting devices exhibit excellent color reproducibility in the red color region. In a combination with a blue LED, when the peak value of fluorescence intensity is in a wavelength shorter than 610 nm, the color reproducibility in the red color region is impaired. When the peak value is in a wavelength of longer than 680 nm, the color rendering are enhanced but the brightness tends to decrease.

The red phosphors having a peak value of fluorescence intensity in a wavelength range of 610 nm to 680 nm and contained in the wavelength-converting material according to the present invention may be those used in the first light-emitting devices of the present invention.

[Emission Efficiency of Phosphor]

The phosphors used as the wavelength-converting material such as a phosphor mixture according to the present invention may have the same emission efficiency as those of the phosphors used in the first light-emitting devices of the present invention.

Embodiments

The second light-emitting device of the present invention includes a wavelength-converting material such as a phosphor mixture containing, for example, at least two phosphors and a semiconductor light-emitting element emitting visible light, such as an LED or an LD. The wavelength-converting material absorbs the visible light emitted by the semiconductor light-emitting element and emits visible light with a longer wavelength. The second light-emitting device has high brightness, good color rendering, and less color shift due to a small change in light intensity. Therefore, the second light-emitting device having such characteristics according to the present invention can be suitably used as backlights for displays such as color liquid crystal displays and as light sources for lighting systems such as surface-emitting lighting systems.

A second light-emitting device according to embodiments of the present invention will now be specifically described with reference to the drawings, but the second light-emitting device of the present invention is not limited to the embodiments below and can be optionally modified within the scope of the present invention.

(1) First Embodiment

Figure 3:
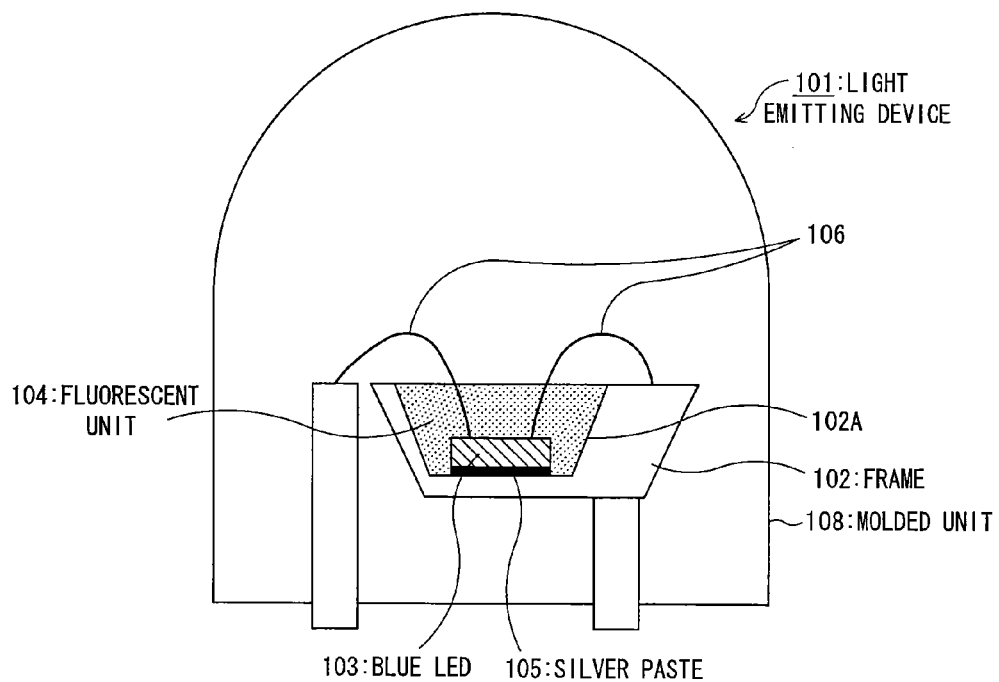
FIG. 3 is a cross-sectional view schematically illustrating the substantial part of a light-emitting device according to a first embodiment of a second light-emitting device of the present invention.

FIG. 3 is a drawing schematically illustrating the substantial part of a light-emitting device according to a first embodiment of a second light-emitting device of the present invention.

The main components of the light-emitting device 101 according to this embodiment are a frame 102, a blue LED (blue light-emitting unit) 103 functioning as a light source, and a fluorescent unit 104 absorbing part of the light emitted by the blue LED 103 and emitting light with a different wavelength.

The frame 102 is a resin base for holding the blue LED 103 and the fluorescent unit 104. The upper face of the frame 102 has a concave (depression) 102A having a trapezoidal cross-section and being open upward in the drawing. Such a cup-shaped frame 102 imparts directivity to the light emitted from the light-emitting device 101, so that the emitted light can be effectively utilized.

Furthermore, the inner surface of the concave 102A of the frame 102 is coated with metal plating such as silver to enhance reflectance for light over the entire visible light range, and thereby the light that impinges the inner surface of the concave 102A of the frame 102 is also reflected toward the predetermined direction from the light-emitting device 101.

On the bottom of the concave 102A of the frame 102, the blue LED 103 functioning as a light source is disposed. The blue LED 103 emits blue light by supplied electric power. Part of the blue light emitted from the blue LED 103 is absorbed, as excitation light, by a light-emitting material (wavelength-converting material; here, fluorescent material) in the fluorescent unit 104, and other part of the blue light is emitted toward a predetermined direction from the light-emitting device 101.

As described above, the blue LED 103 is disposed on the bottom of the concave 102A of the frame 102 and is bonded to the frame 102 with a silver paste (a mixture of an adhesive and silver particles) 105. Thus, the blue LED 103 is fixed to the frame 102. Another roll of the silver paste 105 is to efficiently dissipate heat generated in the blue LED 103 into the frame 102.

The frame 102 is provided with gold wires 106 for supplying electric power to the blue LED 103. The wires 106 connect the blue LED 103 to respective electrodes (not shown) disposed on the top face of the blue LED 103 by wire bonding. By electric power supplied to the blue LED 103 via the wires 106, the blue LED 103 emits blue light. The number of the wires 106 may be one or more depending on the structure of the blue LED 103.

In the concave 102A of the frame 102, the fluorescent unit 104 which absorbs part of the light emitted by the blue LED 103 and emits light with a different wavelength is disposed. The fluorescent unit 104 is composed of a phosphor and a transparent resin. The phosphor is a substance (wavelength-converting material) which can be excited by the blue light emitted by the blue LED 103 and emit light with a wavelength longer than that of the blue light. The fluorescent unit 104 may contain a single phosphor or a mixture of a plurality of phosphors. These phosphors may be selected such that a desired color can be obtained as the summation of the light emitted by the blue LED 103 and the light emitted from the fluorescent unit 104. In the second light-emitting device of the present invention, a phosphor mixture satisfying the above-mentioned Expressions (A) to (C) is preferred. Various colors such as yellow, orange, pink, violet, and blue-green other than white are also available. Furthermore, the color may be an intermediate between white and any one of these colors. The transparent resin is a binder of the fluorescent unit 104 and is preferably an epoxy resin which is a synthetic resin transmitting visible light over the entire wavelength range.

The blue LED 103, the fluorescent unit 104, the wire 106 are protected from the outside by a molded unit 108. The molded unit 108 also functions as a lens for controlling light distribution and is usually made of a resin such as an epoxy resin.

(2) Second Embodiment

Figure 4:
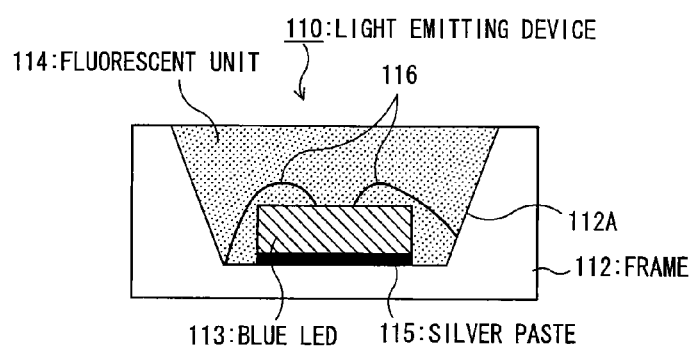
FIG. 4 is a cross-sectional view schematically illustrating the substantial part according to a second embodiment of the second light-emitting device of the present invention.

FIG. 4 schematically illustrates the substantial part of a light-emitting device according to a second embodiment of the second light-emitting device of the present invention.

The main components of the light-emitting device 110 according to this embodiment are a frame 112, a blue LED (blue light-emitting unit) 113 functioning as a light source, and a fluorescent unit 114 absorbing part of the light emitted by the blue LED 113 and emitting light with a different wavelength.

The frame 112 is a resin base for holding the blue LED 113 and the fluorescent unit 114. The upper face of the frame 112 has a concave (depression) 112A having a trapezoidal cross-section and being open upward in the drawing. Such a cup-shaped frame 112 imparts directivity to the light emitted from the light-emitting device 110, so that the emitted light can be effectively utilized.

On the bottom of the concave 112A, electrodes (not shown) are disposed and receive electric power from the outside of the light-emitting device 110. The electrodes supply electric power to the blue LED 113.

The inner surface of the concave 112A of the frame 112 is composed of a material having high reflectance for light over the entire visible light range, and thereby the light that impinges the inner surface of the concave 112A of the frame 112 is also reflected toward a predetermined direction from the light-emitting device 110. In addition, the electrode is coated with metal plating with high reflectance for light over the entire visible light range.

The blue LED 113 is disposed on the bottom of the concave 112A of the frame 112 and functions as a light source. The blue LED 113 emits blue light by supplied electric power. Part of the blue light emitted by the blue LED 113 is absorbed, as excitation light, by a light-emitting material (here, fluorescent material) in the fluorescent unit 114, and other part of the blue light is emitted toward a predetermined direction from the light-emitting device 110.

The blue LED 113 disposed on the bottom of the concave 112A of the frame 112 is bonded to the frame 112 with a silver paste (a mixture of an adhesive and silver particles) 115. Thus, the blue LED 113 is fixed to the frame 112. Another roll of the silver paste 115 is to efficiently dissipate heat generated in the blue LED 113 into the frame 112.

The frame 112 is provided with gold wires 116 for supplying electric power to the blue LED 113. The wires 116 connect the blue LED 113 to respective electrodes (not shown) disposed on the bottom of the concave 112A of the frame 112 by wire bonding. By electric power supplied to the blue LED 113 via the wires 116, the blue LED 113 emits blue light. The number of the wires 116 may be one or more depending on the structure of the blue LED 113.

In the concave 112A of the frame 112, the fluorescent unit 114 which absorbs part of the light emitted by the blue LED 113 and emits light with a different wavelength is disposed. The fluorescent unit 114 is composed of a phosphor and a transparent resin. The phosphor is a substance (wavelength-converting material) which can be excited by the blue light emitted by the blue LED 113 and emit light with a wavelength longer than that of the blue light. The fluorescent unit 114 may contain a single phosphor or a mixture of a plurality of phosphors. These phosphors are selected such that a desired color can be obtained as the summation of the light emitted by the blue LED 113 and the light emitted from the fluorescent unit 114. In the second light-emitting device of the present invention, a phosphor mixture satisfying the above-mentioned Expressions (A) to (C) is preferred. Various colors such as yellow, orange, pink, violet, and blue-green other than white are also available. In addition, the color may be an intermediate between white and any one of these colors. The transparent resin is a binder of the fluorescent unit 114 and is preferably an epoxy resin or silicone resin which is a synthetic resin transmitting visible light over the entire wavelength range.

Figure 5:
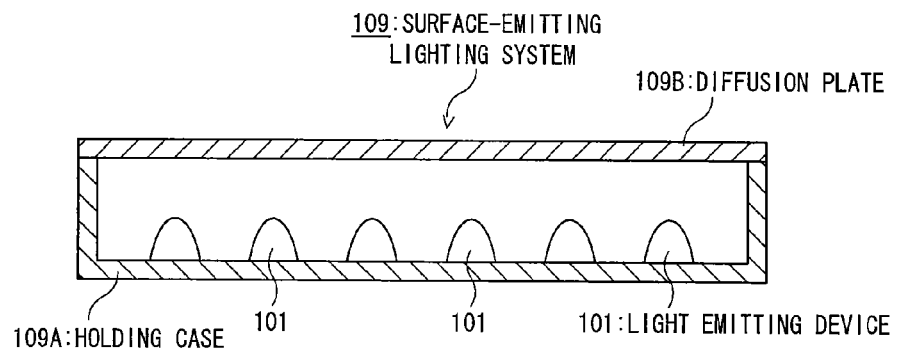
FIG. 5 is a schematic cross-sectional view illustrating a surface-emitting lighting system including the second light-emitting device shown in FIG. 3, according to an embodiment of the present invention.

FIG. 5 illustrates a surface-emitting lighting system 109 including the light-emitting device 101 shown in FIG. 3. As shown in FIG. 5, the lighting system includes a large number of light-emitting devices 101 arrayed on the bottom of a box holding case 109A, a power supply and a circuit (not shown) for driving the light-emitting devices 101 at the exterior of the case, and a diffusion plate 109B such as a white acrylic plate fixed at a position corresponding to a lid of the holding case 109A. The diffusion plate 109B uniformizes light emission. The inner surface of the lighting system 109 is, for example, white and smooth and does not transmit light.

In the operation of the surface-emitting lighting system 109, a voltage is applied between the blue LED 103 of each light-emitting device 101 to emit, for example, blue light, and a phosphor mixture as a wavelength-converting material in the phosphor-containing unit 104 absorbs part of the emitted light and emits light with a longer wavelength. At the same time, the color mixture of the emitted light and, for example, the blue light which is not absorbed by the phosphor mixture produces light with high color rendering, and this light is transmitted upwardly in the drawing through the diffusion plate 109B. Thus, the illumination light has uniform brightness over the entire plane of the diffusion plate 109B of the holding case 109A.

Similarly, the second light-emitting device of the present invention can be used as a light source for displays such as color liquid crystal displays, i.e., used as a backlight.

[III. Description of White-Light Emitting Device]

A white-light emitting device according to an embodiment of the present invention will now be described, but is not limited to the embodiments below and can be optionally modified within the scope of the present invention.

The white-light emitting device (white light-emitting element) according to the embodiment includes a light source (for example, light-emitting element) which emits light (hereinafter referred to as "primary light") and at least one wavelength-converting material which absorbs part of the light from the light source and emits light (hereinafter referred to as "secondary light") with a wavelength different from that of the primary light. The white-light emitting device emits white light containing the secondary light from the wavelength-converting material. The white light can be obtained as synthetic light, such as synthetic light of the primary light and the secondary light or synthetic light of two or more forms of the secondary light.

In the white-light emitting device according to the embodiment, the maximum intensity of the emission spectrum of the white light in the wavelength range of 500 nm to 650 nm (hereinafter referred to as "prescribed wavelength range") is not higher than 150% of the minimum intensity of the emission spectrum in the prescribed wavelength range.

[III-1. White Light]

[III-1-1. Flatness of Emission Spectrum]

White-light emitting devices are mainly used in lighting devices and are desired to reproduce the original color of a substance with high fidelity (that is, to emit white light having high color rendering). In order to achieve this requirement, it is preferred that the white light emitted by the white-light emitting device contain all visible light components in natural light. In particular, the prescribed wavelength range of 500 nm to 650 nm has high visibility and contains main light components of blue-green to red colors. Light equally containing visible light components in this wavelength range, namely, flat emission spectrum, bring good color rendering.

In particular, daylight white color with a correlated color temperature of about 5000 K and daylight color with a correlated color temperature of about 6500 K have a lighting color tone occupying the majority of white light-lighting systems used in Japan and other countries. The emission spectra of a full radiator at these correlated color temperatures are approximately flat in the prescribed wavelength range. Therefore, it is preferred that the white light emitted by a white-light emitting device according to the embodiment similarly have a flat spectrum in the prescribed wavelength range when the white-light emitting device is used as a lighting system.

Light with a wavelength longer than 650 nm has particularly low visibility, and therefore the emission of such light may reduce the efficiency of the white-light emitting device as a whole. Consequently, in the white light emitted by the white-light emitting device according to the embodiment, the intensity of light components in the range of wavelength longer than 650 nm, namely, in the range of wavelength longer than the prescribed wavelength range may be low.

Furthermore, it is preferred that light with a wavelength shorter than 500 nm have a flat spectrum similar to that of light in the prescribed wavelength range. However, in general, currently available light sources of primary light, such as light-emitting elements, have a small half width of emission light. Therefore, in the white light emitted by the white-light emitting device according to the embodiment, it is inevitable that the intensity of light with a specific wavelength is high and the intensity of light in the range of wavelength near the specific wavelength is low in the range of wavelength shorter than 500 nm. However, in the region of blue to bluish-violet colors having a wavelength shorter than 500 nm, light also has low visibility as in the light with a wavelength longer than 650 nm. Therefore, characteristics such as color rendering are not significantly impaired even if the emission spectra of light components in the range of wavelength lower than the prescribed wavelength range are not flat.

The degree of flatness of an emission spectrum in the prescribed wavelength range can be expressed by the index I(ratio) determined as follows:

The minimum emission intensity I(min) and the maximum emission intensity I(max) of an emission spectrum in the prescribed wavelength range are measured, and the ratio I(ratio) of the maximum emission intensity I(max) to the minimum emission intensity I(min) expressed in percent is calculated by the following Expression (i):

$$I(\text{ratio}) = \{I(\text{max})/I(\text{min})\} \times 100 \qquad (i).$$

The value I(ratio) exceeds 100% by definition. In the white light emitted by the white-light emitting device according to the embodiment, this I(ratio) is usually 150% or less, preferably 140% or less, more preferably 135% or less, and most preferably 130% or less. In other words, it is desired that white light is controlled so that the ratio of the maximum emission intensity to the minimum emission intensity of emission spectrum in the prescribed wavelength range is within the above-mentioned range. The emission spectrum having an I(ratio) closer to 100% is flatter. Therefore, a smaller I(ratio) is preferred.

[III-1-2. Correlated Color Temperature of White Light]

The white light emitted by the white-light emitting device according to the embodiment may have any correlated color temperature in the range that does not significantly impair the effects of the present invention, but it is preferred that the color of emission light meet daylight white color (represented by N) or daylight color (represented by D) defined by JIS Z 9112 regarding the color of known fluorescent lamps. The daylight white color corresponds to a correlated color temperature of 4600 K or more and 5400 K or less. The daylight color corresponds to a correlated color temperature of 5700 K or more and 7100 K or less. Preferably, the correlated color temperature is in the range of 4800 to 5200 K both inclusive for daylight white color and is in the range of 6000 K to 6800 K both inclusive for daylight color. More preferably, the correlated color temperature is as much as near 5000 K for the daylight white color and 6500 K for the daylight color. The correlated color temperature is determined according to JIS Z 8725. It is preferred that the color of emission light be adjusted to reduce a distance from the blackbody locus.

[III-1-3. Color of White Light]

The color of white light emitted by the white-light emitting device according to the embodiment can be adjusted, for example, depending on application. In this description, the term "white color" is white defined by the Color Classification in JIS Z 8110. The color of white light can be measured with, for example, a luminous colorimeter or a radiation luminous colorimeter.

Furthermore, from the relationship with CIE chromaticity diagram, the color of white light may be in the region surrounded by, for example, color coordinates (x, y) of (0.28, 0.25), (0.25, 0.28), (0.34, 0.40), and (0.40, 0.34), in addition to general white light with color coordinates (0.33, 0.33).

[III-1-4. Emission Efficiency of White Light]

The emission efficiency of white light in the white-light emitting device according to the embodiment is usually 20 lm/W or more, preferably 30 lm/W or more, and more preferably 40 μm/W or more. Though necessary brightness can be achieved by using a large number of devices with an emission efficiency below this preferable lower limit, this is not recommended because a large amount of energy is consumed. The emission efficiency of the white-light emitting device can be determined by, for example, dividing the entire white luminous flux measured by an integrating sphere by the power consumption.

[III-1-5. Color Rendering of White Light]

In the white-light emitting device according to the embodiment, the color rendering of the white light can be enhanced. The properties are not limited to a specific value, but the general color rendering index $R^a$ which is an average of color rendering indices $R_1$ to $R_8$ defined by JIS Z 8726 is usually 80 or more, preferably 85 or more, and more preferably 90 or more.

[III-2. Structure]

The structure of a white-light emitting device according to this embodiment will now be described with reference to FIG. 6 being a schematic cross-sectional view of the white-light emitting device. The white-light emitting device shown in FIG. 6 is merely an illustrative example, and the white-light emitting device of the present invention is not limited to the embodiment below.

Figure 6:
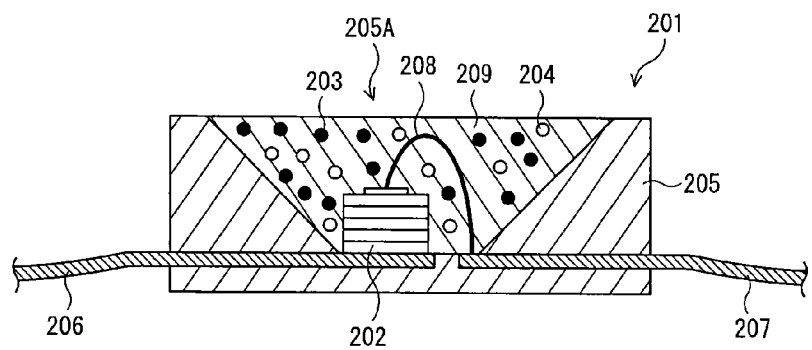
FIG. 6 is a schematic cross-sectional view of a white-light emitting device according to an embodiment of the present invention.

As shown in FIG. 6, the white-light emitting device 201 of this embodiment includes a light-emitting element 202 functioning as a light source emitting primary light and at least one wavelength-converting materials 203 and 204 absorbing the primary light and emitting secondary light. The white-light emitting device 201 usually includes a frame 205 as a base holding the light-emitting element 202 and the wavelength-converting materials 203 and 204.

The white-light emitting device 201 according to this embodiment emits white light with an emission spectrum which is flat over the prescribed wavelength range. In addition, the correlated color temperature, color, intensity, and emission efficiency of the emitted white color are within the above-mentioned ranges.

[III-2-1. Frame]

The frame 205 functions as a base holding the light-emitting element 202 and the wavelength-converting materials 203 and 204, and may have any shape and be made of any material.

The frame 205 may have a proper shape depending on application, for example, a plate shape or a cup shape. Among the exemplary shapes, a cup-shaped frame is preferred because it can provide high directivity to the emitted white light and thereby the light emitted from the white-light emitting device can be effectively utilized.

Examples of the material of the frame 205 include inorganic materials such as metals, alloys, glass, and carbon; and organic materials such as synthetic resins. The frame 205 can be made of a proper material depending on application.

However, it is preferred that the reflectance of the impinging surface of the frame 205 of light emitted from the light-emitting element 202 and the wavelength-converting materials 203 and 204 (for example, primary light and secondary light) be enhanced. It is more preferred that the reflectance for light over the entire visible light range be enhanced. Therefore, it is preferred that at least the surface the light impinges be made of a material with high reflectance. Specifically, the entirety or the surface of the frame 205 is made of a raw material (for example, injection molding resin) containing a material with high reflectance, such as glass fiber, alumina powder, or titanium powder.

The reflectance of the surface of the frame 205 may be enhanced by any method. Specifically, the reflectance of light may be enhanced by a material itself of the frame 205 as described above or may be enhanced by plating the surface with a metal or alloy having high reflectance, such as silver, platinum, or aluminum, or by depositing such a material on the surface.

The reflectance may be enhanced over the entire surface or a part of the surface of the frame 205. In general, it is preferred that the reflectance be enhanced over the entire surface area on which the light emitted from the light-emitting element 202 and the wavelength-converting materials 203 and 204 impinges.

Furthermore, in general, the frame 205 is provided with electrodes or terminals for supplying electric power to the light-emitting element 202.

In this embodiment, electrically conductive terminals 206 and 207 for supplying electric power to the light-emitting element 202 are disposed on the bottom of a concave 205A of the cup-shaped frame 205. The electrically conductive terminals 206 and 207 are connected to an external power supply (not shown).

[III-2-2. Light-Emitting Element]

The light-emitting element 202 serves as a light source and emits primary light for exciting the wavelength-converting materials 203 and 204. Part of the primary light may be used as one component of white light which is emitted from the white-light emitting device 201. In such a case, synthetic light of the primary light and secondary light is emitted from the white-light emitting device 201 as white light. In other words, part of the primary light from the light-emitting element 202 is absorbed by the wavelength-converting materials 203 and 204 as excitation light and other part of the primary light is emitted from the white-light emitting device 201. However, the white light does not necessarily contain the primary light. For example, the white-light emitting device 201 according to this embodiment may emit synthetic light of two or more types of secondary light as white light.

The light-emitting element 202 may be of any type and suitably selected depending on application and configuration of the white-light emitting device 201. Examples of the light-emitting element 202 include light-emitting diodes (i.e., LED), edge-emitting or surface-emitting laser diodes (i.e., LD), and electroluminescence elements. Among them, LED, which are inexpensive, are generally preferred.

The light-emitting element 202 may emit primary light with any emission wavelength and may be selected so as to emit primary light with a proper wavelength depending on white light emitted by the white-light emitting device 201. In general, it is desired that the light-emitting element emit primary light of near-ultraviolet to blue light. Specifically, the wavelength range of the primary light is usually 370 nm or more and preferably 380 nm or more, and usually 500 nm or less and preferably 480 nm or less. A wavelength longer than this upper limit precludes obtaining a light-emitting device with high emission efficiency. An emission wavelength of the primary light longer than 480 nm, namely, longer than that of blue-green light significantly precludes efficient conversion of the primary light into blue light. Therefore, the light-emitting device may emit undesirable light not containing a blue light component. Consequently, a white-light emitting device may not be obtained. A wavelength shorter than the lower limit also significantly precludes obtaining a light-emitting device with high emission efficiency.

Examples of the light-emitting element 202 include LED having an InGaN, GaAlN, InGaAlN, or ZnSeS semiconductor formed by crystallization through, for example, an MOCVD process on a substrate of silicone carbide, sapphire, gallium nitride, for example. In particular, an LED containing (In,Ga)N as the main component is preferred.

Two or more light-emitting elements 202 may be used in place of a single light-emitting element. These may be composed of one type or two or more different types.

The light-emitting element 202 may be mounted on the frame 205 by any method, for example, may be fixed to the frame 205 by soldering. Any solder may be used, and examples thereof include AuSn and AgSn. Furthermore, electric power can be supplied through the solder from, for example, electrodes or terminals 206 and 207 provided to the frame 205. In particular, when the light-emitting element 202 is a large-current LED or a laser diode which require high heat dissipation, it is effective to use solder for fixing the light-emitting element 202 because of its high heat dissipation.

The light-emitting element 202 may be fixed to the frame 205 by any method other than soldering, and for example, may be fixed with an adhesive such as an epoxy resin, an imide resin, or an acrylic resin. Like solder, also in such a case, electric power can be supplied to the light-emitting element 202 through an adhesive by using paste composed of a mixture of electrically conductive filler such as silver particles or carbon particles and the adhesive. In addition, the use of such electrically conductive filler enhances the heat dissipation and therefore is preferred.

Electric power may be supplied to the light-emitting element 202 by any method and may be supplied through the above-mentioned solder or adhesive or directly through the electrodes or terminals 206 and 207 which are connected to the light-emitting element 202 by wire bonding. In such a case, any wire may be used without limitation and may be made of any material and in any size. For example, the wire may be made of a metal such as gold or aluminum and may usually have a diameter of 20 μm to 40 μm, but is not limited to this.

Furthermore, the light-emitting element 202 may be supplied with electric power by flip-chip mounting using bumps.

In this embodiment, the light-emitting element 202 is an LED and is disposed on the bottom of concave 205A of the frame 205. Furthermore, the light-emitting element 202 is directly connected to the electrically conductive terminal 206 and indirectly connected to the electrically conductive terminal 207 via the wire 208 by wire bonding. Thus, electric power is supplied.

The light source other than the above-described light-emitting element may be used.

[III-2-3. Wavelength-Converting Material]

The wavelength-converting materials 203 and 204 absorb at least part of the primary light emitted from the light-emitting element 202 and emit secondary light with a wavelength different from that of the primary light. By suitably selecting the wavelength-converting materials 203 and 204, synthetic light of the primary light and the secondary light or synthetic light of two or more types of the secondary light is obtained as white light.

The wavelength-converting materials 203 and 204 may be a known wavelength-converting material which is optionally selected depending on application of the white-light emitting device 201, within the scope that does not significantly impair the effects of the present invention. The light emission by the wavelength-converting materials 203 and 204 may be performed by any mechanism and may be, for example, any fluorescence or phosphorescence. Furthermore, the wavelength-converting materials 203 and 204 may be each composed of a single material within the scope of the present invention, but it is preferred from the viewpoint for reducing I(ratio) as described above that two or more wavelength-converting materials having different emission wavelengths are contained in each of the wavelength-converting materials 203 and 204. When the wavelength-converting materials 203 and 204 each contain two or more wavelength-converting materials, any combination may be used at any ratio thereof.

The wavelength-converting materials 203 and 204 may absorb excitation light (in usual, primary light) with any wavelength and emit light (namely, secondary light) with any wavelength in the range that does not significantly impair the effects of the present invention, but it is preferred that the wavelength of the excitation light is usually 350 nm or more, preferably 400 nm or more, and more preferably 430 nm or more, and usually 600 nm or less, preferably 570 nm or less, and more preferably 550 nm or less. In addition, the wavelength of the light emitted by the wavelength-converting materials 203 and 204 is usually 400 nm or more, preferably 450 nm or more, and more preferably 500 nm or more, and usually 750 nm or less, preferably 700 nm or less, and more preferably 670 nm or less.

When the wavelength-converting materials 203 and 204 each contain a first and a second wavelength-converting materials, it is preferred that the first and the second wavelength-converting materials satisfy the following characteristics.

The first wavelength-converting material absorbs light, as excitation light, having a wavelength of usually 350 nm or more, preferably 400 nm or more, and more preferably 430 nm or more, and usually 520 nm or less, preferably 500 nm or less, and more preferably 480 nm or less.

The first wavelength-converting material emits light having a wavelength of usually 400 nm or more, preferably 450 nm or more, and more preferably 500 nm or more, and usually 600 nm or less, preferably 570 nm or less, and more preferably 550 nm or less.

The second wavelength-converting material absorbs light, as excitation light, having a wavelength of usually 400 nm or more, preferably 450 nm or more, and more preferably 500 nm or more, and usually 600 nm or less, preferably 570 nm or less, and more preferably 550 nm or less.

The second wavelength-converting material emits light having a wavelength of usually 550 nm or more, preferably 580 nm or more, and more preferably 600 nm or more, and usually 750 nm or less, preferably 700 nm or less, and more preferably 670 nm or less.

A light-emitting device including the wavelength-converting materials absorbing excitation light in the above-mentioned wavelength range and emitting light in the above-mentioned wavelength range can emit light in the entire visible light wavelength region. In particular, the light-emitting device has an advantage in that it can emit light in all wavelength range of 500 nm to 650 nm. Furthermore, a single wavelength-converting material may be employed provided that requirements of the present invention are satisfied.

Furthermore, the white-light emitting device 201 according to this embodiment can have more excellent characteristics by using a material suitable for the wavelength-converting materials 203 and 204. The characteristics required in the wavelength-converting materials 203 and 204 are, for example, a small change in emission intensity due to an increase in temperature, high internal quantum efficiency, and high absorption efficiency.

Small Variation in Emission Intensity Due to an Increase in Temperature

It is preferred that the emission intensity of the wavelength-converting materials 203 and 204 less varies with an increase in temperature. In other words, it is preferred that the temperature dependency of the emission intensity be small. When the wavelength-converting materials 203 and 204 have high temperature dependency, the intensity of the secondary light varies depending on temperature conditions, and thereby the intensity between the primary light and the secondary light or the intensity between a plurality of types of secondary light gets imbalance. Consequently, the color tone of white light may be changed. For example, when the light-emitting element 202 is an LED which generates heat with the emission of light, the temperature of the white-light emitting device 201 increases with the lapse of time after turning on the light due to the heat generated in the light-emitting element 202, and thereby the intensity of the secondary light emitted from the wavelength-converting materials 203 and 204 is changed. Consequently, the color tone of white light may be different between light immediately after turning-on and light after continuous turning-on. Such a change in the color tone can be reduced by using wavelength-converting materials 203 and 204 with low temperature dependency.

The change in emission intensity due to an increase in temperature can be expressed by the ratio (hereinafter referred to as "temperature-dependent retention") TR (%) of a brightness at 100° C. to a brightness at 25° C. Specifically, the temperature-dependent retention TR is usually 80% or more, preferably 90% or more, and more preferably 95% or more.

The temperature-dependent retention TR can be measured, for example, as follows:

About 100 mg of sample powder (wavelength-converting material) is put into a powder holder with an 8 mm diameter, and the holder is set to a temperature characteristics evaluation system manufactured by Koyo Denshi. Then, brightnesses at 25° C. and at 100° C. are measured with a luminance colorimeter BM5A manufactured by TOPCON in the air while the temperature being maintained at 25° C. or 100° C. under irradiation with excitation light of 460 nm (obtained by dispersion of light from a 150-W xenon lamp with a grating spectrometer). Then, the ratio of a brightness at 100° C. to a brightness at 25° C. is calculated as the temperature-dependent retention TR (%).

Furthermore, it is preferred that the amount of sulfur contained in the wavelength-converting materials 203 and 204 is small. Sulfur may cause thermal degradation of the wavelength-converting materials 203 and 204. Therefore, a white-light emitting device with excellent characteristics can be obtained by using wavelength-converting materials 203 and 204 containing a small amount of sulfur, preferably, not containing sulfur. Specifically, it is preferred that compounds which include sulfur as the host material, namely, sulfides, oxysulfides, and sulfates, are not contained in the wavelength-converting materials 203 and 204.

High Internal Quantum Efficiency

The wavelength-converting materials 203 and 204 usually have an internal quantum efficiency of 40% or more and preferably 50% or more. A material having an internal quantum efficiency lower than this lower limit reduces the emission efficiency of a white-light emitting device and therefore is not preferred. In particular, in the wavelength-converting materials 203 and 204 emitting secondary light with a wavelength of 500 to 600 nm, which is a region exhibiting particularly high visibility, a higher internal quantum efficiency, specifically 60% or more is preferred.

High Absorption Efficiency

The absorption efficiency of the wavelength-converting materials 203 and 204 is usually 50% or more, preferably 60% or more, more preferably 70% or more, and most preferably 75% or more. When the absorption efficiency is lower than this lower limit, the emission efficiency of the white-light emitting device may not be sufficiently increased.

The above-mentioned internal quantum efficiency and absorption efficiency are those for light having an emission wavelength of the light-emitting element 202, more specifically, the internal quantum efficiency and absorption efficiency when the wavelength-converting material is excited by light having the same emission peak wavelength as that of the light emitted by the light-emitting element 202 (hereinafter simply referred to as "light with an emission peak wavelength of the light-emitting element 202"). These internal quantum efficiency and absorption efficiency are determined as follows:

First, light with an emission peak wavelength of the light-emitting element is incident on a white diffusion plate with a reflectance of 0.97. The light reflected by the white diffusion plate is collected by an integrating sphere. The collected light is captured by a multichannel photodetector, and the intensity thereof is measured for determining the reflected light intensity RW with an emission peak wavelength of the light-emitting element when the light is reflected by the white diffusion plate.

Then, light with an emission peak wavelength of a light-emitting element is incident on a wavelength-converting material. The light reflected by the wavelength-converting material and the light emitted by the wavelength-converting material excited by the incident light are collected by an integrating sphere. The collected light is captured by a multichannel photodetector as in the above-described measurement of the reflected light intensity RW. The reflected light intensity RP with an emission peak wavelength of the light-emitting element when the light is reflected by the wavelength-converting material is measured.

Then, the absorbed light intensity AP of the light absorbed by the wavelength-converting material is calculated according to the following expression (ii). This absorbed light intensity AP is multiplied by the wavelength of the light with an emission peak wavelength of the light-emitting element to be converted into an absorbed light photon number-corresponding value PA.

Absorbed light intensity $AP=\{$(reflected light intensity $RW)/0.97\}-$(reflected light intensity $RP$)     (ii).

Similarly, the reflected light intensity RW is multiplied by the wavelength to be converted into a reflected light photon number-corresponding value RWA.

Then, among the light components collected by the integrating sphere in the measurement of the reflected light intensity RP of the light reflected by the wavelength-converting material, the light in a wavelength range different from that of the reflected light (namely, the light emitted by the wavelength-converting material) is measured for the light intensity. The total product of the light intensity and each wavelength is converted into an emitted light photon number-corresponding value PP.

At the final stage, the internal quantum efficiency is calculated by an expression "internal quantum efficiency=(emitted light photon number-corresponding value PP)/(absorbed light photon number-corresponding value PA)".

The absorption efficiency is calculated by an expression "absorption efficiency=(absorbed light photon number-corresponding value PA)/{(reflected light photon number-corresponding value RWA)/0.97}".

High internal quantum efficiency and high absorption efficiency are preferred. Both high internal quantum efficiency and high absorption efficiency are more preferred.

Examples of the wavelength-converting materials 203 and 204 having such characteristics are mixtures of a green light-emitting material such as $Ca_3Sc_2Si_3O_{12}$:Ce, $Ca_3(Sc,Mg)_2$ $Si_3O_{12}$:Ce, or $CaSc_2O_4$:Ce and a red light-emitting material such as $CaAlSiN_3$:$Eu^{2+}$, (Sr, Ca) $AlSiN_3$:$Eu^{2+}$, or $SrAlSiN_3$:$Eu^{2+}$ at suitable ratios. However, the wavelength-converting materials 203 and 204 should not be limited to them, and other materials satisfying the above-described conditions may also be used.

Examples of the first wavelength-converting material and the second wavelength-converting material, which are suitable for the wavelength-converting materials 203 and 204 used in the white-light emitting device according to this embodiment, will now be described, but the wavelength-converting materials 203 and 204 are not limited to the examples below.

(Example of First Wavelength-Converting Material)

A first example of the first wavelength-converting material is a green phosphor which is used in the first light-emitting device of the present invention.

(Other Examples of First Wavelength-Converting Material)

Other examples of the first wavelength-converting material include materials having an emission peak of 400 nm to 500 nm, such as $(Ba,Ca,Sr)MgAl_{10}O_{17}$:Eu, $(Ba,Mg,Ca,Sr)_5(PO)_4Cl$:Eu, and $(Ba,Ca,Sr)_3MgSi_2O_8$:Eu; and materials having an emission peak of 500 nm to 600 nm, such as (Ba, Ca, Sr) $MgAl_{10}O_{17}$:Eu, Mn, $(Ba,Ca,Sr)Al_2O_4$:Eu, $(Ba,Ca,Sr)Al_2O_4$:Eu,Mn, $(Ca,Sr)Al_2O_4$:Eu, and Eu-activated α-sialon represented by the formula $Ca_xSi_{12-(m+n)}Al_{(m+n)}O_nNi_{16-n}$:Eu (where $0.3<x<1.5$, $0.6<m<3$, and $0 \leq n<1.5$), but the first wavelength-converting material is not limited thereto. The above-mentioned phosphors may be used in a combination thereof.

(Example of Second Wavelength-Converting Material)

A first example of the second wavelength-converting material is a red phosphor which is used in the first light-emitting device of the present invention.

(Other Examples of Second Wavelength-Converting Material)

Any material emitting light with a wavelength which can synthesize white light with the primary light emitted by a light-emitting element or the secondary light emitted by the first wavelength-converting material can be used as the second wavelength-converting material. Examples of such materials include Eu-activated α-sialon represented by the formula $Ca_xSi_{12-(m+n)}Al_{(m+n)}O_nN_{16-n}$:Eu (where $0.3<x<1.5$, $0.6<m<3$, and $0 \leq n<1.5$), $Ca_2Si_5N_8$:Eu, $Sr_2Si_5N_8$:Eu, $(Ca,Sr)_2Si_5N_8$:Eu, $CaSi_7N_{10}$:Eu, and europium complexes which emit fluorescent light. The above-mentioned phosphors may be used in a combination thereof.

A combination of the first wavelength-converting material and the second wavelength-converting material may be used at any ratio in the range that does not significantly impair the effects of the present invention, and the volume ratio of the second wavelength-converting material to the first wavelength-converting material is usually 0.05 or more, preferably 0.1 or more, and more preferably 0.2 or more, and usually 1 or less, preferably 0.8 or less, and more preferably 0.5 or less. A ratio being higher or lower than this range makes it difficult to synthesize white light.

The wavelength-converting materials 203 and 204 are usually used in the form of particles. The diameter of the particles of the wavelength-converting materials 203 and 204 is not especially limited, but is usually 150 μm or less, preferably 50 μm or less, and more preferably 30 μm or less. When the diameter is larger than this range, the color of emission light of the white-light emitting device 1 largely fluctuates. In addition, the uniform application of the wavelength-converting materials 203 and 204 may become difficult when a mixture of a light-converting material 202 and a binder (sealant) is used. The lower limit of the particle diameter is usually 1 μm and preferably 5 μm. When the diameter is smaller than this range, the emission efficiency may be reduced.

The wavelength-converting materials 203 and 204 may have any states within the range that does not significantly impair the effects of the white-light emitting device of the present invention. For example, the wavelength-converting materials 203 and 204 may be held in the frame 205 by a binder 209 or may be fixed to the frame 205 without using the binder 209.

The binder 209 is usually used for holding the wavelength-converting materials 203 and 204 in the form of powder or particles together or for fixing the wavelength-converting materials 203 and 204 to the frame 205. Any known binder can be used in the white-light emitting device 201 according to this embodiment without limitation.

When the white-light emitting device 201 is a transmissive type, namely, light such as primary light and secondary light is transmitted through a binder 209 and is emitted to the outside of the white-light emitting device 201, it is preferred that the binder 209 transmit all components of the light emitted by the white-light emitting device 201.

The binder 209 may be a resin or an inorganic material such as glass. Examples of the binder 209 include organic resins such as epoxy resins and silicone resins; and inorganic materials such as polysiloxane gel and glass.

A binder 209 composed of a resin may have any viscosity, but it is preferred that the binder 209 has a viscosity suitable for the particle size and the relative density, in particular, according to the relative density per surface area of the wavelength-converting materials 203 and 204. For example, when the binder 209 is composed of an epoxy resin and when the wavelength-converting materials 203 and 204 have a diameter of 2 μm to 5 μm and a relative density of 2 to 5, in general, the particles of the wavelength-converting materials 203 and 204 can be well dispersed by controlling the viscosity of the epoxy resin to 1 Pas to 10 Pas.

The binder 209 may be composed of a single material or two or more different materials at any proportion.

Furthermore, the wavelength-converting materials 203 and 204 may contain other ingredients. Such ingredients do not have any limitation and may be known additives.

For example, a diffusing agent such as alumina or yttria is preferable for controlling light distribution or color mixing of the white-light emitting device 201.

In order to raise the densities of the wavelength-converting materials 203 and 204, for example, a binding agent such as calcium pyrophosphate or barium-calcium borate is preferred.

The wavelength-converting materials can be held by the frame without using the binder 209. For example, a wavelength-converting material is fired, and the sintered material may be directly mounted on the frame. Alternatively, for example, a wavelength-converting material in the form of glass or single crystal of the material may be mounted on the frame.

When the binder 209 is used, the above-mentioned other ingredients may be dispersed in the binder 209. When the binder 209 is not used, the other ingredients such as an additive can be used with the wavelength-converting material.

In this embodiment, a wavelength-converting material 203 belonging to the first wavelength-converting material and a wavelength-converting material 204 belonging to the second wavelength-converting material are used as the wavelength-converting materials 203 and 204 and are disposed in the concave 205A of the frame 205 in the state of dispersion in the binder 209.

In the wavelength-converting materials 203 and 204 used in this embodiment, the emission intensity less varies with an increase in temperature, and both the internal quantum efficiency and absorption efficiency are high. In addition, the binder 209 can transmit the primary light emitted by the light-emitting element 202 and the secondary light emitted by the wavelength-converting materials 203 and 204. Consequently, the synthetic light of the primary light and the secondary light is emitted as white light.

[III-2-4. Production Method]

The white-light emitting device 201 may be produced by any process and can be produced by, for example, dispersing wavelength-converting materials 203 and 204, a binder 209, which may be optionally used, and other ingredients in a dispersion medium to prepare a slurry; applying the slurry to a frame 205 provided with an light-emitting element 202; and then drying the slurry. The light-emitting element 202 may be mounted on the frame 205 when or after the slurry is applied.

The slurry is prepared by mixing wavelength-converting materials 203 and 204, a binder 209, which may be optionally used, and other ingredients such as an additive with a dispersion medium. In general, slurry is called by different names, such as paste or pellet, depending on the type of the binder 209, but the term "slurry" includes them in this description of the white-light emitting device of the present invention.

The dispersion medium used in the preparation of the slurry is not especially limited and may be any known dispersion medium. Examples of the dispersion media include linear hydrocarbons such as n-hexane, n-heptane, and Sorbesso; aromatic hydrocarbons such as toluene and xylene; halogenated hydrocarbons such as trichloroethylene and perchloroethylene; alcohols such as methanol, ethanol, isopropanol, and n-butanol; ketones such as acetone, methyl ethyl ketone, and methyl isobutyl ketone; esters such as ethyl acetate and n-butyl acetate; ethers such as cellosolve, butyl cellosolve, and cellosolve acetate; and aqueous solvents such as water and aqueous solutions.

Then, the prepared slurry is applied onto a base material such as the frame 205. The coating may be carried out by any process, such as dispensing or potting.

After the coating, the dispersion medium is dried to fix the wavelength-converting materials 203 and 204 to the frame 205. The drying may be carried out by any method, such as air drying, drying by heating, vacuum drying, baking, ultraviolet irradiation, or electron irradiation. In particular, baking at a temperature of several tens of degrees to a hundred and several tens of degrees can be readily carried out with inexpensive equipment and surely remove the dispersion medium, and therefore is preferred.

In order to produce a reflective white-light emitting device (described below) including the wavelength-converting materials 203 and 204 with high density, it is preferred that a binding agent is additionally mixed into the slurry. The slurry containing a binding agent is desirably applied by, for example, screen printing or ink-jet printing which can readily apply the slurry divisionally, but may be applied by a usual application process.

The wavelength-converting materials 203 and 204 may be mounted on the frame 205 without using the slurry. For example, wavelength-converting materials 203 and 204, a binder 209 and other ingredients, which may be optionally used, are kneaded and then are molded to be fixed to the frame 205. Thus, the white-light emitting device 201 can be produced. The molding may be conducted by, for example, press forming, extrusion (such as T-die extrusion, inflation molding, blow extrusion, melt spinning, or contour extrusion), or injection molding.

The binder 209 may be a thermosetting material such as an epoxy resin or a silicone resin. In such a case, for example, an uncured binder 209, wavelength-converting materials 203 and 204, and other ingredients which are optionally used are mixed and then are molded. Then, the mixture is heated to mount the wavelength-converting materials 203 and 204 to the frame 205 by the curing of the binder 209. Thereby, the white-light emitting device 201 can be produced. Alternatively, the binder 209 may be a UV-curable (ultraviolet-curable) material. In such a case, the binder 209 is cured by UV-light irradiation, instead of the heating described above, to mount the wavelength-converting materials 203 and 204 to the frame 205. Thereby, the white-light emitting device 201 can be produced.

The wavelength-converting materials 203 and 204 may be prepared in the processes for producing the white-light emitting device 201. Alternatively, a substrate containing the wavelength-converting materials 203 and 204 may be separately prepared and be mounted to the frame 205 later to produce the white-light emitting device 201.

[III-3. Operation]

Since the white-light emitting device 201 according to this embodiment has the above-described structure, electric power is supplied to the light-emitting element 202 to emit light. The light-emitting element 202 emits primary light by electric power. The primary light is partially absorbed by the wavelength-converting materials 203 and 204 dispersed in the binder 209. Then, the wavelength-converting materials 203 and 204 each emit fluorescent light as secondary light. The secondary light emitted by the wavelength-converting materials 203 and 204 is transmitted through the binder 209 with the primary light which has not been absorbed by the wavelength-converting materials 203 and 204, and synthetic light of the primary light and the secondary light is emitted from the white-light emitting device 201 as white light.

The white-light emitting device 201 according to this embodiment emits white light with a flat emission spectrum in the prescribed wavelength range and thereby has excellent color rendering.

In addition, since the white-light emitting device 201 according to this embodiment includes the wavelength-converting materials 203 and 204 having low temperature dependency of emission intensity, the change in color tone of the white light according to the lapse of time after turning on the light can be reduced compared to those in conventional devices.

The white-light emitting device 201 according to this embodiment has high internal quantum efficiency for light having a wavelength close to that of the primary light emitted by the light-emitting element 202 and includes the wavelength-converting materials 203 and 204 with high absorption efficiency. Therefore, the intensity of the white light emitted by the white-light emitting device 201 can be enhanced compared to those in conventional devices, and the emission efficiency of the white-light emitting device 201 can be improved.

In this embodiment, the white light contains the primary light as its component, but white light not containing primary light can also have the same advantages.

[III-4. Others]

The white-light emitting device according to an embodiment of the present invention is described above, but the white-light emitting device of the present invention is not limited to the above-described embodiment and can be modified within the scope of the present invention.

Figure 7:
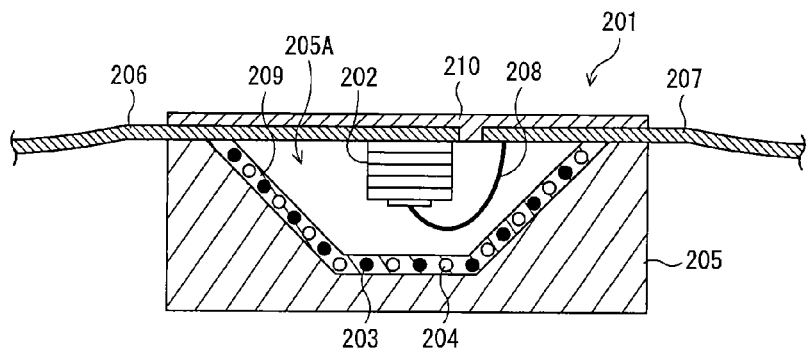
FIG. 7 is a schematic cross-sectional view of a white-light emitting device according to an embodiment of the present invention.

For example, the white-light emitting device 201 may be a reflection type. Specifically, as shown in FIG. 7, a device may have a structure in which the primary light emitted by the light-emitting element 202 is reflected by, for example, a surface of the frame 205 and is emitted to the outside of the device. Here, the same reference numerals in FIG. 7 denote the same components as in FIG. 6.

In the structure shown in FIG. 7, the light-emitting element 202 is disposed so as to be apart from the frame 205 with a beam 210. The wavelength-converting materials 203 and 204 are disposed on the surface of the concave 205A of the frame 205 in the state dispersed in the binder 209.

Electrically conductive terminals 206 and 207 are disposed on the beam 210 and supply electric power to the light-emitting element 202. Other components of the white-light emitting device 201 shown in FIG. 7 are disposed as in the above-described embodiment.

In this device, part of the primary light emitted by the light-emitting element 202 is reflected by, for example, the surface of the frame 205 and is emitted toward the outside of the white-light emitting device 201 as one component of white light. Other part of the primary light is absorbed by the wavelength-converting materials 203 and 204. The wavelength-converting materials 203 and 204 fixed on the surface of the concave 205A are excited by the absorbed primary light and emit secondary light. Thus, the white-light emitting device 201 emits synthetic light of the primary light and the secondary light as white light.

Such a reflective white-light emitting device 201 can also have a flat emission spectrum in the prescribed wavelength range of the white light to improve the color rendering of the white light. In addition, the change in color tone of the white light according to the lapse of time after turning on the light can be reduced by using wavelength-converting materials 203 and 204 having low temperature dependency of emission intensity. Furthermore, the emission efficiency of the white-light emitting device 201 can be improved by enhancing the intensity of the white light by using wavelength-converting materials 203 and 204 having high internal quantum efficiency and high absorption efficiency for light having the same wavelength as that of the primary light emitted by the light-emitting element 202.

Furthermore, the wavelength-converting materials 203 and 204 may be used in the form of a mixture thereof as in the above-described embodiment or may be separately disposed at different portions or different members depending on the characteristics and types of the wavelength-converting materials 203 and 204.

Figure 8:
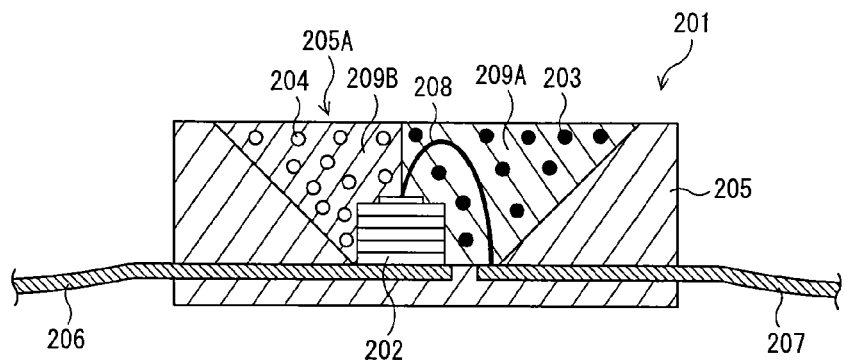
FIG. 8 is a schematic cross-sectional view of a white-light emitting device according to an embodiment of the present invention.

Specifically, as shown in FIG. 8, a wavelength-converting material 203 dispersed in a binder 209A may be disposed at a partial area of the concave 205A of the frame 205, and a wavelength-converting material 204 dispersed in a binder 209B may be disposed at the remaining area of the concave 205A. Here, the same reference numerals in FIG. 8 denote the same components as in FIGS. 6 and 7. The binders 209A and 209B may be the same or different.

In the structure shown in FIG. 8, part of the primary light emitted by the light-emitting element 202 is emitted toward the outside of the white-light emitting device 201 as one component of white light. Other part of the primary light is absorbed by the wavelength-converting materials 203 and 204. The wavelength-converting material 203 dispersed in the binder 209A and the wavelength-converting material 204 dispersed in the binder 209B are each excited by the primary light and emit secondary light. Thus, the white-light emitting device 201 emits synthetic light of the primary light and the secondary light as white light.

Such a white-light emitting device 201 having the wavelength-converting materials 203 and 204 separately disposed at different portions or different members depending on the characteristics and types thereof, as shown in FIG. 8, also can emit white light having a flat emission spectrum in the prescribed wavelength range and can improve the color rendering. In addition, the change in color tone of the white light according to the lapse of time after turning on the light can be reduced by using wavelength-converting materials 203 and 204 having low temperature dependency of emission intensity. Furthermore, the emission efficiency of the white-light emitting device 201 can be improved by enhancing the intensity of the white light by using wavelength-converting materials 203 and 204 having high internal quantum efficiency and high absorption efficiency for light having the same wavelength as that of the primary light emitted by the light-emitting element 202.

The white-light emitting device 201 shown in FIG. 8 may be further modified so that the frame 205 has a plurality of concaves 205A for separately receiving the wavelength-converting materials 203 and 204 according to the characteristics and types of the wavelength-converting materials 203 and 204.

[III-5. Lighting System]

The above-described white-light emitting device 201 can be applied to a lighting system. The lighting system does not have any limitation and usually includes other components in addition to the white-light emitting device 201, such as a light distribution element such as a lens, a protection cover, a reflection-preventing film, a wide-view film, a brightness-enhancing film, a lens sheet, and a heat radiator plate, according to need.

Figure 9:
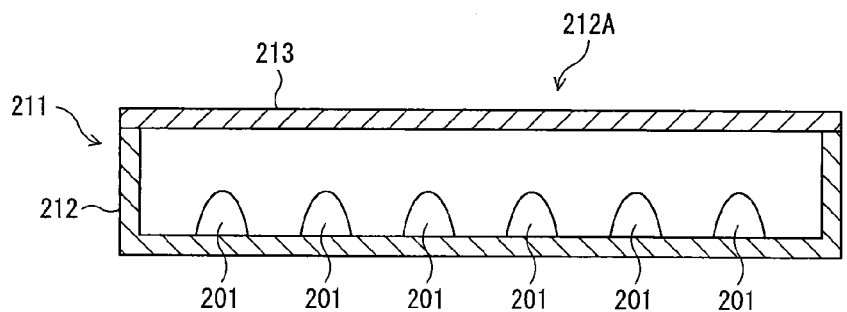
FIG. 9 is a schematic cross-sectional view of a surface-emitting lighting system according to an application of the white-light emitting device of the present invention.

Specifically, for example, a surface-emitting lighting system 211 shown in FIG. 9 can be fabricated using the white-light emitting devices 201. This surface-emitting lighting system 211 includes a large number of white-light emitting devices 201 arrayed in a holding case 212 with an opening at the top. The white-light emitting devices 201 emit white light toward the opening 212A of the holding case 212. The white-light emitting devices 201 are the same as that described in the above embodiment and covered with a molded article. Each white-light emitting device 201 receives electric power from a power supply and a circuit (not shown). Furthermore, a diffusion plate 213 such as an acrylic plate is disposed at the opening 212A of the holding case 212. The primary light and secondary light emitted by the white-light emitting devices 201 are diffused in the diffusion plate 213, and uniform white light without chromatic deviation is emitted from the diffusion plate 213 toward the outside of the apparatus.

The lighting system including the white-light emitting devices 201 can have the same advantages as those in the white-light emitting device 201, such as an improvement in color rendering, reduction of a change in color tone of white light according to the lapse of time after turning on the light, an improvement in intensity of white light, and an improvement in emission efficiency of the white-light emitting device 201.

The surface-emitting lighting system 211 described with reference to FIG. 9 is merely an exemplary embodiment of the lighting system according to the present invention and can be modified within the scope of the present invention.

[III-6. Display Apparatus]

The white-light emitting device 201 can be applied to a display apparatus (image display apparatus). The display apparatus including the white-light emitting device 201 is not limited and usually includes an appropriate combination of an image-forming unit for forming an image and other components which are the same as those used in the lighting system.

Figure 10:
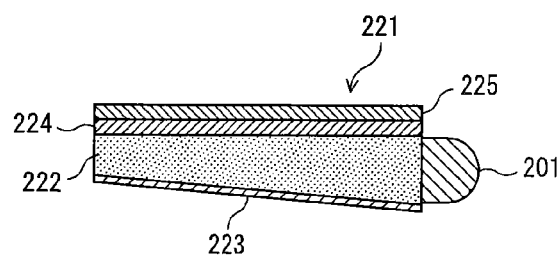
FIG. 10 is a schematic cross-sectional view of a display apparatus including a white-light emitting device according to an embodiment of the present invention.

For example, a display apparatus 221 shown in FIG. 10 includes the white-light emitting devices 201. The display apparatus 221 includes the white-light emitting device 201, an optical waveguide 222, a reflection film 223, a diffusion plate 224, and an image-forming unit 225.

The white-light emitting device 201 is produced as described above and is used as a backlight unit for illuminating the image-forming unit 225 from the back.

The optical waveguide 222 is a member for guiding white light from the white-light emitting device 201 to the image-forming unit 225 and may be known one of, for example, a mirror, a prism, a lens, or an optical fiber. By using the optical waveguide 222, the white-light emitting device 201 can be disposed at any position relative to the image-forming unit 225 to increase the design flexibility of the display apparatus 221.

In this embodiment, the optical waveguide used is a prism.

The reflection film 223 is a member for reflecting the white light emitted by the white-light emitting device 201 and is disposed on the back face of the optical waveguide 222. With this reflection film 223, the white light emitted by the white-light emitting device 201 disposed on the side face of the optical waveguide 222 in the drawing is reflected and is guided to the image-forming unit 225 through the diffusion plate 224 disposed on the upper side of the reflection film 223 in the drawing.

The diffusion plate 224 is a member for diffusing the light emitted by the white-light emitting device 201. The light emitted by the white-light emitting device 201 is diffused in the diffusion plate 224 and is emitted to the image-forming unit 225 as uniform white light without chromatic deviation.

The diffusion plate 224 may have any structure, for example, any shape, material, and size. For example, the diffusion plate 224 may be a sheet having asperity on both sides or be a substance in which microparticles of, for example, a synthetic resin or glass are dispersed in a binder such as a synthetic resin. The diffusion plate 224 in this embodiment is composed of a binder dispersing microparticles therein.

The image-forming unit 225 is a member for forming an image at the front side (the upper side in the drawing) by being irradiated at the back side (the lower side in the drawing) with the white light emitted by the white-light emitting device 201. Any known image-forming unit which can form a certain image and transmit at least part of the incident white light and has any shape, size, and material, for example, can be used.

Examples of the image-forming unit 225 include liquid crystal units used in, for example, liquid crystal displays and indicators used in, for example, internal illumination indicators.

An exemplary liquid crystal unit has a structure in which a liquid crystal layer composed of a color filter, a transparent electrode, an alignment film, a liquid crystal, an alignment film, and a transparent electrode stacked in this order is held in a container such as a glass cell provided with polarizing films on the inner and outer sides thereof. In this liquid crystal unit, an image is formed by controlling molecular arrangement of the liquid crystal by electrodes applied to the transparent electrodes. On this occasion, the white-light emitting device 201 illuminates the back face of the liquid crystal unit with white light (back light) to display a clear image on the front side of the liquid crystal unit.

The display apparatus may display the image at any position of the front side of the image-forming unit. The image may be directly displayed or may be displayed by projecting the image on any projection plane, as in liquid crystal projectors.

When the image-forming unit is an indicator, the back face of the indicator is irradiated with the white light from the white-light emitting device 201 to display a clear image formed in the indicator at the front side of the indicator.

Any image may be formed by the image-forming unit 225, and the image may be characters or graphics.

The image-forming unit 225 according to this embodiment is a liquid crystal unit directly displaying an image on a surface thereof.

The display apparatus having the above-mentioned structure can display a clear image formed in the image-forming unit 225 on a surface of the image-forming unit 225 by illuminating the back face of the image-forming unit 225 with the white light emitted by the white-light emitting device 201.

On this occasion, the display apparatus 221 including the white-light emitting device 201 as described above can achieve high color reproducibility of displayed images by an improvement in color rendering and also can obtain the same advantages as those in the white-light emitting device 201, such as reduction of a change in color tone of white light according to the lapse of time after turning on the light, an improvement in intensity of white light, and an improvement in emission efficiency of the white-light emitting device 201.

The display apparatus 221 described with reference to FIG. 10 is merely an exemplary embodiment of the display apparatus according to the present invention and can be modified within the scope of the present invention.

[IV. Description of Image Display Apparatus]

An image display apparatus according to an embodiment of the present invention will now be described in detail. However, the image display apparatus of the present invention is not limited to the following embodiment and may be modified within the scope of the present invention.

Figure 11:
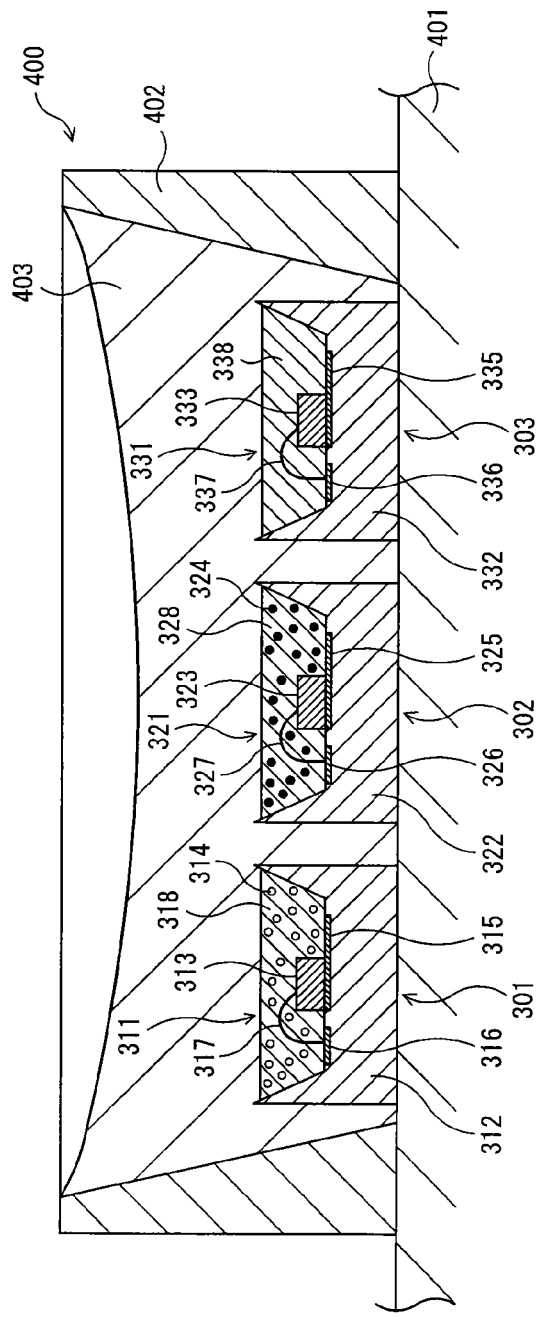
FIG. 11 is a schematic cross-sectional view illustrating the substantial part of a color display as an image display apparatus according to an embodiment of the present invention.

FIG. 11 is a schematic cross-sectional view illustrating the structure of the substantial part of a color display as an image display apparatus according to an embodiment of the present invention.

As shown in FIG. 11, the color display according to this embodiment include a pixel for red light (hereinafter referred to as "red pixel") 301 and at least one non-red pixel 302 (303).

The non-red pixels 302 and 303 do not have any limitation and may be any light source which emits light with color other than red. In general, a color display 301 includes a pixel for green light (hereinafter referred to as "green pixel") 302 and a pixel for blue light (hereinafter referred to as "blue pixel") 303 as the non-red pixels 302 and 303. Any color can be produced by a combination of these red, green, and blue pixels.

In this embodiment, the red pixel 301 includes a red light-emitting device (red light-emitting element) 311 containing a light-emitting element 313 for red pixel and a red phosphor 314 having a temperature-dependent coefficient of 85 or more.

[IV-1. Red Pixel]

Figure 12:
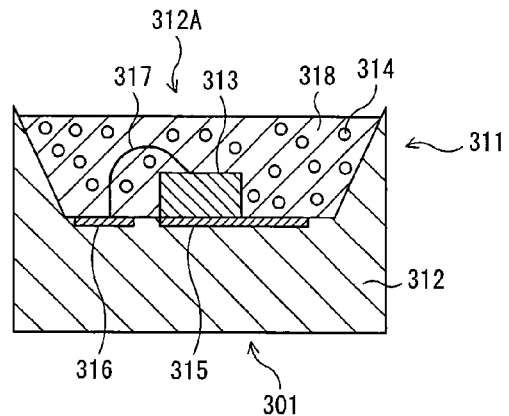
FIG. 12 is a cross-sectional view schematically illustrating the substantial part of a red light-emitting device as an image display apparatus according to an embodiment of the present invention.

FIG. 12 is a cross-sectional view schematically illustrating the substantial part of a red-light emitting device 311 according to this embodiment. The structure of the red light-emitting device of the present invention is not limited to this.

The red pixel 301 according to this embodiment includes the red-light emitting device 311 containing the light-emitting element 313 for red pixel and the red phosphor 314 functioning as a wavelength-converting material. The red phosphor 314 is excited by the light emitted by the light-emitting element 313 for red pixel and emits red light. This red light is emitted as red light from the red pixel 301. In addition, part of the light emitted by the light-emitting element 313 for red pixel, which is not absorbed by the red phosphor 314 as the excitation light, may be emitted with the red light emitted by the red phosphor 314 to the outside of the color display as one component of the red light emitted by the red pixel 301.

The peak wavelength of the red light emitted by the red pixel 301 may be optionally determined according to the conditions of use and purpose of the color display, but is usually 580 nm or more and preferably 600 nm or more, and usually 680 nm or less and preferably 660 nm or less.

The red-light emitting device 311 provided to the red pixel 301 usually includes a frame 312 as a base for holding the light-emitting element 313 for red pixel and the red phosphor 314.

[IV-1-1. Frame]

The frame 312 is a base for holding the light-emitting element 313 for red pixel and the red phosphor 314 and may have any shape and material, for example.

The frame 312 may have a proper shape depending on application, for example, a plate shape or a cup shape. Among the exemplary shapes, a cup-shaped frame is preferred because it can provide high directivity to the emitted white light and thereby the light emitted from the red-light emitting device 311 can be effectively utilized.

Examples of the material of the frame 312 include inorganic materials such as metals, alloys, glass, and carbon; and organic materials such as synthetic resins. The frame 312 may be made of a proper material depending on application.

However, it is preferred that the reflectance of the impinging the surface of the frame 312 of light emitted from the light-emitting element 313 for red pixel and the red phosphor 314 and be enhanced. It is more preferred that the reflectance for light over the entire visible light range be enhanced. Therefore, it is preferred that at least the surface the light impinges be made of a material with high reflectance. Specifically, the entirety or the surface of the frame 312 may be made of a raw material (for example, injection molding resin) containing a material with high reflectance, such as glass fiber, alumina powder, or titanium powder.

The reflectance of the surface of the frame 312 may be enhanced by any method. Specifically, the reflectance of light may be enhanced by a material itself of the frame 312 as described above or may be enhanced by plating the surface with a high-reflectance metal or alloy, such as silver, platinum, or aluminum, or depositing such a material on the surface.

The reflectance may be enhanced over the entire or partial surface of the frame 312. In general, it is preferred that the reflectance is enhanced over the entire surface area on which the light emitted from the light-emitting element 313 for red pixel and the red phosphor 314 impinges.

Furthermore, in general, the frame 312 is provided with electrodes or terminals for supplying electric power to the light-emitting element 313 for red pixel.

In this embodiment, electrically conductive terminals 315 and 316 for supplying electric power to the light-emitting element 313 for red pixel are disposed on the bottom of a concave 312A of the cup-shaped frame 312. The electrically conductive terminals 315 and 316 are connected to an external power supply (not shown).

[IV-1-2. Light-Emitting Element for Red Pixel]

The light-emitting element 313 for red pixel emits light for exciting the red phosphor 314.

Any light-emitting element can be used as the light-emitting element 313 for red pixel, and examples thereof include light-emitting diodes (i.e., LED), edge-emitting or surface-emitting laser diodes (i.e., LD), and electroluminescence elements. Among them, LED, which are inexpensive, are generally preferred.

The light-emitting element 313 for red pixel may emit light with a proper emission wavelength depending on the red light emitted by the red-light emitting device 311 as a red pixel. In general, it is desirable that the light-emitting element emit light of near-ultraviolet to blue light as excitation light. Specifically, the wavelength range of the light emitted by the light-emitting element 313 for red pixel is usually 370 nm or more and preferably 380 nm or more, and usually 500 nm or less and preferably 480 nm or less. A wavelength outside of this range may preclude obtaining a LED with high emission efficiency.

Examples of the light-emitting element 313 for red pixel include light-emitting elements having an InGaN, GaAlN, InGaAlN, or ZnSeS semiconductor formed on a substrate of, for example, silicone carbide, sapphire, or gallium nitride by, for example, an MOCVD process. The structure of the semiconductor is, for example, a homostructure, heterostructure, or double heterostructure which has an MIS junction, a PIN junction, or a PN junction. In addition, the semiconductor may include an active layer having a single-quantum well structure or a multi-quantum well structure laminated as a thin film which generates quantum effects. The active layer may be activated with a donor impurity such as Si or Ge and/or an acceptor impurity such as Zn or Mg. In particular, light-emitting elements containing (In,Ga)N as the main component are preferred. In particular, an (In,Ga)N LED is preferred.

Two or more light-emitting elements 313 for red pixel may be used in place of a single light-emitting element. These may be composed of one type or two or more different types.

The light-emitting element 313 for red pixel may be mounted on the frame 312 by any method, for example, may be fixed by soldering. Any solder may be used, and examples thereof include AuSn and AgSn. Furthermore, electric power can be supplied through the solder from, for example, electrodes or terminals 315 and 316 provided to the frame 312. In particular, when the light-emitting element 313 for red pixel is a large-current LED or a laser diode which require high heat dissipation, it is effective to use solder for fixing the light-emitting element 313 for red pixel because of its high heat dissipation.

The light-emitting element 313 for red pixel may fixed to the frame 312 by any method other than soldering, for example, may be fixed with an adhesive such as an epoxy resin, an imide resin, or an acrylic resin. Like soldering, also in such a case, electric power can be supplied to the light-emitting element 313 for red pixel through an adhesive by using paste composed of a mixture of electrically conductive filler such as silver particles or carbon particles and the adhesive. In addition, the use of such electrically conductive filler enhances the heat dissipation and therefore is preferred.

Electric power may be supplied to the light-emitting element 313 for red pixel by any method and may be supplied through the above-mentioned solder or adhesive or directly through the electrodes or terminals 315 and 316 which are connected to the light-emitting element 313 for red pixel by wire bonding. In such a case, any wire may be used without limitation and may be made of any material and in any size. For example, the wire may be made of a metal such as gold or aluminum and may usually have a diameter of 20 μm to 40 μm, but is not limited to this.

Furthermore, the light-emitting element 313 for red pixel may be supplied with electric power by flip-chip mounting using bumps.

In this embodiment, the light-emitting element 313 for red pixel is an (In,Ga)N LED which emits near-ultraviolet to blue light and is disposed on the bottom of concave 312A of the frame 312. Furthermore, the light-emitting element 313 for red pixel is directly connected to the electrically conductive terminal 315 and indirectly connected to the electrically conductive terminal 316 via the wire 317 by wire bonding. Thus, electric power is supplied.

[IV-1-3. Red Phosphor]

The red phosphor 314 absorbs the light emitted by the light-emitting element 313 for red pixel and emits red light, and therefore functions as a wavelength-converting material for converting the wavelength of light emitted by the light-emitting element 313 for red pixel into red light.

The red phosphor 314 in this embodiment usually has a temperature-dependent coefficient TR of 85 or more, preferably 90 or more, and more preferably 95 or more.

The temperature-dependent coefficient TR is the ratio of the brightness of a phosphor at 100° C. to that at 25° C. and is expressed in percent. Therefore, a temperature-dependent coefficient TR within the above-mentioned range means a small change in emission intensity of the red phosphor 314 due to an increase in temperature. In other words, the temperature dependency of emission intensity of the red phosphor 314 is low.

The red pixels used in conventional color displays are, for example, red-light-emitting LED having high temperature dependency. In such a case, the intensity of the red light emitted by the red pixel significantly varies depending on temperature conditions, compared to those of light emitted by non-red pixels. Consequently, the intensity between light emitted from each pixel gets imbalance, and thereby the color tone of an image displayed by the color display is changed. However, the change in color tone mentioned above can be reduced and the color shift due to a small change in temperature of the color display can be prevented by using the red pixel including the red-light emitting device 311 containing the light-emitting element 313 for red pixel and the red phosphor 314 with a large temperature-dependent coefficient TR, as in this embodiment.

The temperature-dependent coefficient TR can be measured, for example, as follows:

About 100 mg of sample powder (phosphor) is put into a powder holder with an 8 mm diameter, and the holder is set to a temperature characteristics evaluation system manufactured by Koyo Denshi. Then, brightnesses at 25° C. and at 100° C. are measured with a luminance colorimeter BM5A manufactured by TOPCON Corporation in the air while the temperature being maintained at 25° C. or 100° C. under irradiation with excitation light of 460 nm (obtained by dispersion of light from a 150-W xenon lamp with a grating spectrometer). Then, the ratio of a brightness at 100° C. to a brightness at 25° C. is calculated as the temperature-dependent coefficient TR (%).

Furthermore, it is preferred that the host compound of the red phosphor 314 do not contain sulfur. Sulfur may cause thermal degradation of the red phosphor 314. The temperature dependency of the red phosphor 314 can be reduced by using a sulfur-free red phosphor, namely, a red phosphor other than sulfides and sulfates, for example.

In this embodiment, a red phosphor 314 efficiently absorbing the light emitted by the light-emitting element 313 for red pixel is preferred, and it is further preferred that the red phosphor 314 further have high emission efficiency.

Specifically, the red phosphor 314 usually has an internal quantum efficiency of 40% or more, preferably 50% or more, and more preferably 60% or more. An internal quantum efficiency of the red phosphor lower than this lower limit may preclude a display from obtaining high emission efficiency.

It is preferred that the red phosphor 314 usually have an absorption efficiency of 50% or more, preferably 60% or more, more preferably 70% or more, and most preferably 75% or more. An absorption efficiency of the red phosphor lower than this lower limit may preclude a display from obtaining high emission efficiency.

The above-mentioned internal quantum efficiency and the absorption efficiency are those for light having the same emission wavelength as that of the light-emitting element 313 for red pixel. More specifically, the internal quantum efficiency and the absorption efficiency are those when a red phosphor is excited by light having the same emission peak wavelength as that of the light emitted by the light-emitting element 313 for red pixel (hereinafter simply referred to as "light with an emission peak wavelength of the light-emitting element for red pixel"). These internal quantum efficiency and absorption efficiency are determined as follows:

First, light with an emission peak wavelength of the light-emitting element for red pixel is incident on a white diffusion plate with a reflectance of 0.97. The light reflected by the white diffusion plate is collected by an integrating sphere. The collected light is captured by a multichannel photodetector, and the intensity thereof is measured for determining reflected light intensity RW with an emission peak wavelength of the light-emitting element for red pixel when the light is reflected by the white diffusion plate.

Then, light with an emission peak wavelength of the light-emitting element for red pixel is incident on a red phosphor. The light reflected by the red phosphor and the light emitted by the red phosphor excited by the incident light are collected by an integrating sphere. The collected light is captured by a multichannel photodetector as in the above-described measurement of the reflected light intensity RW. The reflected light intensity RP with an emission peak wavelength of the light-emitting element for red pixel when the light is reflected by the red phosphor is measured.

Then, the absorbed light intensity AP of the light absorbed by the red phosphor is calculated according to the following expression (iii). This absorbed light intensity AP is multiplied by the wavelength of the light with an emission peak wavelength of the light-emitting element for red pixel to be converted into an absorbed light photon number-corresponding value PA.

Absorbed light intensity $AP=\{$(reflected light intensity $RW)/0.97\}-$(reflected light intensity $RP$)　　(iii).

Similarly, the reflected light intensity RW is multiplied by the wavelength to be converted into a reflected light photon number-corresponding value RWA.

Then, among the light components collected by the integrating sphere in the measurement of the reflected light intensity RP of light with an emission peak wavelength of the light-emitting element for red pixel incident on a red phosphor, the light in a wavelength range different from that of the reflected light (namely, the light emitted by the red phosphor) is measured for the light intensity. The total product of the light intensity and each wavelength is converted into an emitted light photon number-corresponding value PP.

At the final stage, the internal quantum efficiency is calculated by an expression "internal quantum efficiency=(emitted light photon number-corresponding value PP)/(absorbed light photon number-corresponding value PA)".

The absorption efficiency is calculated by an expression "absorption efficiency=(absorbed light photon number-corresponding value PA)/{(reflected light photon number-corresponding value RWA)/0.97}".

It is preferred that the red phosphor 314 have both high internal quantum efficiency and high absorption efficiency are high.

The red phosphor 314 may be any red phosphor within the scope of the present invention and may be used alone or in any combination of two or more at any proportion.

Furthermore, the x-y color coordinate of the light emitted by the red phosphor 314 is in the range of that x is usually 0.50 or more, preferably 0.60 or more, and more preferably 0.63 or more and that y is usually 0.2 or more and preferably 0.3 or more, and usually 0.35 or less.

(Example of Red Phosphor)

The red phosphors 314 used in image display apparatuses according to the present invention may be, for example, the red phosphors used in the first light-emitting device of the present invention, but are not limited thereto.

(Other Examples of Red Phosphor)

Other examples of the red phosphor 314 include Eu-activated α-sialon represented by the formula $Ca_xSi_{12-(m+n)}Al_{(m+n)}O_nN_{16-n}$:Eu (where $0.3<x<1.5$, $0.6<m<3$, and $0\le n<1.5$), $Ca_2Si_5N_8$:Eu, $CaSi_7N_{10}$:Eu, $CaSiN_2$:Eu, and europium complexes which emits fluorescence. The above-mentioned phosphors may be used in combination thereof.

In particular, $MSiAlN_3$:$Eu^{2+}$ (where M is at least one metal selected from Ca and Sr) is preferred, because it satisfies the above-mentioned conditions of, for example, temperature-dependent coefficient, absorption efficiency, and internal quantum efficiency.

The red phosphor 314 is usually used in the form of particles. The diameter of the particles of the red phosphor 314 is not especially limited, but is usually 150 μm or less, preferably 50 μm or less, and more preferably 30 or less. A diameter larger than this range may cause a large color shift of emission light of the red-light emitting device 311, and may preclude uniform application of the red phosphor 314 when the red phosphor 14 is used as a mixture with a binder (sealant). The lower limit of the particle diameter is usually 1 μm and preferably 5 μm. Particles with a diameter smaller than this range may reduce emission efficiency.

The red phosphor 314 may have any state within the range that does not significantly impair the effects of the image display apparatus of the present invention. For example, the red phosphor 314 may be held in the frame 312 by a binder 318 or may be fixed to the frame 312 without using the binder 318.

The binder 318 is usually used for holding the red phosphor 314 in the form of powder or particles together or for fixing the red phosphor 314 to the frame 312. The binder 318 used in this embodiment is not limited and may be any known one.

When the red-light emitting device 311 is a transmissive type, namely, the red light is transmitted through the binder 318 and is emitted to the outside of the red-light emitting device 311, it is preferred that the binder 318 transmit all components of the red light.

The binder 318 may be a resin or an inorganic material such as glass. Examples of the binder include organic resins such as epoxy resins and silicone resins; and inorganic materials such as polysiloxane gel and glass.

A binder 318 composed of a resin may have any viscosity, but it is preferred that the binder 318 have a viscosity suitable for the particle size and the relative density, in particular, the relative density per surface area of the red phosphor 314. For example, when the binder 318 is composed of an epoxy resin and when the red phosphor 314 has a diameter of 2 μm to 5 μm and a relative density of 2 to 5, in general, the particles of the red phosphor 314 can be well dispersed by controlling the viscosity of the epoxy resin to 1 Pas to 10 Pas.

The binder 318 may be composed of a single material or two or more different materials at any proportion.

Furthermore, the red phosphor 314 may contain other ingredients. Such ingredients do not have any limitation and may be known additives.

For example, a diffusing agent such as alumina or yttria is preferable for controlling light distribution or color mixing of the red-light emitting device 311.

In order to produce a red phosphor 314 with high density, for example, it is preferred that a binding agent such as calcium pyrophosphate or barium-calcium borate be used.

The red phosphor can be held by the frame 312 without using the binder 318. For example, after firing, the fired red phosphor may be directly mounted on the frame 312. Alternatively, for example, a red phosphor in the form of glass or single crystal may be mounted on the frame 312.

When the binder 318 is used, the above-mentioned other ingredients may be dispersed in the binder 318. When the binder 318 is not used, the other ingredients such as an additive can be used with the wavelength-converting material.

In this embodiment, the red phosphor 314 is represented by $CaSiAlN_3$:$Eu^{2+}$ and is disposed in the concave 312A of the frame 312 in the state of dispersion.

The red phosphor 314 used in this embodiment has a temperature-dependent coefficient, absorption efficiency, and internal quantum efficiency within the above-described desirable ranges. The binder 318 can transmit excitation light emitted by the light-emitting element 313 for red pixel and red light emitted by the red phosphor 314.

[IV-1-4. Preparation of Red Light-Emitting Device]

The red-light emitting device 311 may be produced by any process, for example, by dispersing a red phosphor 314, a binder 318 and other ingredients, which may be optionally used, in a dispersion medium to prepare a slurry; applying the slurry to a frame 312 provided with an light-emitting element 313 for red pixel; and then drying the slurry. The light-emitting element 313 for red pixel may be mounted on the frame 312 when or after the slurry is applied.

The slurry is prepared by mixing a red phosphor 314, a binder 318 and other ingredients, which may be optionally used, and other ingredients such as an additive to a dispersion medium. In general, slurry is called by different names, such as paste or pellet, depending on the type of the binder 318, but the term "slurry" includes them in this embodiment.

The dispersion medium used in the preparation of the slurry is not especially limited and may be any known dispersion medium. Examples of the dispersion media include linear hydrocarbons such as n-hexane, n-heptane, and Sorbesso; aromatic hydrocarbons such as toluene and xylene; halogenated hydrocarbons such as trichloroethylene and perchloroethylene; alcohols such as methanol, ethanol, isopropanol, and n-butanol; ketones such as acetone, methyl ethyl ketone, and methyl isobutyl ketone; esters such as ethyl acetate and n-butyl acetate; ethers such as cellosolve, butyl solve, and cellosolve acetate; and aqueous solvents such as water and aqueous solutions.

Then, the prepared slurry is applied onto a base material such as the frame 312. The coating may be carried out by any process, such as dispensing or potting.

After the coating, the dispersion medium is dried to fix the red phosphor 314 to the frame 312. The drying may be carried out by any method, such as air drying, drying by heating, vacuum drying, baking, ultraviolet irradiation, or electron irradiation. In particular, baking at a temperature of several tens of degrees to a hundred and several tens of degrees can be readily carried out with inexpensive equipment and surely remove the dispersion medium, and therefore is preferred.

In order to produce a reflective red light-emitting device including the red phosphor 314 with high density, it is preferred that a binding agent is additionally mixed into the slurry. The slurry containing a binding agent is desirably applied by, for example, screen printing or ink-jet printing which can readily apply the slurry divisionally, but may be applied by a usual application process.

The red phosphor 314 may be mounted on the frame without the slurry. For example, a red phosphor 314, a binder 318 and other ingredients, which may be optionally used, are kneaded and then are molded to be fixed to the frame 312. Thereby, the red-light emitting device 311 can be produced. The molding may be conducted by, for example, press forming, extrusion (such as T-die extrusion, inflation extrusion, blow molding, melt spinning, or contour extrusion), or injection molding.

The binder 318 may be a thermosetting material such as an epoxy resin or a silicone resin. In such a case, for example, an uncured binder 318, the red phosphor 314, and other ingredients which are optionally used are mixed and then are molded. Then, the mixture is heated to mount the red phosphor 314 to the frame 312 by the curing of the binder 318. Thereby, the red-light emitting device 311 can be produced. Alternatively, the binder 318 may be a UV-curable (ultraviolet-curable) material. In such a case, the binder 318 is cured by UV-light irradiation, instead of the heating described above, to mount the red phosphor 314 to the frame 312. Thereby, the red-light emitting device 311 can be produced.

The red phosphor 314 may be prepared in the processes for producing the red-light emitting device 311. Alternatively, a member containing the red phosphor 314 may be separately prepared and be mounted to the frame 312 afterward to complete the red-light emitting device 311.

[IV-2. Green Pixel]

Figure 13:
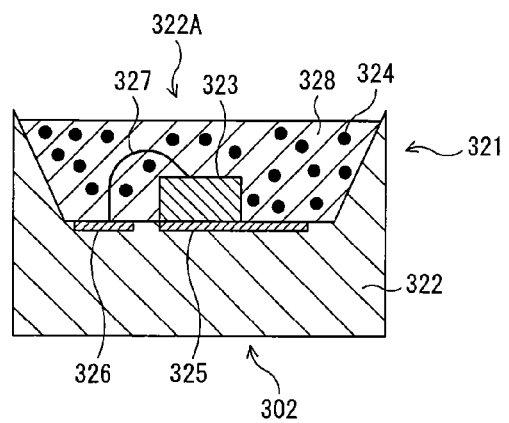
FIG. 13 is a cross-sectional view schematically illustrating the substantial part of a green light-emitting device including a green pixel, which is one of the non-red pixels, according to the embodiment of the present invention.

FIG. 13 is a cross-sectional view schematically illustrating the substantial part of a green light-emitting device (green light-emitting element) 321 including a green pixel 302, which is one of the non-red pixels, according to this embodiment.

The green pixel 302 used in this embodiment does not have any limitation and may be any light source emitting green light in the range that does not significantly impair the effects of the image display apparatus of the present invention. Therefore, known green light-emitting LED can be used as the green pixels 302 according to this embodiment. It is preferred that the green-light emitting device 321 have a structure including a light-emitting element 323 for green pixel and a green phosphor 324 as a wavelength-converting material, in view of reducing the temperature dependency for reducing the change in color tone due to a small change in temperature, as in the case of the red light source 301.

The green pixel 302 according to this embodiment also includes green-light emitting device 321 containing the light-emitting element 323 for green pixel and the green phosphor 324 as shown in FIG. 13. The green phosphor 324 is excited by the light emitted by light-emitting element 323 for green pixel and emits green light. This green light is emitted as green light from the green pixel 302. Furthermore, like the red-light emitting device 311, part of the light emitted by the light-emitting element 323 for green pixel which is not absorbed by the green phosphor 324 as the excitation light may be emitted with the green light emitted by the green phosphor 324 to the outside of the color display as one component of the green light emitted by the green pixel 302.

The peak wavelength of the green light emitted by the green pixel 302 may be optionally determined according to the conditions of use and purpose of the color display, but is usually 490 nm or more and preferably 500 nm or more, and usually 570 nm or less and preferably 550 nm or less.

In general, the green-light emitting device 321 including the green pixel 302 also has the green phosphor 324 and a frame 322 as a base for holding the light-emitting element 323 for green pixel.

[IV-2-1. Frame]

The frame 322 used in the green-light emitting device 321 is the same as the frame 312 used in the red-light emitting device 311.

In this embodiment, electrically conductive terminals 325 and 326 for supplying electric power to the light-emitting element 323 for green pixel are disposed on the bottom of a concave 322A of the cup-shaped frame 322. The electrically conductive terminals 325 and 326 are connected to an external power supply (not shown).

[IV-2-2. Light-Emitting Element for Green Pixel]

The light-emitting element 323 for green pixel emits light for exciting the green phosphor 324.

Any light-emitting element which emits light exciting the green phosphor 324 can be used, and examples thereof are of similar to those described in the light-emitting element 313 for red pixel. The light-emitting element 323 for green pixel can be mounted on a frame 322 by the same procedure as in the light-emitting element 313 for red pixel.

In this embodiment, the light-emitting element 323 for green pixel is an (In,Ga)N LED which emits near-ultraviolet to blue light and is disposed on the bottom of the concave 322A of the frame 322. Furthermore, the light-emitting element 323 for green pixel is directly connected to the electrically conductive terminal 325 and indirectly connected to the electrically conductive terminal 326 via the wire 327 by wire bonding. Thus, electric power is supplied.

[2-3. Green Phosphor]

The green phosphor 324 absorbs the light emitted by the light-emitting element 323 for green pixel and emits green light, and therefore functions as a wavelength-converting material for converting the wavelength of light emitted by the light-emitting element 323 for green pixel into that of green light.

The green phosphor 324 in this embodiment, as in the red phosphor 314, usually has a temperature-dependent coefficient TR of 85 or more, preferably 90 or more, and more preferably 95 or more. With this, the temperature dependency of emission intensity of the green phosphor 324 can be reduced and the change in color tone of an image displayed by a color display can be reduced. Consequently, the color shift due to a small change in temperature of the color display can be prevented.

The temperature-dependent coefficient TR of the green phosphor 324 can be measured as in the red phosphor 314.

Furthermore, it is preferred that the host compound of the green phosphor 324 do not contain sulfur, as in the red phosphor 314.

In this embodiment, a green phosphor 324 efficiently absorbing the light emitted by the light-emitting element 323 for green pixel is preferred, and it is further preferred that the green phosphor 324 have high emission efficiency.

Specifically, the green phosphor 324 usually has an internal quantum efficiency of 40% or more, preferably 50% or more, and more preferably 60% or more. A green phosphor 324 having an internal quantum efficiency lower than this lower limit may preclude a display from obtaining high emission efficiency.

It is preferred that the green phosphor 324 have an absorption efficiency of 50% or more, preferably 60% or more, more preferably 70% or more, and most preferably 75% or more. A green phosphor having absorption efficiency lower than this lower limit may preclude a display from obtaining high emission efficiency.

The above-mentioned internal quantum efficiency and the absorption efficiency are those for light having the same emission wavelength as that of the light-emitting element 323 for green pixel. More specifically, the internal quantum efficiency and the absorption efficiency are those when a green phosphor is excited by light having the same emission peak wavelength as that of the light emitted by the light-emitting element 323 for green pixel (hereinafter simply referred to as "light with an emission peak wavelength of the light-emitting element for green pixel"). These internal quantum efficiency and absorption efficiency can be measured by the same procedure as in the red phosphor 314 by using the light-emitting element 323 for green pixel instead of the light-emitting element 313 for red pixel and the green phosphor 324 instead of the red phosphor 314.

The green phosphor 324 may be any green phosphor within the scope of the present invention and may be used alone or in any combination of two or more thereof at any proportion.

Furthermore, the x-y color coordinate of the light emitted by the green phosphor 324 is that x is preferably in the range of 0.18 to 0.4 both inclusive and y is usually 0.45 or more, preferably 0.5 or more, and more preferably 0.55 or more.

(Example of Green Phosphor)

The green phosphors 324 used in image display apparatuses according to the present invention may be, for example, the green phosphors used in the first light-emitting device of the present invention, but are not limited thereto.

(Other Examples of Green Phosphor)

Other examples of the green phosphor 324 include materials having an emission peak of 400 nm to 500 nm, such as $(Ba,Ca,Sr)MgAl_{10}O_{17}:Eu$, $(Ba,Mg,Ca,Sr)_5(PO)_4Cl:Eu$, and $(Ba,Ca,Sr)_3MgSi_2O_8:Eu$; and materials having an emission peak of 500 nm to 600 nm, such as $(Ba,Ca,Sr)MgAl_{10}O_{17}:Eu,Mn$, $(Ba,Ca,Sr)Al_2O_4:Eu$, $(Ba,Ca,Sr)Al_2O_4:Eu,Mn$, $(Ca,Sr)Al_2O_4:Eu$, and Eu-activated α-sialon represented by the formula $Ca_xSi_{12-(m+n)}Al_{(m+n)}O_nN_{16-n}:Eu$ (where 0.3<x<1.5, 0.6<m<3, and 0≤n<1.5), but the green phosphor is not limited thereto. The above-mentioned phosphors may be used in combination thereof.

In particular, for example, $Ca_{2.97}Ce_{0.03}Sc_2Si_3O_{12}$ is preferred, because it excellently satisfies the above-mentioned conditions of, for example, temperature-dependent coefficient, absorption efficiency, and internal quantum efficiency.

Like the red phosphor 314, the green phosphor 324 is also usually used in the form of particles. The diameter of the particles of the green phosphor 324 is the same as that of the red phosphor 314.

The green phosphor 324 may have any state within the range that does not significantly impair the effects of the image display apparatus of the present invention. In general, the green phosphor 324 may be mounted on a frame as in the red phosphor 314. For example, a green phosphor may be mounted on the frame with a binder 328; after firing, the fired green phosphor may be directly mounted on the frame; or, a green phosphor in the form of glass or single crystal may be mounted on the frame.

The green phosphor 324 may contain other ingredients as in the red phosphor 314.

Furthermore, the green-light emitting device 321 is produced by the same procedure as in the red-light emitting device 311.

In this embodiment, the green phosphor 324 is represented by $Ca_{2.97}Ce_{0.03}Sc_2Si_3O_{12}$ and is disposed in the concave 322A of the frame 322 in the state dispersed in the binder 328.

The green phosphor 324 used in this embodiment has a temperature-dependent coefficient, absorption efficiency, and internal quantum efficiency within the above-described desirable ranges. The binder 328 can transmit excitation light emitted by the light-emitting element 323 for green pixel and green light emitted by the green phosphor 324.

[IV-3. Blue Pixel]

Figure 14:
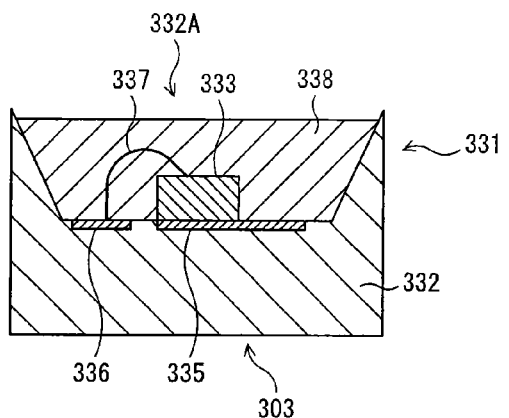
FIG. 14 is a cross-sectional view schematically illustrating the substantial part of a blue light-emitting device including a blue pixel, which is one of the non-red pixels, according to the embodiment of the present invention.

FIG. 14 is a cross-sectional view schematically illustrating the substantial part of a blue light-emitting device (blue-light emitting element) 331 including a blue pixel 303, which is one of the non-red pixels, according to this embodiment.

The blue pixel 303 used in this embodiment does not have any limitation and may be any light source emitting blue light in the range that does not significantly impair the effects of the image display apparatus of the present invention.

In this embodiment, as shown in FIG. 14, the blue pixel 303 includes a blue-light emitting device 331 containing a light-emitting element 333 for blue pixel. The blue light emitted by the light-emitting element 333 for blue pixel is emitted as blue light from the blue pixel 303.

The peak wavelength of the blue light emitted by the blue pixel 303 may be optionally determined according to the conditions of use and purpose of a color display, but is usually 420 nm or more and preferably 440 nm or more, and usually 480 nm or less and preferably 460 nm or less.

In general, the blue-light emitting device 331 of the blue pixel 303 also includes a frame 332 as a base for holding the light-emitting element 333 for blue pixel.

[IV-3-1. Frame]

The frame 332 used in the blue-light emitting device 331 is the same as that used in the red light-emitting device 311.

In this embodiment, electrically conductive terminals 335 and 336 for supplying electric power to the light-emitting element 333 for blue pixel are disposed on the bottom of a concave 332A of the cup-shaped frame 332. The electrically conductive terminals 335 and 336 are connected to an external power supply (not shown).

[IV-3-2. Light-Emitting Element for Blue Pixel]

The blue light emitted by the light-emitting element 333 for blue pixel is the light emitted by the blue pixel 303.

Any light-emitting element which emits blue light can be used as the light-emitting element 333 for blue pixel, and examples thereof are of similar to those described in the light-emitting element 313 for red pixel. The light-emitting element 333 for blue pixel can be mounted on a frame 332 by the same procedure as those described in the light-emitting element 313 for red pixel.

In this embodiment, the light-emitting element 333 for blue pixel is an (In,Ga)N LED which emits blue light and is disposed on the bottom of the concave 332A of the frame 332. Furthermore, the light-emitting element 333 for blue pixel is directly connected to an electrically conductive terminal 335 and indirectly connected to an electrically conductive terminal 336 via the wire 337 by wire bonding. Thus, electric power is supplied. Furthermore, the concave 332A is filled with a mold 338 composed of a binder like the binders 318 and 328. The blue light emitted by the light-emitting element 333 for blue pixel is transmitted through the mold 338 and is emitted to the outside of the device. It is preferred that the mold 338 contain, for example, a diffusing agent such as $TiO_2$ or $BaSO_4$.

[IV-4. Relationship Among Pixels]

The ratio of the emission intensity I(R,100) of the red pixel 301 at 100° C. to the emission intensity I(R,25) at 25° C. is represented by I(R,100)/I(R,25). The ratio of the emission intensity I(N,100) of the non-red pixel 302 or 303 at 100° C. to the emission intensity I(N,25) at 25° C. is represented by I(N,100)/I(N,25). The ratio of the I(N,100)/I(N,25) to the I(R,100)/I(R,25) is usually 90% or more, preferably 92% or more, and more preferably 95% or more in all the red pixel 1 and the non-red pixels 302 and 303.

Therefore, in the above-mentioned embodiments, in the emission intensity I(G,25) of the green pixel 302 at 25° C. and the emission intensity I(G,100) at 100° C., it is desirable that the ratio of the I(G,100)/I(G,25) to the I(R,100)/I(R,25) be in the above-mentioned range. Similarly, in the emission intensity I(B,25) of the blue pixel 303 at 25° C. and the emission intensity I(B,100) at 100° C., it is desirable that the ratio of the I(B,100)/I(B,25) to the I(R,100)/I(R,25) be in the above-mentioned range.

With this, a change in color tone (color shift) due to a small change in temperature in the elements can be reduced.

[IV-5. Other Structures]

Image display apparatuses such as color displays having the red pixels 301, the green pixels 302, and the blue pixels 303 may have any structure.

For example, as shown in FIG. 11, a red-light emitting device 311, a green-light emitting device 321, and a blue-light emitting device 331 which function as the red pixel 301, the green pixel 302, and the blue pixel 303, respectively, are disposed on a substrate 401, and these pixels 301, 302, and 303 constitute a unit pixel 400 of a color display.

The substrate 401 is a printed board on which an electrically conductive layer (not shown) is printed. In general, the printed wiring board may be a multilayer substrate composed of laminated ceramic substrates, so-called green sheets, each having an electrically conductive layer on the surface or may be a single insulating substrate having a printed conductive layer, for example. Either printed wiring board can be used here.

The electrically conductive terminals 315, 316, 325, 326, 335, and 336 of the red-light emitting device 311, the green-light emitting device 321, and the blue-light emitting device 331 are electrically connected to the electrically conductive layer on the surface of the substrate 401.

Furthermore, the timing and the intensity of light emission of each of the light-emitting devices 311, 321, and 331 are independently controlled by a controller (not shown) which is provided to the color display and controls the timing and amount of electric power supplied to each of the light-emitting devices 311, 321, and 331.

The surroundings of the red-light emitting device 311, the green-light emitting device 321, and the blue-light emitting device 331 is surrounded by a cover 402 composed of a resin or ceramic, for example. It is desirable that the inner surface of this cover 402 can reflect visible light, like the frames 312, 322, and 332.

The inside of the cover 402 is filled with a mold 403, such as a resin, for protecting the red-light emitting device 311, the green-light emitting device 321, and the blue-light emitting device 331. The mold 403 may contain a diffusing agent dispersed therein for uniform mixing of the red light, green light, and blue light emitted by the individual light-emitting devices 311, 321, and 331.

The color display according to this embodiment includes a large number of the unit pixels 400 having the structure described above.

[IV-b. Operation]

The color display according to this embodiment has the structure described above. Therefore, a certain image is displayed by controlling the amount of electric power supplied to each of the red-light emitting device 311, the green-light emitting device 321, and the blue-light emitting device 331 by the controller so that the unit pixel 400 at a certain position can emit light with a desired color. Thereby, the light-emitting devices 311, 321, and 331 of each unit pixel 400 on the color display emit red light, green light, and blue light, respectively, according to the image. Thus, the desired image is formed. A viewer can see the image formed on the color display through the unit pixels 400.

In this embodiment, the red pixel 301 includes the red-light emitting device 311 containing a light-emitting element 313 for red pixel and a red phosphor 314 with a temperature-dependent coefficient of 85 or more. This can reduce the change in color tone of the light emitted by the color display due to a change in temperature and reduce the color shift in the image formed by the color display.

The ratio of the I(N,100)/I(N,25) to the I(R,100)/I(R,25) is increased to be within the above-mentioned range. This can achieve an advantage that the change in color tone (color shift) due to a small change in temperature of the element can be reduced.

Furthermore, the use of an (In,Ga)N light-emitting element as the light-emitting element 313 for red pixel has an advantage that a light-emitting device having high efficiency and low temperature dependency can be obtained.

A structure in which the green pixel 302 or the blue pixel 303 functioning as the non-red pixel includes a (In,Ga)N light-emitting element has an advantage that full-color images can be displayed. The (In,Ga)N light-emitting element may be provided to at least one non-red pixel, and it is preferred that each non-red pixel includes the (In,Ga)N light-emitting element for surely achieving the above-mentioned advantage.

The non-red pixel includes a blue pixel 303 containing a light-emitting element 333 for blue pixel and a green pixel 302 containing a light-emitting element 323 for green pixel and a green phosphor 324 with a temperature-dependent coefficient of 85 or more. This has an advantage that the change in color tone (color shift) due to a small change in temperature of the element can be reduced.

[IV-7. Others]

The image display apparatus according to an embodiment of the present invention is described above, but the image display apparatus of the present invention is not limited to the above-described embodiment and can be modified within the scope of the present invention.

The image display apparatus of the present invention may be, for example, of a projector that forms an image on a projection plane such as a screen by illuminating the projection plane with light from the pixels 301, 302, 303, or 400, in addition to a type that forms an image by the pixels 301, 302, 303, or 400 themselves.

Figure 15:
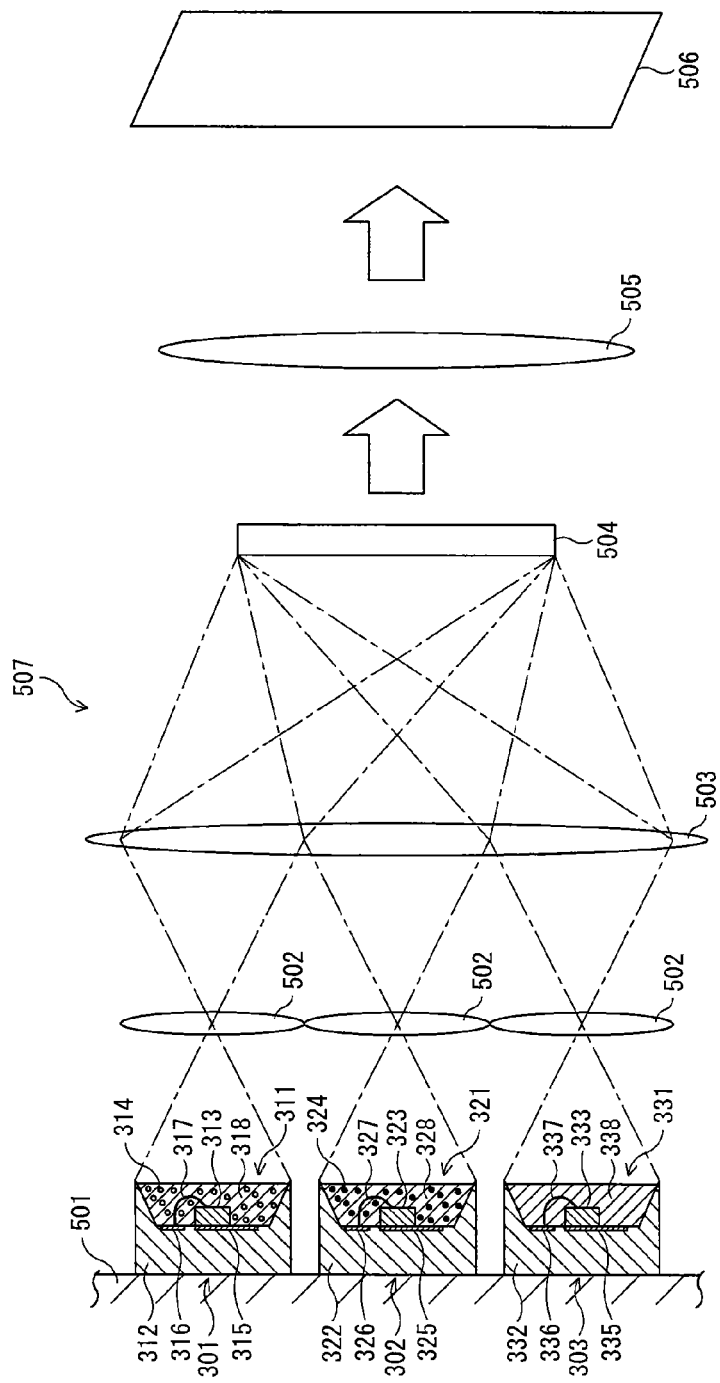
FIG. 15 is a schematic cross-sectional view illustrating the substantial part of a projective color display as an image display apparatus according to an embodiment of the present invention.

A projection color display shown in FIG. 15 is an example of such projector-type image display apparatuses. In FIG. 15, the same reference numerals denote the same components as in FIGS. 11 to 14, and the alternate long and short dashed line and the block arrows represent light.

The color display shown in FIG. 15 includes a red-light emitting device 311, a green-light emitting device 321, and a blue-light emitting device 331 which function as the red pixel 301, the green pixel 302, and the blue pixel 303, respectively, and are mounted on a substrate 501, as in the above-described embodiment. The substrate 501 is a printed board, like the substrate 401. The electrically conductive terminals 315, 316, 325, 326, 335, and 336 of the light-emitting devices 311, 321, and 331 are electrically connected to an electrically conductive layer (not shown) on the surface of the substrate 501.

As in the color display of the above-described embodiment, the timing and the intensity of light emission of each of the red-light emitting device 311, the green light-emitting device 321, and the blue-light emitting device 331 are independently controlled by a controller (not shown) which is provide to the color display and controls timing and amount of electric power supplied to each of the light-emitting devices 311, 321, and 331.

In front of the red-light emitting device 311, the green-light emitting device 321, and the blue-light emitting device 331, light-distributing lenses 502 are disposed as optic collectors for the respective light-emitting device. At the far side of the light-distributing lenses 502, a combine lens 503 for all the light-emitting devices 311, 321, and 331 is disposed.

Furthermore, at the far side of the combine lens 503, a transmissive LCD 504 functioning as a light modulation element, a projection lens 505 for enlarging an image formed on the transmissive LCD 504 and projecting the image on a screen 506 as a projection plane (display plane) and the screen 506 are disposed.

This color display includes a large number of unit pixels 507 each composed of the red-light emitting device 311, the green-light emitting device 321, the blue-light emitting device 331, the light-distributing lenses 502, and the combine lens 503.

Therefore, in such a projective color display, an image is displayed by controlling the electric power supplied to each of the red-light emitting device 311, the green-light emitting device 321, and the blue-light emitting device 331 by the controller so that the unit pixel 507 at a certain position can emit light with a desired color. Thereby, the light-emitting devices 311, 321, and 331 of each unit pixel 507 on the color display emit red light, green light, and blue light, respectively, according to the image to be displayed.

The light components emitted by the red-light emitting device 311, the green-light emitting device 321, and the blue-light emitting device 331 are extracted by the respective light-distributing lenses 502 and are superposed on the light modulation element 304 by the combine lens 503. Thereby, the light components emitted by the light-emitting devices 311, 321, and 331 are superposed, and an image is displayed on the transmissive LCD 504. This image is enlarged and projected on the surface of the screen 506 by the projection lens 505.

According to the present invention, such projector-type image display apparatuses also can reduce the color shift in a displayed image and have the same advantages as those in the above-mentioned embodiments.

Furthermore, for example, the image display apparatus may have a structure in which the red-light emitting device 311, the green-light emitting device 321, and the blue-light emitting device 331 are independently molded without molding them as one unit and are regularly arrayed as independent pixels which independently function as a red, green, or blue pixel.

Alternatively, for example, the image display apparatus may have a structure in which the red-light emitting device 311, the green-light emitting device 321, and the blue-light emitting device 331 are regularly arrayed and are used as a white light source by combining all emitted light components, and an image is controlled by a transmittance-controlling mechanism such as a liquid crystal and red-color and non-red-color filters.

Alternatively, for example, the image display apparatus may have a structure in which each of the red-light emitting device 311, the green-light emitting device 321, and the blue-light emitting device 331 is used as an independent light source, and an image is displayed by projecting images of each color which are formed by a liquid crystal panel or a mirror deflection light modulator (trade name: Digital Micromirror Device).

The image display apparatus may have a structure for displaying character information in color by the respective color light-emitting devices 311, 321, and 331 arrayed in matrix.

According to the present invention, such various image display apparatuses also can reduce the color shift in a formed image and have the same advantages as in the above-mentioned embodiments.

The components described in the above-mentioned embodiments can be used in any combination.

The frames 312, 322, and 332 for the red-light emitting device 311, the green-light emitting device 321, and the blue-light emitting device 331 may be integrated to the substrate 401 or 501.

The red pixel 301, the green pixel 302, and the blue pixel 303 may independently include a component other than the respective red-light emitting device 311, green-light emitting device 321, and blue-light emitting device 331.

The light-emitting devices 311, 321, and 331 may be reflective light-emitting devices having a structure in which, for example, excitation light is reflected at the surface of the frame 312, 322, or 332 and then emitted to the outside of the device.

The present invention may be also performed using a combination of members or structures other than those described above, in the range that does not significantly impair the effects of the image display apparatus of the present invention.

[V. Description of Application of Image Display Apparatus]

From the point of view of the temperature dependency of a phosphor, the above-described image display apparatus can be implemented in the following image display apparatuses.

An image display apparatus of this application includes a light source and a phosphor unit. The light source emits light having an emission peak in the wavelength range of usually 370 nm or more, preferably 380 nm or more, and more preferably 390 nm or more, and 700 nm or less, preferably 500 nm or less, and more preferably 480 nm or less. The phosphor unit contains a wavelength-converting material such as a phosphor with a temperature-dependent retention of 70% or more at 150° C. which absorbs the light emitted by the light source and emits visible light.

Recently, flat panel displays such as liquid crystal displays and plasma display panels have rapidly become popular. The flat panel displays have characteristics that they are thin and lightweight compared to conventional CRT (cathode-ray tube) displays. Therefore, most large-size display panels are flat panel displays, in particular, liquid crystal displays.

Also, in middle-size display panels, flat panel displays have been rapidly become popular. Flat panel displays, in particular, liquid crystal displays are widely used.

However, in the conventional liquid crystal displays, the transmissive angle of backlight light is limited and thereby the viewing angle of passed light is significantly limited. Consequently, viewing-angle problems such as a decrease in black and white contrast or the reversal of black and white contrast occur depending on the viewing angle. In order to solve the viewing-angle problems, for example, some methods such as a pixel-division technique in which divided pixels have different voltage-transmittance characteristics and a technique in which an optical compensation plate is employed are suggested. However, these techniques increase manufacturing and material costs, and thereby liquid crystal displays are prevented from being widely used.

In the conventional image display apparatuses, micro-color filters arrayed on each of the red, green, and blue pixels are employed in order to display color images. However, the micro-color filters are expensive, and thereby liquid crystal display apparatuses are prevented from being widely used.

Light-emitting display apparatuses such as CRT displays, plasma display panels, and electroluminescence displays do not have the viewing angle problems that exist in liquid crystal displays. However, the CRT displays are heavy and large and thereby require much space for installation. The plasma display panels require a high voltage for driving and special circuits therefore, and are thereby expensive. In addition, the plasma display apparatuses generate plasma, and thereby the size of each pixel cannot be sufficiently reduced. Consequently, it is difficult to achieve high definition, particularly, in middle-size image display apparatuses. The electroluminescence displays have problems in environment resistance and durability. In particular, as problems in environment resistance, electroluminescence displays which can be generally operated at 70° C. to 80° C. are required.

Consequently, fluorescence emitting liquid crystal display apparatuses are disclosed (Japanese Patent Application Laid-open Nos. HEI 8-62602 and 2004-348096). In these apparatuses, electro-optic devices each including a liquid crystal having a long operation life due to excellent durability can adjust brightness by controlling transmitted light intensity. Phosphor units of three primary colors are arranged so as to correspond to the respective pixels, and phosphors of the phosphor units are excited by back light having the main emission region in the wavelength range of 380 nm to 420 nm and emit light.

However, the emission intensity of the light emitted by the phosphors disclosed in Japanese Patent Application Laid-open Nos. HEI 8-62602 and 2004-348096 is low, in particular, in red color region, and therefore the color reproduction region of such image display apparatuses is narrow. Furthermore, the excitation of a phosphor with near ultraviolet light having the main emission region in the wavelength range of 380 nm to 420 nm may cause photo-degradation of a resin in the phosphor unit and coloring.

In addition, U.S. Pat. No. 6,844,903 and Japanese Patent Application Laid-open Nos. HEI 10-207395 and HEI 8-63119 disclose techniques for exciting phosphors with visible light, instead of near ultraviolet light disclosed in Japanese Patent Application Laid-open Nos. HEI 8-62602 and 2004-348096.

However, in a phosphor excited by visible light as in disclosed in U.S. Pat. No. 6,844,903 and Japanese Patent Application Laid-open No. HEI 10-207395, the emission brightness highly depends on temperature, and therefore the color of light emitted by the phosphor largely varies. Consequently, the color of a displayed image may shift from a desired one depending on temperature conditions.

The application can solve these problems and achieve an image display apparatus including a phosphor with reduced temperature dependency of emission brightness.

The image display apparatus according to this application will now be described in detail.

The image display apparatus according to this application includes a light source which emits light having a wavelength peak in the wavelength range of 390 nm 700 nm; and a phosphor unit containing a phosphor (hereinafter referred to as "brightness-retaining phosphor") having a temperature-dependent retention of 70% or more at 150° C. as the phosphor absorbing the light emitted by the light source and emitting visible light. The phosphor, or the brightness-retaining phosphor, functions as a wavelength-converting material.

[V-1. Brightness-Retaining Phosphor]

The brightness-retaining phosphor may be any phosphor which emits visible light and has a temperature-dependent retention, namely, the ratio of the intensity of emission brightness at 150° C. to the intensity at room temperature (25° C.) when the phosphor is excited by light having the same intensity, is usually 70% or more, preferably 75% or more, and more preferably 80% or more.

The brightness-retaining phosphors may be used alone or in any combination of two or more thereof. In the combination of two or more brightness-retaining phosphors, the phosphors may be contained in the same phosphor unit or may be separately contained in different phosphor units.

The brightness-retaining phosphors may be, for example, the red phosphors and the green phosphors used in the first light-emitting device of the present invention, but are not limited thereto. Preferable examples of the brightness-retaining phosphor include $CaAlSiN_3$:Eu and $Ca_3Sc_2Si_3O_{12}$:Ce.

[$CaAlSiN_3$:Eu]

First, $CaAlSiN_3$:Eu, which is suitably used as the brightness-retaining phosphor in the image display apparatus of this application, will be described.

$CaAlSiN_3$:Eu is a phosphor emitting red fluorescent light.

$CaAlSiN_3$:Eu is excited by light with a wavelength of 350 nm to 500 nm both inclusive.

$CaAlSiN_3$:Eu emits fluorescent light with an emission peak in the wavelength range of 550 nm to 700 nm both inclusive.

Furthermore, the internal quantum efficiency of $CaAlSiN_3$:Eu at room temperature (25° C.) is usually 50% or more. Here, the internal quantum efficiency is represented by the following expression (iv):

$$\text{Internal quantum efficiency (\%)} = \{(\text{the number of emitted photons})/(\text{the number of absorbed photons})\} \times 100 \quad \text{(iv)}.$$

The emission brightness of $CaAlSiN_3$:Eu scarcely depends on temperature. For details, the emission brightness scarcely varies with a change in temperature conditions, and the emission brightness under a certain temperature condition can be reproduced after the exposure to a temperature change by reinstating the temperature to the certain condition. That is, a change in the emission brightness by heating the phosphor to 150° C. from a room temperature is small, and the emission brightness of the phosphor when cooled to the room temperature again does not decrease compared to that of before the heating. Specifically, $CaAlSiN_3$:Eu has a preferable temperature-dependent retention that the brightness-retaining phosphor should have at 150° C. Therefore, it is preferred to use $CaAlSiN_3$:Eu in the image display apparatus of this application.

[$Ca_3Sc_2Si_3O_{12}$:Ce]

Next, $Ca_3Sc_2Si_3O_{12}$:Ce, which is suitably used as the brightness-retaining phosphor in the image display apparatus of this application, will be described.

$Ca_3Sc_2Si_3O_{12}$:Ce is a phosphor emitting green fluorescent light.

$Ca_3Sc_2Si_3O_{12}$:Ce is excited by light with a wavelength of 350 nm to 500 nm both inclusive.

$Ca_3Sc_2Si_3O_{12}$:Ce emits fluorescent light with an emission peak in the wavelength range of 470 to 550 nm both inclusive.

Furthermore, the internal quantum efficiency of $Ca_3Sc_2Si_3O_{12}$:Ce at room temperature (25° C.) is usually 60% or more.

The emission brightness of $Ca_3Sc_2Si_3O_{12}$:Ce scarcely depends on temperature. For details, the emission brightness scarcely varies with a change in temperature conditions, and the emission brightness under a certain temperature condition can be reproduced after the exposure to a temperature change by reinstating the temperature to the certain condition. That is, like $CaAlSiN_3$:Eu, a change in the emission brightness by heating the phosphor to 150° C. from a room temperature is small, and the emission brightness of the phosphor when cooled to the room temperature again does not decrease compared to that of before the heating. Specifically, $Ca_3Sc_2Si_3O_{12}$:Ce has a preferable temperature-dependent retention that the brightness-retaining phosphor should have at 150° C. Therefore, it is preferred to use $Ca_3Sc_2Si_3O_{12}$:Ce in the image display apparatus of this application.

[V-2. Embodiments]

The application will now be described in detail with reference to embodiments, but is not limited to them.

[V-2-1. First Embodiment]

Figure 16:
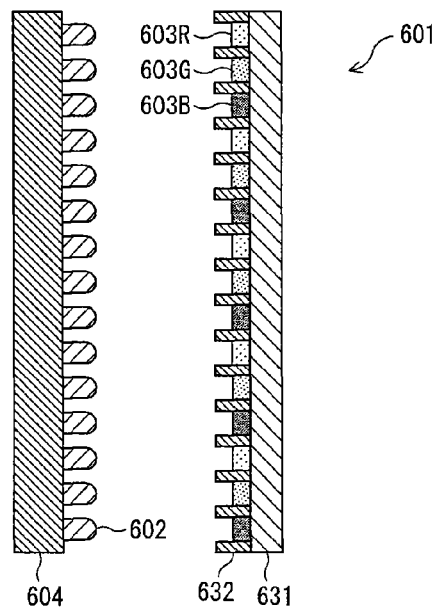
FIG. 16 is an exploded cross-sectional view schematically illustrating the substantial part of an image display apparatus as a first embodiment of an application of the present invention.

FIG. 16 is an exploded cross-sectional view schematically illustrating the substantial part of an image display apparatus as a first embodiment of an application of the present invention. In the image display apparatus shown in FIG. 16, a viewer sees the image displayed by the image display apparatus from the right in the drawing.

As shown in FIG. 16, the image display apparatus 601 according to this embodiment includes light sources 602, phosphor units (first phosphor units) 603R and phosphor units (second phosphor units) 603G each containing a phosphor which absorbs the light emitted by the light source 602 and emits visible light, and light-transmissive units 603B transmitting the light from the light sources 602 to the front.

Each component will be described below.

[V-2-1-1. Frame]

A frame 604 is a base that holds components, such as the light source 602, constituting the image display apparatus 601 and may be in any shape.

The frame 604 may be composed of any material, and examples thereof include inorganic materials such as metals, alloys, glass, and carbon; and organic materials such as synthetic resins. The frame 604 may be made of a proper material depending on application.

However, from the viewpoints of effectively utilizing the light emitted by the light source 602 and improving the emission efficiency of the image display apparatus 601, it is preferred that the reflectance of the surface of the frame 604 on which light emitted from the light source 602 impinging be enhanced. Therefore, it is preferred that at least the surface on which the light impinges be made of a material with high reflectance. Specifically, the entirety or the surface of the frame 604 is made of a raw material (for example, injection molding resin) containing a material with high reflectance, such as glass fiber, alumina powder, or titanium powder.

The reflectance of the surface of the frame 604 may be enhanced by any method. The reflectance of light may be enhanced by a material itself of the frame 604 as described above or may be enhanced by plating the surface with a metal or alloy having high reflectance, such as silver, platinum, or aluminum, or by depositing such a material on the surface.

The reflectance may be enhanced over the entire surface or a part of the surface of the frame 604. In general, it is preferred that the reflectance be enhanced over the entire surface area the light emitted from the light source 602 impinges on.

Furthermore, in general, the frame 604 is provided with electrodes or terminals for supplying electric power to the light source 602. The electrodes or terminals may be connected to the light source 602 by any means. For example, the light source 602 and the electrodes or terminals are connected by wire bonding to supply electric power to the light source 602. In such a case, any wire may be used without limitation and may be made of any material and in any size. For example, the wire may be made of a metal such as gold or aluminum and may usually have a diameter of 20 to 40 μm, but is not limited to this.

Furthermore, the light source 602 may be alternatively supplied with electric power by flip-chip mounting using bumps.

The light source 602 may be supplied with electric power through a solder joint. Solder, which has high heat dissipation, can enhance the heat dissipation of the image display apparatus 601 including a large-current light-emitting diode (LED) or a laser diode (LD) which require high heat dissipation. Any solder may be used, and examples thereof include AuSn and AgSn.

The solder may be used simply for mounting the light source 602 on the frame 604, other than functioning as a path for supplying electric power as being connected to the electrodes and the terminals.

The light source 602 may be mounted on the frame 604 by any method other than soldering, for example, may be fixed to the frame with an adhesive such as an epoxy resin, an imide resin, or an acrylic resin. Also in such a case, like the soldering, electric power can be supplied to the light source 602 by applying current to an adhesive paste prepared by mixing an adhesive agent and electrically conductive filler such as silver particles or carbon particles. In addition, the heat dissipation can be enhanced by mixing the electrically conductive filler, and thereby it is preferred.

In this embodiment, the frame 604 is plate with a surface having enhanced reflectance. On the surface, terminals (not shown) for supplying electric power to the light source 602 are disposed.

The terminals are provided with electric power from a power supply (not shown).

[V-2-1-2. Light Source]

The light source 602 emits light exciting the phosphors contained in the phosphor units 603R and 603G. In this embodiment, the light from the light source 602 is emitted to the outside of the image display apparatus 601 through the light-transmissive unit 603B and can be recognized by a viewer of the image display apparatus 601. In other words, the light emitted by the light source 602 is a component of the light emitted by the pixel itself.

The light source 602 may emit any light having a wavelength in a visible light region which can excite phosphors, $CaAlSiN_3$:Eu and $Ca_3Sc_2Si_3O_{12}$:Ce.

Specifically, the light emitted by the light source 602 has an emission peak in the wavelength range of usually 390 nm or more and preferably 440 nm or more, and usually 700 nm or less and preferably 500 nm or less. When the emission peak is lower than the lower limit of this range, in an image display apparatus 601 including a liquid crystal light shutter, the liquid crystal material itself may be damaged by the light (in this case, ultraviolet) emitted by the light source 602. On the other hand, when the emission peak is higher than the upper limit, the emission efficiency of the phosphor is decreased, and thereby a reduction in the brightness of pixels or narrowing in the color reproduction range may be induced. Thus, it is not preferred.

A light source 602 having two or more emission peaks may have at least one emission peak within the above-mentioned range. In other words, the light source 602 may have an emission peak which can excite either one or both of $CaAlSiN_3$:Eu and $Ca_3Sc_2Si_3O_{12}$:Ce in the above-mentioned wavelength range.

The light source 602 emitting light in the above-mentioned wavelength range, by electric power, for exciting the phosphors contained in the phosphor units 603R and 603G may be any element. Examples of the light source 602 include lamps such as halogen lamps, mercury lamps, hydrogen discharge tubes, neon lamps, xenon lamps, low-pressure sodium lamps, and fluorescent lamps (such as cold cathode tube and hot cathode tube); LED such as inorganic semiconductor LED; and electroluminescent light sources such as organic EL elements. Among them, LED and fluorescent lamps are usually preferred.

In particular, the fluorescent lamp which excites a phosphor with ultraviolet light produced by low-pressure discharge of mercury can give various wavelength spectra by selecting the phosphor and thereby has large flexibility. In addition, the fluorescent lamp consumes relatively a small amount of electricity and is a small-sized. Thereby, the fluorescent lamp is particularly preferred. Furthermore, the fluorescent lamp may be a cold cathode tube or a hot cathode tube which are conventionally used. In such a case, light with a color other than blue, green, and red emission light regions is mixed to white light. Therefore, it is desirable that light in only a blue region is extracted from the white light with, for example, a filter. In particular, a fluorescent lamp applied with only a blue phosphor can effectively decrease its power consumption and is particularly preferred.

Inorganic semiconductor LED with high brightness of blue or white light are recently available and can be used as light sources. In particular, blue light-emitting inorganic semiconductor LED can selectively emit light with a wavelength suitable for this application, and therefore are preferred.

It is preferred that the light sources 602 such as LED or fluorescent lamps are arranged in an array pattern. In other words, it is preferred that the light sources 602 are arrayed in lines and columns as a whole so that each light source 602 can define the respective areas for forming an image thereon. With this, the phosphor units 603R and 603G and the light-transmissive unit 603B can be arranged in an array pattern and the image display apparatus 601 can suitably form a full-color image.

The light from the light source 602 may be directly incident on the phosphor units 603R and 603G and the light-transmissive unit 603B, or may be indirectly incident on the phosphor units 603R and 603G and the light-transmissive unit 603B after reflection by a reflection plate. Like the use of the frame 604 with high reflectance, the light emitted by the light source 602 can be efficiently used by disposing the reflection plate on the back face (the opposite side of the viewer side) of the light source 602.

The light source 602 may have any size.

The light source 602 may be mounted on the frame 604 by any method. The method may be any known means. For example, the light source 602 may be fixed to the frame 604 by soldering as described above.

In this embodiment, LED (light-emitting elements) emitting blue light functioning as the light sources 602 are provided to each of the phosphor units 603R and 603G and the light-transmissive unit 603B. The light from each light source 602 excites the phosphor such as $CaAlSiN_3$:Eu or $Ca_3Sc_2Si_3O_{12}$:Ce contained in the phosphor units 603R and 603G. Part of the light emitted by the light source 602 is transmitted through the light-transmissive unit 603B and can be recognized by a viewer as light from the blue pixel. The light source 602 is provided with electrodes which are electrically connected to terminals on the frame 604 and is supplied with electric power by an interconnected circuit or a wire. The amount of electric power supplied to each light source 602 is independently controlled by a controller (not shown) according to an image to be displayed.

[V-2-1-3. Phosphor Unit and Light-Transmissive Unit]

The phosphor units 603R and 603G contain phosphors which absorb excitation light emitted by the light sources 602 and emit visible light used for forming an image displayed by the image display apparatus 601. In this application, either or both of the phosphor units 603R and 603G contain a brightness-retaining phosphor (for example, $CaAlSiN_3$:Eu or $Ca_3Sc_2Si_3O_{12}$:Ce) as the phosphor. In general, both the phosphor units 603R and 603G are provided to each pixel of the image display apparatus 601 and generate light which is emitted from the pixel.

The light-transmissive unit 603B is provided to each pixel, like the phosphor units 603R and 603G, and transmits the light from the light source 602 to the front for using it as part of the light emitted by the pixel. In general, the light-transmissive unit 603B is provided by the same procedure as that in the phosphor units 603R and 603G, except that phosphors are not contained.

Therefore, in this embodiment, a viewer recognizes an image with fluorescent light from the phosphor units 603R and 603G and the light emitted by the light source 602 through the light-transmissive unit 603B.

(i. Phosphor Unit)

In this embodiment, the phosphor unit 603R contains $CaAlSiN_3$:Eu as a brightness-retaining phosphor and shows red fluorescence as light from a red pixel.

The phosphor unit 603G contains $Ca_3Sc_2Si_3O_{12}$:Ce as a brightness-retaining phosphor and shows green fluorescence as light from a green pixel.

By using these phosphors, $CaAlSiN_3$:Eu and $Ca_3Sc_2Si_3O_{12}$:Ce, with low temperature dependency of emission brightness, the temperature dependency of the image display apparatus 601 itself can be reduced, and thereby the color shift of a displayed image from a desired one can be prevented regardless of temperature conditions.

The phosphor units 603R and 603G may contain other phosphors (hereinafter referred to as "co-phosphor") other than the brightness-retaining phosphors such as $CaAlSiN_3$:Eu and $Ca_3Sc_2Si_3O_{12}$:Ce.

Any co-phosphor can be used in the range that does not significantly impair the effects of this application. The emission color of the co-phosphor is not limited, but is properly determined depending on application. For example, in a full-color display, blue, green, and red luminants with high color purity are preferred. Some methods for properly expressing a color are known. Simply, for example, a color can be expressed by an emission peak wavelength or CIE color coordinates of light. In the case that the wavelength conversion mechanism includes a monochrome display or a multicolor display, it is preferred to contain a phosphor emitting violet, blue-violet, yellow-green, yellow, or orange light. The phosphor units 603R and 603G each containing a mixture of two or more phosphors including a co-phosphor can emit light with high color purity or emit neutraltint color or white light.

The emission peak wavelength of light emitted by the co-phosphor emitting, for example, red fluorescent light is usually 370 nm or more and preferably 380 nm or more, and usually 500 nm or less and preferably 480 nm or less.

The emission peak wavelength of light emitted by the co-phosphor emitting, for example, green fluorescent light is usually 490 nm or more and preferably 500 nm or more, and usually 570 nm or less and preferably 550 nm or less.

The emission peak wavelength of light emitted by the co-phosphor emitting, for example, blue fluorescent light is usually 420 nm or more and preferably 440 nm or more, and usually 480 nm or less and preferably 470 nm or less.

The co-phosphor may have any composition, but it is preferred to contain a metal oxide such as $Y_2O_3$ or $Zn_2SiO_4$ a phosphate such as $Ca_5(PO_4)_3Cl$, or a sulfide such as ZnS, SrS, or CaS as a host crystal, and ions of a rare-earth metal such as Ce, Pr, Nd, Pm, Sm, Eu, Gd, Tb, Dy, Ho, Er, Tm, or Yb or ions of a metal such as Ag, Al, Mn, or Sb as an activator or coactivator.

Preferable examples of the host crystal include ZnS, $Y_2O_2S$, $(Y,Gd)_3Al_5O_{12}$, $YAlO_3$, $BaAl_2Si_2O_8$, $Y_3Al_5O_{12}$, $Y_2SiO_5$, $Zn_2SiO_4$, $Y_2O_3$, $BaMgAl_{10}O_{17}$, $BaAl_{12}O_{19}$, $(Ba,Sr,Mg)O\cdot\alpha Al_2O_3$, $(Y,Gd)BO_3$, $Y_2O_3$, $(Zn,Cd)S$, $SrGa_2S_4$, SrS, $SnO_2$, $Ca_{10}(PO_4)_6(F,Cl)_2$, $(Ba,Sr)(Mg,Mn)Al_{10}O_{17}$, $(Sr,Ca,Ba,Mg)_{10}(PO_4)_6Cl_2$, $(La,Ce)PO_4$, $CeMgAl_{11}O_{19}$, $GdMgB_5O_{10}$, $Sr_2P_2O_7$, $Sr_4Al_{14}O_{25}$, and $(Ba,Sr,Ca)(Mg,Zn,Mn)Al_{10}O_{17}$.

The host crystal and the activator or the coactivator may have any elemental composition. An element may be substituted with another element belonging to the same group, and it is preferred that the co-phosphor absorbs the light emitted by the light source 602 and emits visible light. Examples of the co-phosphors which can be employed will be described below, but co-phosphors used in the image display apparatus 601 according to this embodiment are not limited to those examples.

Red Co-Phosphor:

Examples of the red co-phosphor emitting red light which can be used in this embodiment include europium-activated alkaline-earth silicon nitride phosphors represented by $(Mg,Ca,Sr,Ba)_2Si_5N_8$:Eu and are composed of fractured grains with fractured red cross-sections and emit light in the red region; and europium-activated rare-earth oxychalcogenide phosphors represented by $(Y,La,Gd,Lu)_2O_2S$:Eu and are composed of substantially spherical growth grains of regular crystal growth and emit light in the red region.

In addition, phosphors, disclosed in Japanese Patent Application Laid-open No. 2004-300247, containing an oxynitride and/or an oxysulfide which contain at least one element selected from the group consisting of Ti, Zr, Hf, Nb, Ta, W, and Mo are preferred as the co-phosphor in this embodiment. The co-phosphor containing oxynitride having an α-sialon structure in which a part of or all Al elements are replaced with Ga elements is preferred in this embodiment. These phosphors each contain an oxynitride and/or an oxysulfide.

Other examples of red co-phosphors include $Y_2O_2S$:$Eu^{3+}$, $(BaMg)_2SiO_4$:$Eu^{3+}$, $(BaCaMg)_5(PO_4)_3Cl$:$Eu^{3+}$, $YVO_4$:$Eu^{3+}$, CaS:$Eu^{3+}$, $YAlO_3$:$Eu^{3+}$, $Ca_2Y_8(SiO_4)_6O_2$:$Eu^{3+}$, $LiY_9(SiO_4)_6O_2$:$Eu^{3+}$, $(Y,Gd)_3Al_5O_{12}$:$Ce^{3+}$, $(Ca,Sr)_2Si_5N_8$:Eu, $CaSiN_2$:Eu, $(Sr,Ca,Ba,Mg)_{10}(PO_4)_6Cl_2$:Eu,Mn, and $(Ba_3Mg)Si_2O_9$:Eu,Mn.

Green Co-Phosphor

Examples of the green co-phosphor emitting green light which can be used in this embodiment include europium-activated alkaline-earth silicon oxynitride phosphors represented by $(Mg,Ca,Sr,Ba)Si_2O_2N_2$:Eu and are composed of fractured grains with fractured cross-sections and emit green light; and europium-activated alkaline-earth magnesium silicate phosphors represented by $(Ba,Ca,Sr)_2SiO_4$:Eu and are fractured grains with fractured cross-sections and emit light in the green region.

Other examples of green co-phosphors include $BaMgAl_{10}O_{17}$:$Eu^{2+}$, $Mn^{2+}$, $Sr_4Al_{14}O_{25}$:$Eu^{2+}$, $(SrBa)Al_2Si_2O_8$:$Eu^{2+}$, $(BaMg)_2SiO_4$:$Eu^{2+}$, $Y_2SiO_5$:$Ce^{3+}$, $Tb^{3+}$, $Sr_2P_2O_7$—$Sr_2B_2O_5$:$Eu^{2+}$, $(BaCaMg)_{10}(PO_4)_6Cl$:$Eu^{2+}$, $Sr_2Si_3O_8$-$2SrCl_2$:$Eu^{2+}$, $Zr_2SiO_4$, $MgAl_{11}O_{19}$:$Ce^{3+}$, $Tb^{3+}$, $Ba_2SiO_4$:$Eu^{2+}$, $Ca_2Y_8(SiO_4)_6O_2$:$Tb^{3+}$, $Y_3Al_5O_{12}$:$Tb^{3+}$, $La_3Ga_5SiO_{14}$:$Tb^{3+}$, $SrGa_2S_4$:$Eu^{2+}$, $Tb^{3+}$, $Sm^{2+}$, $Y_3(Al,Ga)_5O_{12}$:Ce, $SrSi_2O_2N_2$:Eu, $BaMgAl_{10}O_{17}$:Eu,Mn, and $SrAl_2O_4$:Eu.

The co-phosphors may be used alone or in any combination of two or more at any proportion.

However, from the viewpoint of surely achieving the effects of this application, a higher ratio of the brightness-retaining phosphors to the total phosphors is preferred when the co-phosphors are used. It is more preferred that all the phosphors are brightness-retaining phosphors.

In general, the phosphor units 603R and 603G include binders for protecting the phosphors from force or moisture from an external environment. Specifically, the phosphor units 603R and 603G are formed by dispersing the phosphors in binders.

In this embodiment, any binder can be used in the range that does not significantly impair the effect of this application. In general, a transparent material is preferred from the view of properly transmitting fluorescent light and excitation light.

The binder may be used alone or in any combination of two or more at any proportion.

In general, non-aromatic epoxy resins are excellent in light resistance and transparency and are thereby preferred. In particular, non-aromatic epoxy resins which can reduce the content of inorganic chlorine to 1 ppm or less and the content of organic chlorine to 5 ppm or less are preferred, and distilled, chlorine-free non-aromatic epoxy resins are more preferred. In this embodiment, ppm means a proportion on the basis of weight.

Preferable examples of the non-aromatic epoxy resins include alicyclic epoxy resins such as 3,4-epoxycyclohexyl-methyl-3',4'-epoxycyclohexyl carboxylate; epoxy resins consisting of an alicyclic epoxy resin as a main ingredient, a cyclohexane derivative such as hexahydrophthalic acid diglycidyl ester or hydrogenated bisphenol A diglycidyl ether, and epichlorohydrin; liquid or solid epoxy resins consisting of bisphenol A diglycidyl ether; and nitrogen-containing epoxy resins such as triglycidyl isocyanurate.

A binder composed of a non-aromatic epoxy resin may further contain a curing agent, a cocatalyst, and a curing accelerator described below.

The curing agent hardens the non-aromatic epoxy resin. Acid anhydride curing agents are preferred. In particular, non-aromatic polybasic carboxylic acid anhydrides that chemically have no carbon-carbon double bond are preferred because the materials contained in the binder must be light resistive. Examples of the curing agent include hexahydrophthalic anhydride, methylhexahydrophthalic anhydride, trialkyltetrahydrophthalic anhydride, and hydrogenated methylnadic anhydride. Among them, methylhexahydrophthalic anhydride has excellent compatibility between curing reactivity and moisture resistance and is therefore preferred.

The curing agent may be used alone or in any combination of two or more at any proportion.

The curing agent may be used in any amount, but the amount is usually 50 parts by weight or more and preferably 80 parts by weight or more, and usually 150 parts by weight or less and preferably 130 parts by weight or less, on the basis of 100 parts by weight of the non-aromatic epoxy resin.

The cocatalyst imparts flexibility to the cured non-aromatic epoxy resin (including the phosphor units 603R and 603G and the light-transmissive unit 603B, hereinafter the same) and improves peeling adhesion strength. In particular, alcohols and polyols can also function as compatibilizers for the curing accelerator and are therefore preferred. Among them, linear, branched, alicyclic, or ether group-containing alcohols and polyols having 2 to 12 carbon atoms that are not aromatic and chemically have no carbon-carbon double bond are preferred because the materials contained in the binder must be light resistive. Examples of the cocatalysts include propanol, isopropanol, methylcyclohexanol, ethylene glycol, glycerin, trimethylolpropane, and ethylene glycol monomethyl ether. In particular, low molecular weight diols such as ethylene glycol are preferred.

The cocatalyst may be used alone or in any combination of two or more at any proportion.

As described above, since alcohols and polyols function as compatibilizers for curing accelerators, these are therefore affected by the chemical structures and the contents of the curing accelerators.

The cocatalyst may be used in any amount, but the amount is usually 1 part by weight or more and preferably 5 parts by weight or more, and usually 30 parts by weight or less and preferably 15 parts by weight or less, on the basis of 100 parts by weight of the non-aromatic epoxy resin.

The curing accelerator enhances curing of the non-aromatic epoxy resin, and examples thereof include:
(1) tertiary amines or imidazoles and/or organic carboxylates thereof,
(2) phosphines and/or quaternary salts thereof,
(3) metal salts of organic carboxylic acid,
(4) metal-organic chelate compounds, and
(5) aromatic sulfonium salts.

The curing accelerator may be used alone or in any combination of two or more at any proportion.

Each of the curing accelerators will be described below.
(1) Tertiary Amines or Imidazoles and/or Organic Carboxylates Thereof:

Examples of the tertiary amines or imidazoles and/or organic carboxylates thereof include 2,4,6-tris(diaminomethyl)phenol, 2-ethyl-4-methylimidazole, 1,8-diazabiscyclo(5,4,0)undecene-7 (hereinafter referred to as "DBU"), and octylates thereof. In particular, DBU octylate, which enhances translucency of cured non-aromatic epoxy resins, is preferred.

The tertiary amines or imidazoles and/or organic carboxylates thereof may be used in any amount as curing accelerators, but the amount is usually 0.01 parts by weight or more and preferably 0.1 parts by weight or more, and usually 1 part by weight or less and preferably 0.5 parts by weight or less on the basis of 100 parts by weight of the non-aromatic epoxy resin, in view of the moisture resistance characteristics of the image display apparatus 601.
(2) Phosphines and/or Quaternary Salts Thereof:

Examples of the phosphines and quaternary salts thereof include triphenylphosphine, tributylphosphine, benzyltriphenylphosphonium bromide, and benzyltributylphosphonium bromide. In particular, benzyltriphenylphosphonium bromide, which enhances translucency of cured non-aromatic epoxy resins, is preferred.

The phosphines and/or quaternary salts thereof may be used in any amount as curing accelerators, but the amount is usually 0.01 parts by weight or more and preferably 0.1 parts by weight or more, and usually 1 part by weight or less and preferably 0.5 parts by weight or less on the basis of 100 parts by weight of the non-aromatic epoxy resin, in view of the moisture resistance characteristics of the image display apparatus 1.
(3) Metal Salts of Organic Carboxylic Acid:

Examples of the metal salts of organic carboxylic acid include zinc octylate, zinc laurate, zinc stearate, and tin octylate, which have no carbon-carbon double bond impairing light resistance. The solubility of the metal salts of organic carboxylic acid in the non-aromatic epoxy resin is proportionally decreased in proportion to an increase in the number of carbon atoms of the organic carboxylic acid component. Zinc octylate, which is liquid, can be used in the highest amount, and therefore does not require a long time for dispersion and dissolution. Therefore, from the viewpoint of curing properties, zinc octylate is particularly preferred to other metal salts of organic carboxylic acid.

The metal salts of organic carboxylic acid may be used in any amount as curing accelerators, but the amount is usually 1 part by weight or more, and usually 10 parts by weight or less and preferably 5 parts by weight or less on the basis of 100 parts by weight of the non-aromatic epoxy resin, in view of enhancing translucency of cured non-aromatic epoxy resins.
(4) Metal-Organic Chelate Compounds:

Examples of the metal-organic chelate compounds include zinc acetylacetonate chelate, zinc benzoylacetone chelate, zinc dibenzoylmethane chelate, and zinc ethyl acetoacetate chelate, each being made of zinc and β-diketone, which do not effect on transparency. In particular, zinc chelate compounds can impart excellent light resistance and heat resistance to non-aromatic epoxy resins. The zinc chelate compounds also have properties to selectively and gently accelerate the curing of non-aromatic epoxy resins. Thereby, even in the case that a low-molecular weight monomer such as alicyclic epoxy resins is a main ingredient, low-stress adhesion can be achieved.

Among the zinc chelate compounds, bis(acetylacetonato)aquazinc (2) $[Zn(C_5H_7O_2)_2(H_2O)]$ including acetylacetone as a chelate component is preferred because of ease of handling, for example.

The metal-organic chelate compounds may be used in any amount as curing accelerators, but the amount is usually 1 part by weight or more, and usually 10 parts by weight or less and preferably 5 parts by weight or less on the basis of 100 parts by weight of the non-aromatic epoxy resin, in view of enhancing the solubility into the non-aromatic epoxy resin.
(5) Aromatic Sulfonium Salts:

The aromatic sulfonium salts are generally used in compositions of non-aromatic epoxy resins not containing acid anhydrides as curing agents.

The aromatic sulfonium salts are decomposed by heat and/or ultraviolet light having a wavelength of 360 nm or less and generate cations to obtain cation-polymerized cured non-aromatic epoxy resins. These resulting cured products are ether-crosslinked and are physically and chemically stable, compared to those cured by the curing agents.

Examples of the aromatic sulfonium salts include triphenylsulfonium antimony hexafluoride and triphenylsulfonium phosphorus hexafluoride. In particular, triphenylsulfonium antimony hexafluoride achieves sufficient curing at a high rate and even when used in a small amount, and is thereby preferred.

The aromatic sulfonium salts may be used in any amount as curing accelerators, but the amount is usually 0.01 parts by weight or more and preferably 0.05 parts by weight or more, and usually 0.5 parts by weight or less and preferably 0.3 parts by weight or less on the basis of 100 parts by weight of the non-aromatic epoxy resin, in view of preventing discoloring of cured non-aromatic epoxy resins due to heat generation by the chain polymerization.

The binder may be of other than the non-aromatic epoxy resins. Examples of such binders include materials containing polymethyl methacrylate, polyacrylate, polycarbonate, polyvinyl alcohol, polyvinyl pyrrolidone, hydroxyethyl cellulose, carboxymethyl cellulose polystyrene, a styrene-maleic anhydride copolymer, a styrene-acrylonitrile copolymer, polyvinyl chloride, cellulose acetate butyrate, cellulose propionate, poly-α-naphthyl methacrylate, polyvinylnaphthalene, poly-n-butyl methacrylate, a tetrafluoroethylene-hexafluoropropylene copolymer, polycyclohexyl methacrylate, poly(4-methylpentene), epoxy, polysulfones, polyether ketones, polyallyl, polyimides, polyether imides, cyclic olefin polymers, polysiloxanes, benzocyclobutane polymers, water glass, silica, titanium oxide, and epoxy resins.

The amount of the binder in each of the phosphor units 603R and 603G is not limited within the range that does not significantly impair the effects of this application, and is usually 5% by weight or more and preferably 10% by weight or more, and usually 95% by weight or less and preferably 90% by weight or less.

In addition, the ratio of the binder to the phosphor (for example, $CaAlSiN_3$:Eu, $Ca_3Sc_2Si_3O_{12}$:Ce, or the co-phosphor) in each of the phosphor units 603R and 603G is not limited within the range that does not significantly impair the effects of this application, and the ratio of the binder to the total of the binder and the phosphor is usually 5% by weight or more and preferably 10% by weight or more, and usually 95% by weight or less and preferably 90% by weight or less. The binder in an amount less than this lower limit may decrease the brightness. The binder in an amount higher than this higher limit may reduce the mechanical strength of the phosphor units 603R and 603G. When one phosphor unit contains two or more phosphors, it is desirable that the total amount of the phosphors is in the above-mentioned range.

The phosphor units 603R and 603G may each contain an additive other than the binder and the phosphor. The additive other than the curing agent, the cocatalyst, and the curing accelerator may be, for example, a diffusing agent for increasing the view angle. Examples of the diffusing agent include barium titanate, titanium oxide, aluminum oxide, and silicon oxide. The additive may contain an organic or inorganic coloring dye or pigment for removing light having an undesired wavelength. The additive may be composed of one type or two or more different types at any proportion.

The phosphor units 603R and 603G can be formed by any known process. For example, the phosphor units 603R and 603G may be each formed on a transparent substrate 631 by arranging a mixture (coating liquid) of a binder, a phosphor, and a solvent into a mosaic, array, or stripe pattern at intervals corresponding to pixels by screen printing.

Furthermore, a block matrix layer 632 for absorbing external light may be formed between the phosphor units 603R and 603G. The black matrix layer 632 may be formed on a transparent substrate 631 such as glass as a light-absorbing film composed of carbon black by a process based on the photosensitivity of a photosensitive resin or may be formed by laminating a mixture of a resin, carbon black, and a solvent by screen printing.

The phosphor units 603R and 603G may have any shape. For example, in a multicolor image display apparatus 601, the phosphors each showing a predetermined color are disposed in light-emitting regions, such as the phosphor units 603R and 603G, in such a manner to fit the shapes of pixels (picture elements). The shape of the phosphor units 603R and 603G may be a segment or a matrix required for displaying information. In the matrix, for example, a stripe structure or a delta structure is preferred. In a monochrome display apparatus, the shape of the phosphor units 603R and 603G may be the same as above or may be formed by simply coating the phosphors uniformly.

Each of the phosphor units 603R and 603G may have any size. For example, the thickness is not limited within the range that does not significantly impair the effects of this application, but is usually 1 cm or less. In a flat-panel display required to be thin and lightweight, the thickness is preferably 2 mm or less. The thickness is, in view of the balance between the thickness and the emission efficiency of light, usually 1 μm or more, preferably 5 μm or more, and more preferably 10 μm or more, and usually 1000 μm or less, preferably 500 μm or less, and more preferably 200 μm or less.

(ii. Light-Transmissive Unit)

In this embodiment, the light-transmissive unit 603B transmits the light emitted by the light source 602 toward the front as light from a blue pixel. The light source 602 of the image display apparatus 601 emits blue visible light which is used as light emitted by the pixel.

The light-transmissive unit 603B may have any structure. In general, the structure is the same as that of the phosphor units 603R and 603G, except that phosphors are not contained. In the light-transmissive unit 603B, a phosphor emitting fluorescent light with the same color as that of the visible light emitted by the light source is not essential.

In other words, not all pixels need to be provided with a phosphor when the visible light emitted by the light source 602 is transmitted to the outside of the image display apparatus 601. However, it is desirable that the visible light emitted by the light source 602 be transmitted through the light-transmissive unit 603B including a binder containing an additive for efficiently emitting or dispersing the visible light emitted by the light source 602 to the outside and for removing light with an undesirable wavelength.

Furthermore, the light-transmissive unit 603B may contain a dye or pigment for controlling the color tone.

In this embodiment, the red phosphor unit 603R contains a brightness-retaining phosphor, $CaAlSiN_3$:Eu, as the red phosphor and a non-aromatic epoxy resin as the binder. A plurality of the red phosphor units 603R corresponding to the red pixels is disposed on the transparent substrate 631 as a dispersion of the red phosphor in the binder.

In this embodiment, the green phosphor unit 603G contains a brightness-retaining phosphor, $Ca_3Sc_2Si_3O_{12}$:Ce, as the green phosphor and a non-aromatic epoxy resin as the binder. A plurality of the green phosphor units 603G corresponding to the green pixels is disposed on the transparent substrate 631 as a dispersion of the green phosphor in the binder.

In this embodiment, the light-transmissive unit 603B contains a non-aromatic epoxy resin as the binder and a diffusing agent dispersed in the binder. A plurality of the light-transmissive units 603B is disposed on the transparent substrate 631 as a dispersion of the diffusing agent in the binder so as to correspond to the blue pixels.

The transparent substrate 631 provided with the red phosphor units 603R, the green phosphor units 603G, and the light-transmissive units 603B is disposed at a position facing the light sources 602. With this, each red phosphor unit 603R receives the light from the light source 602 and emits red light, each green phosphor unit 603G receives the light from the light source 602 and emits green light, and each light-transmissive unit 603B diffuses the blue light emitted by the light source 602 by the diffusing agent and transmits the light toward the front. The red phosphor units 603R, the green phosphor units 603G, and the light-transmissive units 603B are each separated from each other by black matrix layers 632.

[V-2-1-4. Operation]

The image display apparatus 601 having the above-mentioned structure according to this embodiment emits light having a predetermined intensity from each of the light sources 602 in use. The light sources 602 each emit light having intensity controlled by a controller (not shown) for the pixel (i.e., red phosphor unit 603R, green phosphor unit 603G, or light-transmissive unit 603B) corresponding to each light source according to an image to be displayed by the image display apparatus 601. The light emitted by each light source 602 enters the corresponding red phosphor unit 603R, green phosphor unit 603G, or light-transmissive unit 603B.

In the red phosphor unit 603R, the red phosphor ($CaAlSiN_3$:Eu) dispersed in the red phosphor unit 603R absorbs incident light and emits red fluorescent light. In the green phosphor unit 603G, the green phosphor ($Ca_3Sc_2Si_3O_{12}$:Ce) dispersed in the green phosphor unit 603G absorbs incident light and emits green fluorescent light. In the light-transmissive unit 603B, the diffusing agent dispersed in the light-transmissive unit 603B scatters incident light and transmits the blue incident light toward the front while making the light distribution characteristics coincide with those of the fluorescent light emitted from the phosphor units 603R and 603G.

The amount of the incident light is thus controlled for each pixel by the controller according to an image to be formed, and thereby the intensity of the fluorescent light (visible light) emitted by each of the phosphor units 603R and 603G is controlled for each pixel to form the desired image.

The red and green fluorescent light thus generated and the blue light emitted by the light source 602 and transmitted through the light-transmissive unit 603B are emitted to the outside (the right side in the drawing) of the image display apparatus 601 through the transparent substrate 631. A viewer recognizes the image by perceiving the light from the surface of this transparent substrate 631.

The phosphors of the phosphor units 603R and 603G are brightness-retaining phosphors, i.e., $CaAlSiN_3$:Eu and $Ca_3Sc_2Si_3O_{12}$:Ce, respectively. This reduces the temperature dependency of the emission brightness of the image display apparatus 601 itself. Consequently, a color shift from the desired color of an image to be displayed due to temperature conditions can be prevented. Thus, it is very useful in practical application.

[V-2-2. Second Embodiment]

Figure 17:
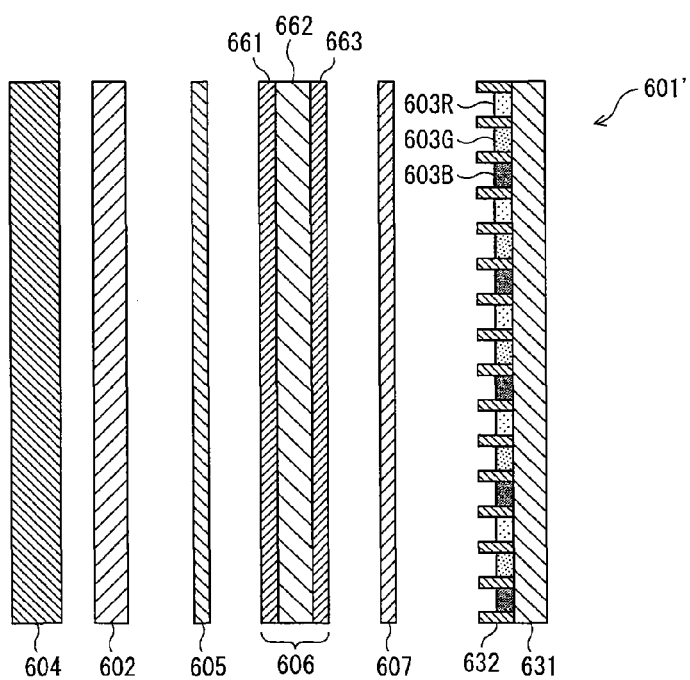
FIG. 17 is an exploded cross-sectional view schematically illustrating the substantial part of an image display apparatus as a second example of an application of the present invention.

FIG. 17 is an exploded cross-sectional view schematically illustrating the substantial part of an image display apparatus as a second example of an application of the present invention. In FIG. 17, a viewer observes an image displayed on the image display apparatus from the right side in the drawing. Here, the same reference numerals in FIG. 17 denote the same components as in FIG. 16.

As shown in FIG. 17, the image display apparatus 601' according to this embodiment has the same structure as that of the image display apparatus 601 according to the first embodiment, except that the intensity of the light emitted from the light source 602 is controlled by an optical shutter 606. That is, the image display apparatus 601' includes a light source 602, phosphor units (first phosphor units) 603R and phosphor units (second phosphor units) 603G each containing a phosphor which absorbs the light emitted from the light source 602 and emits visible light, and light-transmissive units 603B transmitting the light from the light source 602 to the front, and the image display apparatus 601' further includes a frame 604, a polarizer 605, an optical shutter 606, and a light analyzer 607.

Each component will be described below.

[V-2-2-1. Frame]

The frame 604 is the same as that described in the first embodiment.

[V-2-2-2. Light Source]

The light source 602 is the same as that described in the first embodiment.

In a flat-panel image display apparatus 601' having a light shutter 606 as in this embodiment, a light source 602 emitting uniform surface light, as well as the light source having the structure described in the first embodiment, is also useful. The light source 602 may be composed of one or more surface light-emitting elements or may be composed of one or more pseudo-surface light-emitting elements in which light is converted into surface light through an appropriate means such as light guiding, diffusion, or reflection. Alternatively, the light source 602 may be composed of these elements.

Examples of the light source 602 which can emit surface-light include inorganic intrinsic EL elements, organic EL elements, compact flat-surface fluorescent lamps, and surface-emitting LED containing inorganic semiconductors.

The pseudo-surface light-emitting element is, for example, composed of a certain light-emitting element and a light-converting mechanism for converting the light emitted from the certain light-emitting element into surface light. The light-emitting element used is the same as that described above as the light source 602. The light-converting mechanism may be a light-guiding plate such as a quartz plate, a glass plate, or an acrylic plate; a light-reflecting mechanism such as an aluminum sheet or a metal deposition film; or a light-diffusing mechanism such as a $TiO_2$ pattern, a light-diffusing sheet, or a light-diffusing prism. The light-converting mechanism is preferably a combination thereof. In particular, a light-converting mechanism in which the light source 602 is provided with a light-guiding plate, a reflection plate, and a diffusing plate to emit surface light is preferred in this embodiment. For example, a light-converting mechanism used in, for example, liquid crystal display apparatuses can be appropriately used.

The light source 602 may have any size, as in the first embodiment, but the thickness is usually 5 cm or less and preferably 5 mm or less, in view of practical use of the surface light-emitting element or pseudo-surface light-emitting element as the light source 602 of a flat-panel display.

In this embodiment, the light source 602 is a blue surface light-emitting element. This surface light from the light source 602 excites, for example, $CaAlSiN_3$:Eu and $Ca_3Sc_2Si_3O_{12}$:Ce contained in the phosphor units 603R and 603G, respectively. Part of the light emitted by the light source 602 is transmitted through the light-transmissive unit 603B and is perceived by a viewer as the light from the blue pixel. The light source 602 is supplied with electric power by an interconnected circuit or a wire electrically connecting terminals on the frame 604 to electrodes of the light source 602.

[V-2-2-3. Polarizer]

It is preferred to provide a polarizer 605 at the front of the light source 602 (the right side in the drawing), more specifically, between the light source 602 and the optical shutter 606. The polarizer 605 selectively transmits only a light component having a predetermined polarization plane out of the light emitted by the light source 602. In this embodiment, the polarizer 605 is disposed between the light source 602 and the optical shutter 606.

[V-2-2-4. Optical Shutter]

In this embodiment, the optical shutter 606 controls the amount of incident light and transmits the controlled light. More specifically, the optical shutter 606 controls the intensity of light irradiated on the back face of the shutter for each pixel according to an image to be displayed and transmits the controlled light toward the front. In this embodiment, the optical shutter 606 controls the intensity of light from the light source 602 to the phosphor units 603R and 603G and the light-transmissive unit 603B for each pixel and transmits the light toward the front.

More specifically, in a multicolor or full-color image display apparatus 601', two or more phosphors described above are separately disposed at predetermined places (i.e., the phosphor units 603R and 603G) defined as wavelength-converting mechanisms. In this embodiment, the optical shutter 606 controls the intensity of light incident on each of the phosphor units 603R and 603G and the light-transmissive unit 603B and thereby controls the light emitted from each of the phosphor units 603R and 603G and the light-transmissive unit 603B to display a desired multicolor image on the image display apparatus 601'.

Some types of the optical shutter 606 can control the intensity of only light in a specific wavelength range. Therefore, the optical shutter 606 used must control the intensity of the light emitted from the light source 602 over the entire wavelength range of the light so as to serve as an optical switch. Some image display apparatuses 601' have a structure in which the optical shutter 606 controls the intensity of the fluorescent light emitted by the phosphor units 603R and 603G other than that of the light emitted by the light source 602. Also, in such cases, the fluorescent optical shutter 606 used must control the intensity of the light emitted from each of the phosphor units 603R and 603G over the entire wavelength range of the fluorescent light so as to serve as an optical switch. In general, the emission peak wavelength of the light emitted by the light source 602 and the fluorescent light emitted by the phosphors in the phosphor units 603R and 603G is usually 380 nm or more and preferably 420 nm or more, and usually 780 nm or less and preferably 500 nm or less. An optical shutter 606 which can control the intensity of light in such a wavelength range is preferred.

The optical shutter 606 is generally composed of a set of pixels (picture elements). The number, size, and arrangement of these pixels depend on the size, type, and use, for example, of the display and are not limited to certain values. Therefore, the pixels of the optical shutter 606 may have any size within the range that does not significantly impair the effects of this application.

For example, in usual use of a display, the size of one pixel is preferably 500 μm by 500 μm or less. Preferably, a current liquid crystal display has, 640 by 3 by 480 color pixels each having a size of 100 μm by 300 μm.

The number and size of the optical shutter 606 are not limited within the ranges that do not significantly impair the effects of this application. For example, the useful thickness of the optical shutter 606 is usually 5 cm or less, and a thickness of 1 cm or less is preferred in view of reduction in thickness and weight.

In a flat image display apparatus 601', an optical shutter 606 which can change the light transmittance of a pixel to a certain value by electrical control is preferred for achieving grayscale display. An optical shutter 606 with a high absolute value of the light transmittance and high contrast and rapid response in the change of the transmittance is preferred.

Examples of the optical shutter 606 which satisfies these requirements include transmissive liquid crystal optical shutters such as thin film transistors (TFTs), super twisted nematic liquid crystals (STNS), ferroelectric or anti-ferroelectric liquid crystals, dichroic dye guest-hosts, and polymer dispersed network (PDN) systems; and electrochromic or chemical chromic materials such as tungsten oxide, iridium oxide, Prussian blue, viologen derivatives, tetrathiafulvalene (TTF)-polystyrene, rare earth metal-diphthalocyanine complexes, polythiophene, and polyaniline. In particular, liquid crystal optical shutters are preferred because they are thin and lightweight, consume low power, have practical durability, and can be segmented into high density. Furthermore, liquid crystal optical shutters driven by TFT active matrices or PDN systems are particularly preferred. In the active matrix including a twisted nematic liquid crystal, rapid response and cross talk do not occur and suitable for displaying moving images. The PDN system does not require the polarizer 605 and the light analyzer 607. Therefore, in such optical shutters, the attenuation of the light from the light source 602 or the phosphor units 603R and 603G is low, resulting in high brightness emission.

In general, the image display apparatus 601' is provided with a controller (not shown) for controlling the optical shutter 606 to control the light intensity for each pixel according to an image displayed by the image display apparatus 601'. The optical shutter 606 controls the intensity of visible light from each pixel according to the control by the controller, and thereby a desired image is displayed by the image display apparatus 601'.

In the image display apparatus 601' adjusting brightness of an image by the optical shutter 606, a simpler circuit can be used for the controller. For example, in an image display apparatus including an LED as the light source 602 and adjusting brightness of a pixel by controlling emission intensity of the LED as in the first embodiment, the current-brightness characteristics of the LED change with the lapse of time, and thereby a complicated circuit may be required for controlling an image to be displayed. In contrast, according to this embodiment, in an image display apparatus provided with an optical shutter 606 for controlling the intensity of the light emitted by the light source 602 and adjusting the brightness of a pixel by the optical shutter 606, the optical shutter is controlled by voltage in many case using the optical shutter such as a liquid crystal optical shutter, and thereby the circuit for controlling brightness can be simple.

In this embodiment, the optical shutter 606 is composed of a back electrode 661, a liquid crystal layer 662, and a front electrode 663 stacked in this order. The liquid crystal optical shutter is disposed in front (the right in the drawing) of the polarizer 605. The back electrode 661 and the front electrode 663 are transparent electrodes which do not absorb the light used in the image display apparatus 601'. In this liquid crystal light shutter, molecular arrangement of the liquid crystals in the liquid crystal layer 662 is controlled by a voltage applied between the back electrode 661 and the front electrode 663, and this molecular arrangement controls the intensity of light incident on the back face for each pixel (namely, for each of the phosphor units 603R and 603G and the light-transmissive unit 603B).

[V-2-2-5. Light Analyzer]

In front of the optical shutter 606, a light analyzer 607 may be optionally disposed. The light analyzer 607 receives the light having controlled intensity from the optical shutter 606 and transmits only light having a predetermined plane of polarization to control the emission light intensity.

Also in this embodiment, the light analyzer 607 is disposed in front of the optical shutter 606, specifically, between the optical shutter 606 and a set of the phosphor units 603R and 603G and the light-transmissive unit 603B.

[V-2-2-6. Phosphor Unit and Light-Transmissive Unit]

As in the first embodiment, the phosphor units 603R and 603G contain phosphors which absorb the light from the light source 602 and emit visible light for forming an image to be displayed by the image display apparatus 601'. In this embodiment, at least one of the phosphor units 603R and 603G contains a brightness-retaining phosphor. Usually, in the image display apparatus 601', one phosphor unit 603R and one phosphor unit 603G are disposed to each pixel of the optical shutter 606 and produce light to be emitted by the pixel of the display 601'.

Like the first embodiment, the light-transmissive unit 603B is also disposed for each pixel of the optical shutter 606 as in the phosphor units 603R and 603G. The light-transmissive unit 603B transmits the light from the light source 602 to the front as part of the light from the pixel. In general, the light-transmissive unit 603B is provided in a manner similar to that in the phosphor units 603R and 603G, except that phosphors are not contained.

Therefore, in this embodiment, a viewer recognizes an image by perceiving the fluorescent light emitted by the phosphor units 603R and 603G and the light emitted by the light source 602 through the light-transmissive unit 603B.

In an image display apparatus 601' including an optical shutter 606 as this embodiment, for example, the phosphor units 603R and 603G may be each formed on a transparent substrate 631 by arranging a mixture (coating liquid) of a binder, a phosphor, and a solvent into a mosaic, array, or stripe pattern at intervals corresponding to pixels of the optical shutter 606 by screen printing, other than the arrangement in the first embodiment.

For example, in a multicolor image display apparatus 601' including an optical shutter 606 as this embodiment, phosphors showing predetermined colors are arranged at positions that fit in with the pixel shape of the optical shutter mechanism in the light-emitting regions such as the phosphor units 603R and 603G.

Furthermore, also in this embodiment, the red phosphor unit 603R includes a brightness-retaining phosphor, $CaAlSiN_3$:Eu, as the red phosphor and a non-aromatic epoxy resin as the binder. A plurality of the red phosphor units 603R corresponding to the red pixels is disposed on the transparent substrate 631 as a dispersion of the red phosphor in the binder.

Furthermore, the green phosphor unit 603G in this embodiment contains a brightness-retaining phosphor, $Ca_3Sc_2Si_3O_{12}$:Ce, as the green phosphor and a non-aromatic epoxy resin as the binder. A plurality of the green phosphor units 603G corresponding to the green pixels is disposed on the transparent substrate 631 as a dispersion of the green phosphor in the binder.

In this embodiment, the light-transmissive unit 603B contains a non-aromatic epoxy resin as the binder and a diffusing agent. A plurality of the light-transmissive units 603B is disposed on the transparent substrate 631 as a dispersion of the diffusing agent in the binder so as to correspond to the blue pixels.

The transparent substrate 631 provided with the phosphor units 603R and 603G and the light-transmissive units 603B is disposed in front of the light analyzer 607 (in the right side in the drawing) so as to oppose the optical shutter 606. With this, the red phosphor unit 603R receives the light which is emitted from the light source 602 and which has an intensity controlled by the optical shutter 606, and emits red light. The green phosphor unit 603G receives the light which is emitted from the light source 602 and which has an intensity controlled by the optical shutter 606, and emits green light. The light-transmissive unit 603B diffuses the blue light which is emitted from the light source 602 and which has an intensity controlled by the optical shutter 606 with the diffusing agent, and transmits the light toward the front. The red phosphor units 603R, the green phosphor units 603G, and the light-transmissive units 603B are isolated by black matrix layers 632 disposed therebetween.

[V-2-2-7. Operation]

In the image display apparatus 601' having the above-described structure according to this embodiment, the light source 602 emits light with predetermined intensity in use. The plane of polarization of the light emitted by the light source 602 is aligned by a polarizer 605, and the polarized light is incident on the optical shutter 606.

The optical shutter 606 is controlled by a controller (not shown) to adjust intensity of the light incident on the back face for each pixel according to an image to be displayed and transmits the light with the adjusted intensity toward the front. Specifically, the orientation of liquid crystals at the respective positions corresponding to pixels is adjusted by controlling a voltage applied between the transparent electrodes 661 and 663, and thereby, the light intensity is controlled for each pixel. The light incident on the back face of the optical shutter 606 is transmitted toward the front with the controlled intensity.

The light passing through the optical shutter 606 is incident on the light analyzer 607 and then incident on the corresponding phosphor units 603R and 603G and the light-transmissive unit 603B.

In the red phosphor unit 603R, the red phosphor ($CaAlSiN_3$:Eu) dispersed in the red phosphor unit 603R absorbs the incident light and emits red fluorescent light. In the green phosphor unit 603G, the green phosphor ($Ca_3Sc_2Si_3O_{12}$:Ce) dispersed in the green phosphor unit 603G absorbs the incident light and emits green fluorescent light. In the light-transmissive unit 603B, the diffusing agent dispersed in the light-transmissive unit 603B scatters the incident light and transmits the blue incident light toward the front while making the light distribution characteristics coincide with those of the fluorescent light emitted from the phosphor units 603R and 603G.

In this occasion, the intensity of the incident light is controlled by the optical shutter 606 for each pixel according to an image to be formed, and thereby the intensity of fluorescent light (visible light) emitted by each of the phosphor units 603R and 603G is also adjusted for each pixel. Therefore, a desired image can be formed.

The thus generated red and green fluorescent light and the blue light emitted by the light source 602 and transmitted through the light-transmissive unit 603B are emitted to the outside (the right side in the drawing) of the image display apparatus 601' through the transparent substrate 631. A viewer recognizes the image by perceiving the light from the surface of the transparent substrate 631.

The image display apparatus 601' includes the brightness-retaining phosphors, $CaAlSiN_3$:Eu and $Ca_3Sc_2Si_3O_{12}$:Ce, as the phosphors of the phosphor units 603R and 603G and thereby can reduce temperature dependency of the emission brightness of the image display apparatus 601'. Consequently, a color shift from the desired color of an image to be displayed due to temperature conditions can be prevented. Thus, it is very useful in practical application.

In the image display apparatus 601' according to this embodiment, unlike conventional image display apparatuses including liquid crystal light shutters, a decrease in brightness or a change in color depending on the view angle can be prevented.

V-2-3. Third Embodiment

[V-2-3-1. Structure]

Figure 18:
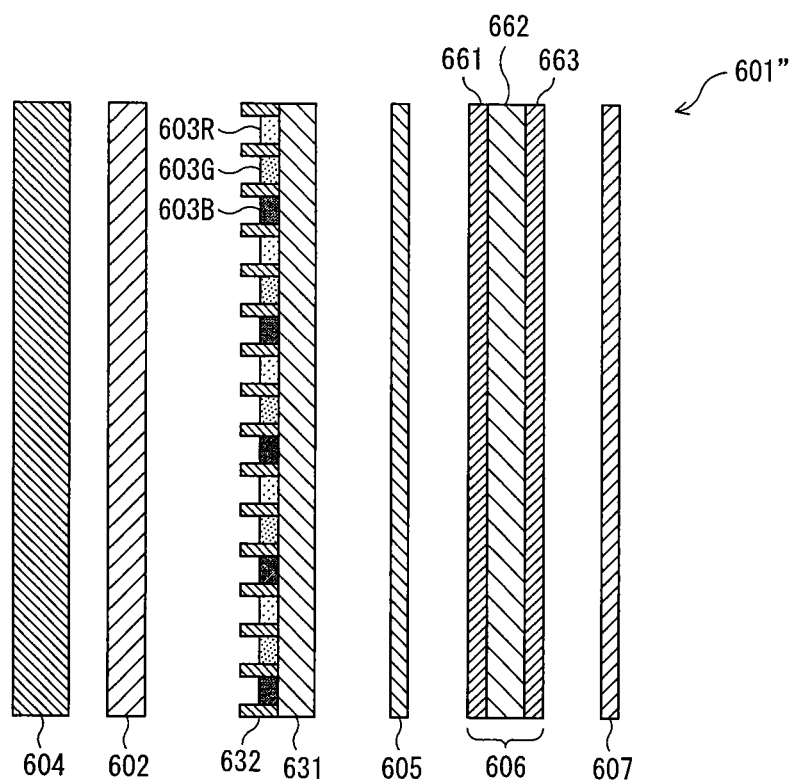
FIG. 18 is an exploded cross-sectional view schematically illustrating the substantial part of an image display apparatus as a third embodiment of an application of the present invention.

FIG. 18 is an exploded cross-sectional view schematically illustrating the substantial part of an image display apparatus as a third embodiment of an application of the present invention. In the image display apparatus shown in FIG. 18, a viewer can observe an image displayed on the image display apparatus from the right side in the drawing. Here, the same reference numerals in FIG. 18 denote the same components as in FIGS. 16 and 17.

As shown in FIG. 18, the image display apparatus 601" according to this embodiment includes a substrate 604, a light source 602, phosphor units 603R and 603G and light-transmissive units 603B, a polarizer 605, an optical shutter 606, and a light analyzer 607, in this order from the back face side, and has a similar structure to that of the image display apparatus 601' described in the second embodiment, except that a black matrix (not shown) is provided between pixels of the optical shutter 606.

It is preferred that the black matrix, i.e., a black region, is provided between the pixels of the optical shutter 606 for enhancing contrast. The black matrix blackens the gaps between the pixels to improve visibility of an image. The black matrix may be made of any material such as a resin containing dispersed chrome, carbon, or other black material, but is not limited thereto. In this embodiment, the optical shutter 606 is provided with this black matrix (not shown), and a viewer perceives the light transmitted through the optical shutter 606.

In the image display apparatus 601" according to this embodiment, the components are disposed in the above-mentioned order. Thereby, the optical shutter 606 adjusts the intensity of the light emitted by the phosphor units 603R and 603G and the intensity of the light transmitted through the light-transmissive unit 603B for each pixel, and transmits the light toward the front. In other words, in the red and green pixels, the light emitted by the light source 602 is incident on the phosphor units 603R and 603G; the optical shutter 606 controls the intensity of the light emitted by the phosphors in the phosphor units 603R and 603G for each pixel; and the light with controlled intensity is emitted from the optical shutter 606 toward the front. In the blue pixels, the light emitted by the light source 602 is scattered by the diffusing agent in the light-transmissive unit 603B and is transmitted through the light-transmissive unit 603B; and the optical shutter 606 controls the intensity of the light transmitted through the light-transmissive unit 603B for each pixel and emits the light toward the front. Consequently, a desired multicolor image can be displayed on the image display apparatus 601 by the red, green, and blue light having the intensity controlled by the optical shutter 606 for each pixel.

In the second embodiment, the optical shutter 606 can control the intensity of the light emitted by the light source 602 over the entire wavelength range of the light. In this embodiment, the optical shutter 606 used must also control the intensity of the light emitted from phosphor units 603R and 603G over the entire wavelength range of the light. Specifically, the optical shutter 606 in this embodiment, the molecular arrangement of liquid crystals in the liquid crystal layer 662 is controlled by a voltage applied between the back electrode 661 and the front electrode 663, and this molecular arrangement controls the intensity of the light incident on the back face for each pixel.

In this embodiment, like in the second embodiment, the red phosphor unit 603R includes $CaAlSiN_3$:Eu as the red phosphor and a non-aromatic epoxy resin as the binder, and the green phosphor unit 603G includes $Ca_3Sc_2Si_3O_{12}$:Ce as the green phosphor and a non-aromatic epoxy resin as the binder.

[V-2-3-2. Operation]

In the image display apparatus 601" having the above-described structure according to this embodiment, the light source 602 emits light with predetermined intensity in use. The light emitted by the light source 602 is incident on the corresponding phosphor units 603R and 603G and the light-transmissive unit 603B.

In the red phosphor unit 603R, the red phosphor ($CaAlSiN_3$:Eu) dispersed in the red phosphor unit 603R absorbs incident light and emits red fluorescent light. In the green phosphor unit 603G, the green phosphor ($Ca_3Sc_2Si_3O_{12}$:Ce) dispersed in the green phosphor unit 603G absorbs incident light and emits green fluorescent light. In the light-transmissive unit 603B, the diffusing agent dispersed in the light-transmissive unit 603B scatters incident light and transmits the blue incident light toward the front while making the light distribution characteristics coincide with those of the fluorescent light emitted from the phosphor units 603R and 603G.

The polarization character of thus emitted red and green fluorescent light and the blue light are aligned by the polarizer 605 and the light are incident on the optical shutter 606.

The optical shutter 606 adjusts the intensity of the red, green, and blue incident light on the back face depending on the controlling by a controller (not shown) for each pixel according to an image to be formed, and transmits the light toward the front. Specifically, the orientation of liquid crystals at the respective positions corresponding to each pixel is adjusted by controlling a voltage applied between the transparent electrodes 661 and 663, and thereby, the light intensity is controlled for each pixel. The light incident on the back face of the optical shutter 606 is transmitted toward the front with the controlled intensity.

The light passing through the optical shutter 606 is incident on the light analyzer 607. On this occasion, the intensity of the light emitted by the phosphor units 603R and 603G and the light transmitted through the light-transmissive unit 603B is adjusted by the optical shutter 606 for each pixel. Thereby, the light incident on the light analyzer 607 can form a desired image. A viewer recognizes the image by perceiving the light emitted from the surface of the light analyzer 607.

The image display apparatus 601" includes brightness-retaining phosphors, $CaAlSiN_3$:Eu and $Ca_3Sc_2Si_3O_{12}$:Ce, as the phosphors of the phosphor units 603R and 603G respectively and thereby can reduce temperature dependency of the emission brightness. Consequently, a color shift from the desired color of an image to be displayed due to temperature conditions can be prevented. Thus, it is very useful in practical application.

In the image display apparatus 601" according to this embodiment, unlike conventional image display apparatuses including liquid crystal light shutters, the effects of afterglow characteristics of the phosphors in the phosphor units 603R and 603G can be excluded. Some phosphors show fluorescence for a certain time after the termination of irradiation with light. This time showing fluorescence after the termination of light irradiation is defined as afterglow characteristics. The afterglow characteristics differ in each phosphor. Thereby, there is a tendency that certain colors are enhanced in images displayed by conventional image display apparatuses, resulting in increases in cost and complication. However, in the image display apparatus 601" according to this embodiment, the effects of afterglow characteristics can be excluded to prevent the enhancement in a certain color in an image.

Furthermore, like the second embodiment, the controlling circuit for the controller can be simplified.

V-3. Others

The embodiments of this application are described above, but this application is not limited to the above-described embodiments and can be modified within the scope of this application.

In the above-described embodiments, for example, images are displayed using light of three colors, red, green, and blue. However, images may be displayed using light with a color other than red, green, and blue, with two colors, or with four or more colors.

For example, the light emitted by the light source 602 may be directly used as light that some of the pixels emit.

In addition to the structure in which light is transmitted through the phosphor units 603R and 603G, a reflective structure may be employed in which the light from the light source 602 is reflected at the phosphor units 603R and 603G. Specifically, an image display apparatus 601 in the first embodiment can have a structure in which the light source 602 is disposed at the anterior of the phosphor units 603R and 603G.

Furthermore, phosphor units not containing brightness-retaining phosphors such as $CaAlSiN_3$:Eu and $Ca_3Sc_2Si_3O_{12}$:Ce may be used with phosphor units containing the brightness-retaining phosphors.

In addition, brightness-retaining phosphors other than $CaAlSiN_3$:Eu and $Ca_3Sc_2Si_3O_{12}$:Ce may be used.

The components such as the light source 602, the phosphor units 603R and 603G, the frame 604, the polarizer 605, the optical shutter 606, and the light analyzer 607 may be used in any combination thereof within the scope of this application.

Furthermore, the image display apparatuses 601, 601', and 601" may further include other components in addition to those components.

The above-described first light-emitting device, second light-emitting device, white-light emitting device, and image display device may be used in any combination thereof.

The first light-emitting device, second light-emitting device, white-light emitting device, and image display device may each contain phosphors shown below as wavelength-converting materials in the range that do not impair the effects thereof.

Specifically, the materials shown below can be used as the phosphors, but they are merely examples and the present invention is not limited thereto. The examples below are shown in a simplified form for phosphors having structures which are partially different from each other. For example, "$Y_2SiO_5$:Ce$^{3+}$", "$Y_2SiO_5$:Tb$^{3+}$", and "$Y_2SiO_5$:Ce$^{3+}$,Tb$^{3+}$" are collectively shown as "$Y_2SiO_5$:Ce$^{3+}$,Tb$^{3+}$"; and "$La_2O_2S$:Eu", "$Y_2O_2S$:Eu", and "$(La,Y)_2O_2S$:Eu" are collectively shown as "$(La,Y)_2O_2S$:Eu". Abbreviated parts are each marked with a comma ",".

Red Phosphor:

Examples of the red phosphor include europium-activated alkaline-earth silicon nitride phosphors represented by $(Mg,Ca,Sr,Ba)_2Si_5N_8$:Eu and are composed of fractured grains with fractured red cross-sections and emit light in the red region; and europium-activated rare-earth oxychalcogenide phosphors represented by $(Y,La,Gd,Lu)_2O_2S$:Eu and are composed of substantially spherical growth grains of regular crystal growth and emit light in the red region.

In addition, phosphors containing an oxynitride and/or an oxysulfide which contain at least one element selected from the group consisting of Ti, Zr, Hf, Nb, Ta, W, and Mo, and phosphors containing the oxynitride having an α-sialon structure in which a part of or all Al elements, disclosed in Japanese Unexamined Patent Application Publication No. 2004-300247, are replaced with Ga element can be used in this embodiment. These phosphors each contain an oxynitride and/or an oxysulfide.

Other examples of the red phosphor include Eu-activated oxysulfide phosphors such as $(La,Y)_2O_2S$:Eu; Eu-activated oxide phosphors such as $Y(V,P)O_4$:Eu and $Y_2O_3$:Eu; Eu, Mn-activated silicate phosphors such as $(Ba,Sr,Ca,Mg)_2SiO_4$:Eu, Mn and $(Ba,Mg)_2SiO_4$:Eu,Mn; Eu-activated sulfide phosphors such as $(Ca,Sr)S$:Eu; Eu-activated aluminate phosphors such as $YAlO_3$:Eu; Eu-activated silicate phosphors such as $LiY_9(SiO_4)_6O_2$:Eu, $Ca_2Y_8(SiO_4)_6O_2$:Eu, $(Sr,Ba,Ca)_3SiO_5$:Eu, and $Sr_2BaSiO_5$:Eu; Ce-activated aluminate phosphors such as $(Y,Gd)_3Al_6O_{12}$:Ce and $(Tb,Gd)_3Al_6O_{12}$:Ce; Eu-activated nitride phosphors such as $(Ca,Sr,Ba)_2Si_6N_8$:Eu, $(Mg,Ca,Sr,Ba)SiN_2$:Eu, and $(Mg,Ca,Sr,Ba)AlSiN_3$:Eu; Ce-activated nitride phosphors such as $(Mg,Ca,Sr,Ba)ASiN_3$:Ce; Eu,Mn-activated halophosphate phosphors such as $(Sr,Ca,Ba,Mg)_{10}(PO_4)_6Cl_2$:Eu,Mn; Eu,Mn-activated silicate phosphors such as $(Ba_3Mg)Si_2O_8$:Eu,Mn and $(Ba,Sr,Ca,Mg)_3(Zn,Mg)Si_2O_8$:Eu,Mn; Mn-activated germanate phosphors such as $3.5MgO \cdot 0.5MgF_2 \cdot GeO_2$:Mn; Eu-activated oxynitride phosphors such as Eu-activated α-sialon; Eu,Bi-activated oxide phosphors such as $(Gd,Y,Lu,La)_2O_3$:Eu,Bi; Eu,Bi-activated oxysulfide phosphors such as $(Gd,Y,Lu,La)_2O_2S$:Eu,Bi; Eu,Bi-activated vanadate phosphors such as $(Gd,Y,Lu,La)VO_4$:Eu,Bi; Eu, Ce-activated sulfide phosphors such as $SrY_2S_4$:Eu, Ce; Ce-activated sulfide phosphors such as $CaLa_2S_4$:Ce; Eu,Mn-activated phosphate phosphors such as $(Ba,Sr,Ca)MgP_2O_7$:Eu,Mn and $(Sr,Ca,Ba,Mg,Zn)_2P_2O_7$:Eu,Mn; Eu,Mo-activated tungstate phosphors such as $(Y,Lu)_2WO_6$:Eu,Mo; Eu, Ce-activated nitride phosphors such as $(Ba,Sr,Ca)_xSi_yN_z$:Eu, Ce (wherein x, y, and z are each an integer of 1 or more); Eu,Mn-activated halophosphate phosphors such as $(Ca,Sr,Ba,Mg)_{10}(PO_4)_6(F,Cl,Br,OH)$:Eu,Mn; and Ce-activated silicate phosphors such as $((Y,Lu,Gd,Tb)_{1-x}Sc_xCe_y)_2(Ca,Mg)_{1-r}(Mg, Zn)_{2+r}Si_{z-q}Ge_qO_{12+\delta}$.

Further examples of the red phosphors include red organic phosphors containing rare-earth ion complexes having anions as ligands, such as β-diketonate, β-diketone, aromatic carboxylic acids, and Bronsted acids; perylene pigments (for example, dibenzo{[f,f']-4,4',7,7'-tetraphenyl}diindeno[1,2,3-cd:1',2',3'-lm]perylene); anthraquinone pigments, lake pigments; azo pigments; quinacridone pigments; anthracene pigments; isoindoline pigments; isoindolinone pigments; phthalocyanine pigments; triphenylmethane basic pigments; indanthrone pigments; indophenol pigments; cyanine pigments; and dioxadine pigments.

Green Phosphor:

Examples of the green phosphor include europium-activated alkaline-earth silicon oxynitride phosphors represented by $(Mg,Ca,Sr,Ba)Si_2O_2N_2$:Eu and are composed of fractured grains with fractured cross-sections and emit light in the green region; and europium-activated alkaline-earth silicate phosphors represented by $(Ba,Ca,Sr,Mg)_2SiO_4$:Eu and are fractured grains with fractured cross-sections and emit light in the green region.

Other examples of the green phosphor include Eu-activated aluminate phosphors such as $Sr_4Al_{14}O_{25}$:Eu and $(Ba,Sr,Ca)Al_2O_4$:Eu; Eu-activated silicate phosphors such as $(Sr,Ba)Al_2Si_2O_8$:Eu, $(Ba,Mg)_2SiO_4$:Eu, $(Ba,Sr, Ca,Mg)_2SiO_4$:Eu, and $(Ba,Sr,Ca)_2(Mg,Zn)Si_2O_7$:Eu; Ce, Tb-activated silicate phosphors such as $Y_2SiO_5$:Ce,Tb; Eu-activated boric acid-phosphate phosphors such as $Sr_2P_2O_7$—$Sr_2B_2O_5$:Eu; Eu-activated halosilicate phosphors such as $Sr_2Si_3O_8 \cdot 2SrCl_2$:Eu; Mn-activated silicate phosphors such as $Zn_2SiO_4$:Mn; Tb-activated aluminate phosphors such as $CeMgAl_{11}O_{19}$:Tb and $Y_3Al_5O_{12}$:Tb; Tb-activated silicate phosphors such as $Ca_2Y_8(SiO_4)_6O_2$:Tb and $La_3Ga_5SiO_{14}$:Tb; Eu,Tb,Sm-activated thiogallate phosphors such as $(Sr,Ba,Ca)Ga_2S_4$:Eu,Tb,Sm; Ce-activated aluminate phosphors such as $Y_3(Al,Ga)_5O_{12}$:Ce and $(Y,Ga,Tb,La,Sm,Pr,Lu)_3(Al,Ga)_5O_{12}$:Ce; Ce-activated silicate phosphors such as $Ca_3Sc_2Si_3O_{12}$:Ce and $Ca_3(Sc,Mg,Na,Li)_2Si_3O_{12}$:C; Ce-activated oxide phosphors such as $CaSc_2O_4$:Ce; Eu-activated oxynitride phosphors such as $SrSi_2O_2N_2$:Eu, $(Sr,Ba,Ca)Si_2O_2N_2$:Eu, Eu-activated βsialon, and Eu-activated α-sialon; Eu,Mn-activated aluminate phosphors such as $BaMgAl_{10}O_{17}$:Eu,Mn; Eu-activated aluminate phosphors such as $SrAl_2O_4$:Eu; Tb-activated oxysulfide phosphors such as $(La,Gd,Y)_2O_2S$:Tb; Ce,Tb-activated phosphate phosphors such as $LaPO_4$:Ce,Tb; sulfide phosphors such as ZnS:Cu,Al and ZnS:Cu,Au,Al; Ce,Tb-activated borate phosphors such as $(Y,Ga,Lu,Sc,La)BO_3$:Ce,Tb, $Na_2Gd_2B_2O_7$:Ce,Tb, and $(Ba,Sr)_2(Ca,Mg,Zn)B_2O_6$:K,Ce,Tb; Eu,Mn-activated halosilicate phosphors such as $Ca_8Mg(SiO_4)_4Cl_2$:Eu,Mn; Eu-activated thioaluminate phosphors such as $(Sr,Ca,Ba)(Al,Ga,In)_2S_4$:Eu; and Eu,Mn-activated halosilicate phosphors such as $(Ca,Sr)_8(Mg/Zn)(SiO_4)_4Cl_2$:Eu, Mn.

Further examples of the usable green phosphors include fluorescent dyes such as condensed derivatives of pyridine and phthalimide, benzoxazinones, quinazolinones, coumarins, quinophthalones, and naphthalic acid imides; and organic fluorescent phosphors such as terbium complexes.

Blue Phosphor:

Examples of the blue phosphor include europium-activated barium-magnesium-aluminate phosphors represented by $BaMgAl_{10}O_{17}$:Eu and are composed of substantially hexagonal growth grains of regular crystal growth and emit blue light; europium-activated calcium halophosphate phosphors represented by $(Ca,Sr,Ba)_5(PO_4)_3Cl$:Eu and are composed of substantially spherical growth grains of regular crystal growth and emit light in the blue region; europium-activated alkaline-earth chloroborate phosphors represented by $(Ca,Sr,Ba)_2B_5O_9Cl$:Eu and are composed of substantially cubic growth grains of regular crystal growth and emit light in the blue region; and europium-activated alkaline-earth aluminate phosphors represented by $(Sr,Ca,Ba)Al_2O_4$:Eu or $(Sr,Ca,Ba)_4Al_{14}O_{25}$:Eu and are composed of fractured grains with fractured cross-sections and emit blue-green light in the blue-green region.

Other examples of the blue phosphor include Sn-activated phosphate phosphors such as $Sr_2P_2O_7$:Sn; Eu-activated aluminate phosphors such as $Sr_4Al_{14}O_{25}$:Eu, $BaMgAl_{10}O_{17}$:Eu, and $BaAl_8O_{13}$:Eu; Ce-activated thiogallate phosphors such as $SrGa_2S_4$:Ce and $CaGa_2S_4$:Ce; Eu-activated aluminate phosphors such as $(Ba,Sr,Ca)MgAl_{10}O_{17}$:Eu and $BaMgAl_{10}O_{17}$:Eu,Tb,Sm; Eu,Mn-activated aluminate phosphors such as $(Ba,Sr,Ca)MgAl_{10}O_{17}$:Eu,Mn; Eu-activated halophosphate phosphors such as $(Sr,Ca,Ba,Mg)_{10}(PO_4)_6Cl_2$:Eu and $(Ba,Sr,Ca)_5(PO_4)_3(Cl,F,Br,OH)$:Eu,Mn,Sb; Eu-activated silicate phosphors such as $BaAl_2Si_2O_8$:Eu and $(Sr,Ba)_2MgSi_2O_8$:Eu; Eu-activated phosphate phosphors such as $Sr_2P_2O_7$:Eu; sulfide phosphors such as ZnS:Ag and ZnS:Ag,Al; Ce-activated silicate phosphors such as $Y_2SiO_5$:Ce; tungstate phosphors such as $CaWO_4$; Eu,Mn-activated boric acid-phosphate phosphors such as $(Ba,Sr,Ca)BPO_5$:Eu,Mn, $(Sr,Ca)_{10}(PO_4)_6 \cdot nB_2O_2$:Eu, and $2SrO \cdot 0.84P_2O_5 \cdot 0.16B_2O_3$:Eu; and Eu-activated halosilicate phosphors such as $Sr_2Si_2O_8 \cdot 2SrCl_2$:Eu.

Further examples of the blue phosphors include fluorescent dyes such as naphthalic acid imides, benzoxazoles, styryls, coumarins, pyralizones, and triazoles; and organic phosphors such as thulium complexes.

These phosphors may be used alone or in any combination of two or more at any proportion.

EXAMPLES

The present invention will now be described in detail with reference to examples, but is not limited to the following examples and can be modified within the scope of the present invention.

I. Example of First Light-Emitting Device

Example 1-1

A phosphor mixture containing 94% by weight of a first phosphor and 6% by weight of a second phosphor was prepared. The first phosphor was an oxide phosphor exhibiting an emission efficiency of 46% by excitation with light having a wavelength of 455 nm, having a chemical composition of $Ca_3Sc_2Si_3O_{12}$, containing 0.06 mole of Ce (0.02 mole on the basis of 1 mole of Ca in the chemical composition) as a activator, and having an emission peak wavelength at 505 nm. The second phosphor was a nitride phosphor exhibiting an emission efficiency of 54% by excitation with light having a wavelength of 455 nm, containing 0.008 mole of Eu as a activator, having a chemical composition of $CaAlSiN_3$, and having an emission peak wavelength at 650 nm.

Figure 19:
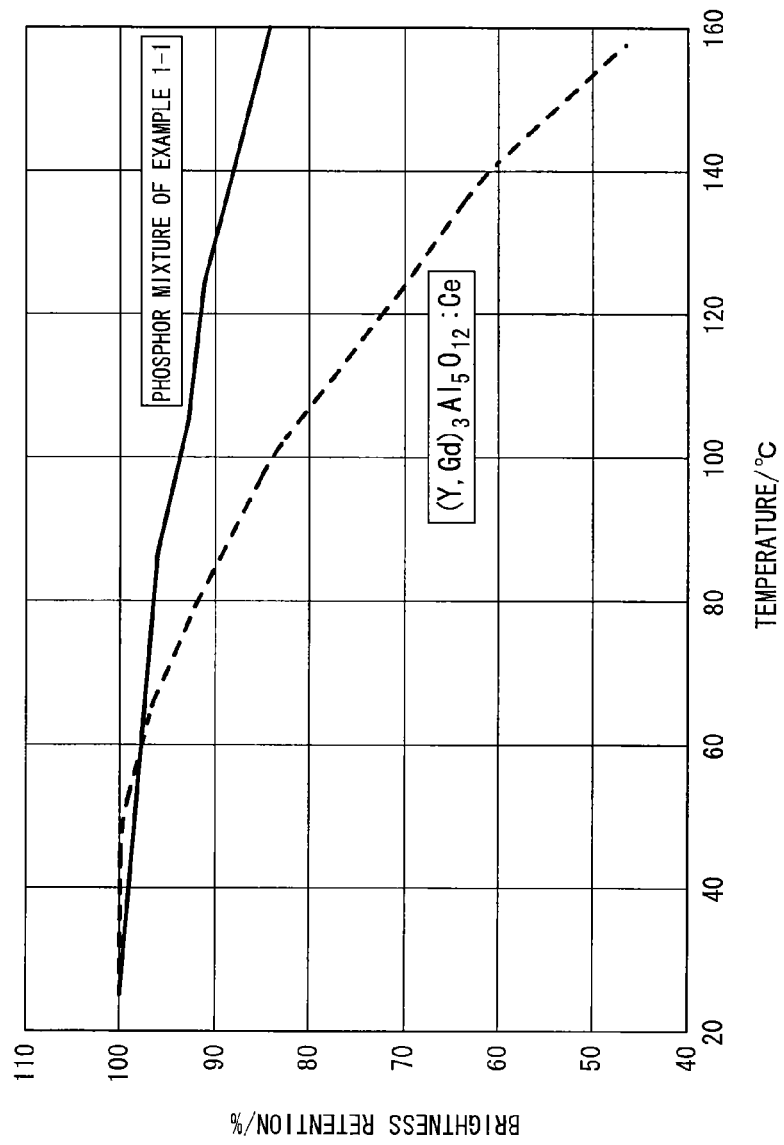
FIG. 19 is a graph showing temperature dependencies of fluorescence brightness of a phosphor mixture in Example 1-1 and an yttrium-aluminum-garnet phosphor, $(Y,Gd)_3Al_5O_{12}:Ce$, which is incorporated in a conventional pseudo-white-light emitting device. In the graph, the solid line represents the results of the phosphor mixture of Example 1-1 and the dotted line represents the results of the yttrium-aluminum-garnet phosphor.

The brightness and the color coordinate x of this phosphor mixture were measured by exciting the mixture with blue light having a peak wavelength of 455 nm while stepwise heating the mixture up to 160° C. so as to maintain the temperature at certain temperatures. FIG. 19 shows the results of the brightness observed. The brightness [BR(125)] at 125° C. was 0.92 provided that the brightness [BR(25)] at 25° C. was 1, and the ratio of the brightness [BR(125)/BR(25)] was 0.92. The color coordinate [$x_2(25)$] at 25° C. was 0.404, the color coordinate [$x_2(25)$] at 125° C. was 0.418, and the difference in the color coordinate [$x_2(25)-x_2(25)$] was 0.014. The brightness and the color coordinate were calculated using only fluorescence spectrum of the phosphor mixture at 470 nm or more without using fluorescence spectrum at less than 470 nm for avoiding the interference with the excitation light of wavelength of 455 nm.

A shell-type white-light emitting device was produced by the following process. First, an LED ("C460MB" manufactured by Cree Inc.) emitting light at 460 nm wavelength was mounted on a concave of a frame with an electrically conductive silver paste as a mounting material. Then, electrodes of the LED and inner leads were bonded with Au wire. The phosphor mixture was thoroughly mixed with an epoxy resin at a ratio of one gram of the phosphor mixture to ten grams of the epoxy resin. The resulting mixture of the phosphor and the resin (hereinafter referred to as phosphor paste) was poured into the concave of the frame provided with the LED and was then maintained at 120° C. for 1 hr for curing the epoxy resin. Then, the thus obtained frame provided with the LED and the phosphor was put into a shell-type mold filled with an epoxy resin and maintained at 120° C. for 1 hr. After the curing of the resin, the product was removed from the mold to obtain a shell-type white-light emitting device.

The white-light emitting device was driven by a current of 10 to 40 mA in the current density range of 17.5 A/cm$^2$ to 70 A/cm$^2$ at a room temperature (about 24° C.). The entire light emitted by the white-light emitting device was collected by an integrating sphere and was guided to a spectrometer through an optical fiber for measuring its emission spectrum. Emission spectral data was obtained by measuring emission intensity at every 5 nm from 380 to 780 nm. The color coordinates x and y, respectively, of this white-light emitting device were 0.288 and 0.308 at a driving current of 10 mA, and were 0.291 and 0.309 at a driving current of 40 mA. This means that the shift in the color coordinates [$x_1(17.5)-x_1(70)$] and [$y_1(17.5)-y_1(70)$] were 0.003 and 0.001, respectively, when the blue LED-driving current was changed in the range of 10 to 40 mA, namely, when the current density was changed in the range of 17.5 A/cm$^2$ to 70 A/cm$^2$. Thus, the shifts were very small. That is, the color shift for a change in intensity of emitted light due to a variation in driving current was very small.

This white-light emitting device was evaluated for the general color rendering index Ra according to JIS Z 8726. The index Ra was 90 to confirm a good color rendering. Thus, the general color rendering index was significantly high compared to that of a conventional pseudo-white-light emitting device containing a blue LED and an yttrium-aluminum-garnet phosphor, and the light emission was satisfactory.

In order to evaluate the first light-emitting device according to the present invention by comparison, the conventional pseudo-white-light emitting device containing a blue LED and an yttrium-aluminum-garnet phosphor was devoted to measure the emission intensity in order to determine color coordinates. The color coordinates x and y, respectively, of the pseudo-white-light emitting device were 0.321 and 0.314 at a driving current of 10 mA, and were 0.314 and 0.306 at a driving current of 40 mA. Thus, the shifts in the color coordinates $[x_1(17.5)-x_1(70)]$ and $[y_1(17.5)-y_1(70)]$ were $-0.007$ and $-0.008$, respectively, when the blue LED-driving current was changed in the range of 10 mA to 40 mA, namely, when the current density was changed in the range of 17.5 A/cm$^2$ to 70 A/cm$^2$. Thus, the shifts were large. That is, the color shift for a change in intensity of emission light due to a variation in driving current was very large compared to that of the first light-emitting device of the present invention.

The brightness and the color coordinate x of the yttrium-aluminum-garnet phosphor were measured by exciting the phosphor with blue light having a peak wavelength of 455 nm while heating the phosphor up to 160° C. FIG. 19 shows the results of the brightness observed. The brightness [BR(125)] at 125° C. was 0.68 provided that the brightness [BR(25)] at 25° C. was 1, and the ratio of the brightness [BR(125)/BR(25)] was 0.68 to show high temperature quenching. This high temperature quenching of the yttrium-aluminum-garnet phosphor is one factor of a large color shift for a change in the emission intensity due to a variation in the driving current of the conventional white-light emitting device. In addition, the general color rendering index Ra of this conventional device was as low as 79.

These results show that an image display apparatus having less color shift for a change in intensity of emission light due to a variation in driving current and having stable color reproducibility or a lighting system having high color rendering and having less color shift for changes in intensity of emission light and in environmental temperature, compared to those of conventional products, can be obtained by using the first light-emitting device of the present invention.

II. Example of Second Light-Emitting Device

The second light-emitting device of the present invention will now be described in detail with reference to examples and a comparative example.

Light-emitting devices, each having a similar structure to that of the light-emitting device according to the first embodiment of the second light-emitting device, were produced and subjected to evaluation of emission efficiency and color rendering, as described below. In the following examples and comparative example, components corresponding to those in FIG. 3 are indicated by the same reference numerals written in parentheses.

Example 2-1

A frame (102) having a cup-shaped concave (102A) was prepared. On the bottom of the concave (102A), a blue LED (103), as a light source, emitting light with a wavelength of 450 nm 470 nm was dye-bonded using a silver paste (105) as an adhesive which was thinly and uniformly applied in view of dissipating heat generated in the blue LED (103). The silver paste was cured by heating at 150° C. for 2 hr. Then, the blue LED (103) and electrodes of the frame (102) were wire-bonded with a wire (106) having a diameter of 25 μm.

The blue LED (103) used was "ES-CEBL912" manufactured by EPISTAR Corp.

The light-emitting material of a fluorescent unit (104) was a mixture of a phosphor represented by $Ca_{2.94}Ce_{0.06}Sc_{1.94}Mg_{0.06}Si_3O_{12}$ (phosphor A) emitting light with a wavelength of about 470 nm to 690 nm and a phosphor represented by $Sr_{0.8}Ca_{0.192}Eu_{0.008}AlSiN_3$ (phosphor B) emitting light with a wavelength of about 520 nm to 760 nm.

The ratio (weight ratio) between the phosphors A and B in the phosphor mixture of the fluorescent unit (104) was 90:10. Then, a phosphor slurry containing the phosphor mixture and an epoxy resin at a weight ratio of 25:75 was prepared.

This phosphor slurry was poured into the concave (102A) of the frame (102) and was cured by heating.

Then, the entire frame was molded with an epoxy resin using a cup-shaped mold.

The blue LED (103) was supplied with electric power, so that the light-emitting device (101) emitted light (driving current: 20 mA, driving current density: 17.5 A/cm$^2$, temperature: 20° C.). The emission spectrum of the light emitted from the light-emitting device (101) was measured using an integrating sphere to determine the entire luminous flux, chromaticity, color rendering, and a change in chromaticity when the driving current and driving current density of the blue LED (103) were respectively raised to 80 mA and 70 A/cm$^2$. Table 1 shows the results. The color rendering were evaluated using special color rendering indices $R_1$ to $R_{15}$ calculated according to JIS Z 8726 and an average value Ra of indices $R_1$ to $R_8$.

In Table 1, chromaticity (x/y) is expressed as color coordinates.

TABLE 1

| Entire luminous flux | 2.4 lm |
|---|---|
| Emission efficiency | 34 lm/W |
| x | 0.301 |
| y | 0.312 |
| Ra | 88 |
| $R_1$ | 94 |
| $R_2$ | 94 |
| $R_3$ | 90 |
| $R_4$ | 79 |
| $R_5$ | 88 |
| $R_6$ | 91 |
| $R_7$ | 83 |
| $R_8$ | 82 |
| $R_9$ | 76 |
| $R_{10}$ | 89 |
| $R_{11}$ | 83 |
| $R_{12}$ | 63 |
| $R_{13}$ | 97 |
| $R_{14}$ | 95 |
| $R_{15}$ | 90 |
| Chromaticity shift | |
| $x_1(17.5)-x_1(70)$ | 0.004 |
| $y_1(17.5)-y_1(70)$ | 0.005 |

Figure 20:
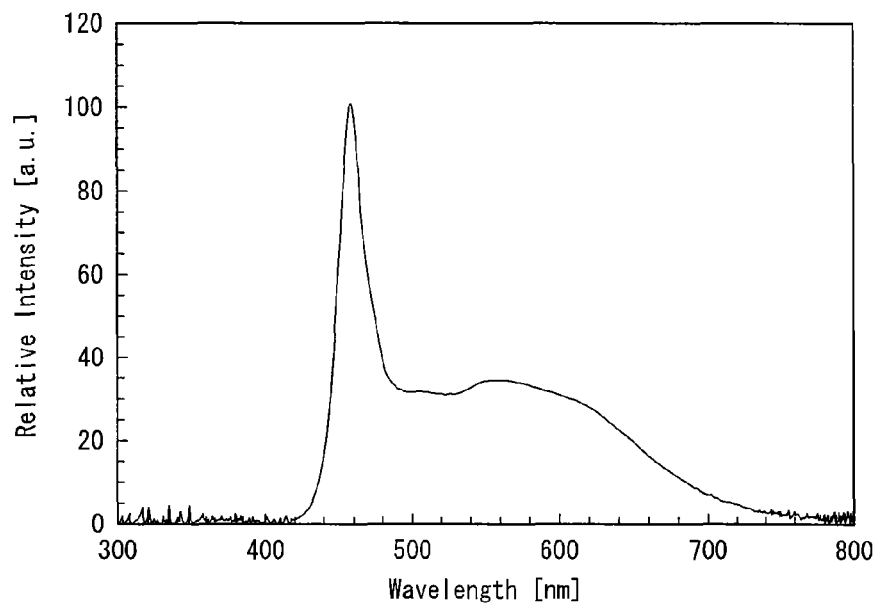
FIG. 20 is a graph showing the emission spectrum of a light-emitting device in Example 2-1.

FIG. 20 is an emission spectrum of this light-emitting device.

The temperature characteristics of the mixture of phosphor A and phosphor B were as follows:

$BR(125)/BR(25)=0.998$, $|x_2(25)-x_2(125)|=0.012$, $|y_2(25)-y_2(125)|=0.000$.

Example 2-2

Figure 21:
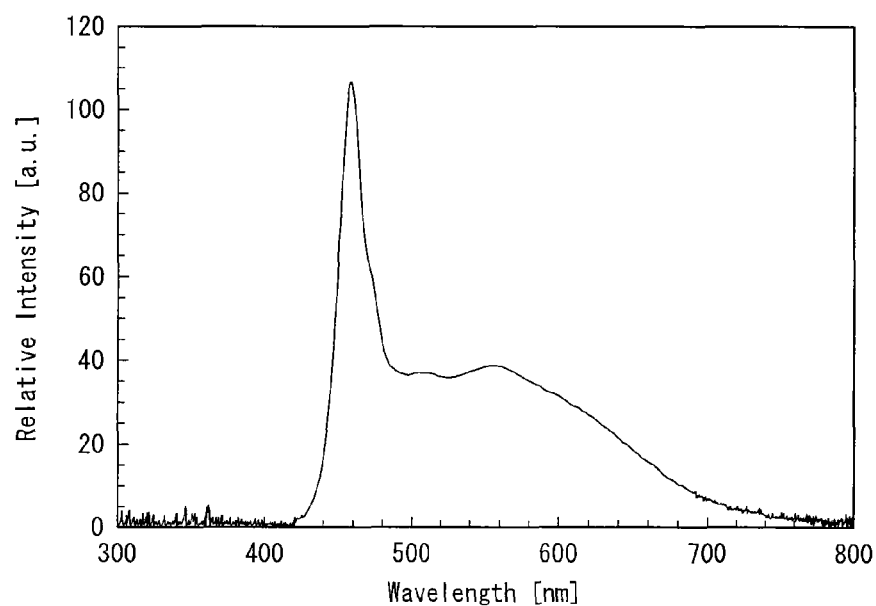
FIG. 21 is a graph showing the emission spectrum of a light-emitting device in Example 2-2.

A light-emitting device was produced as in Example 2-1, except that the phosphor A and the phosphor B were mixed at a mixing ratio of 91:9, and its characteristics were similarly evaluated. Table 2 shows the results. FIG. 21 is an emission spectrum of this light-emitting device.

The temperature characteristics of the mixture of phosphor A and phosphor B were as follows:

$BR(125)/BR(25)=0.998$, $|x_2(25)-x_2(125)|=0.012$, $|y_2(25)-y_2(125)|=0.000$.

TABLE 2

| | |
|---|---|
| Entire luminous flux | 2.6 lm |
| Emission efficiency | 37 lm/W |
| x | 0.294 |
| y | 0.319 |
| Ra | 86 |
| $R_1$ | 90 |
| $R_2$ | 97 |
| $R_3$ | 89 |
| $R_4$ | 75 |
| $R_5$ | 86 |
| $R_6$ | 94 |
| $R_7$ | 82 |
| $R_8$ | 76 |
| $R_9$ | 50 |
| $R_{10}$ | 96 |
| $R_{11}$ | 78 |
| $R_{12}$ | 60 |
| $R_{13}$ | 95 |
| $R_{14}$ | 94 |
| $R_{15}$ | 84 |
| Chromaticity shift | |
| $x_1(17.5)-x_1(70)$ | 0.006 |
| $y_1(17.5)-y_1(70)$ | 0.009 |

Comparative Example 2-1

Figure 22:
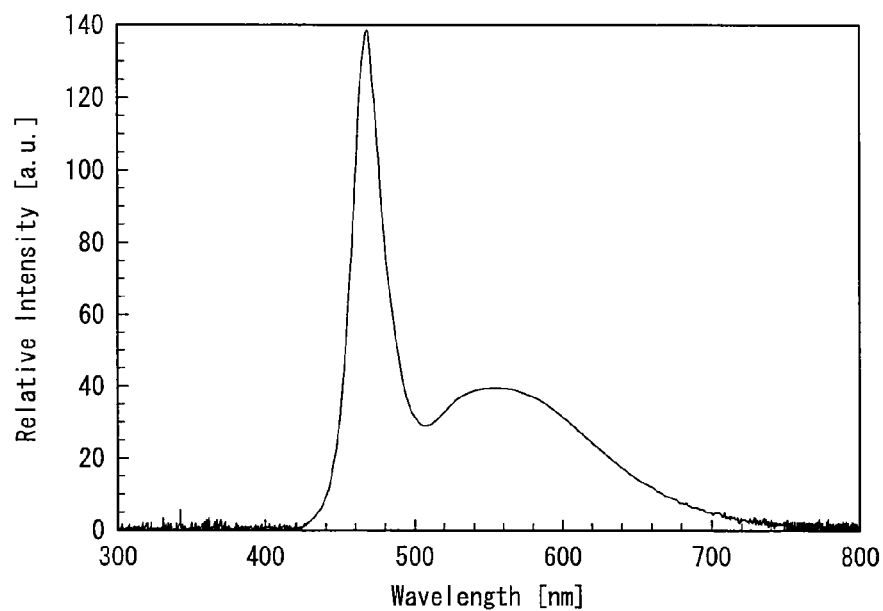
FIG. 22 is a graph showing the emission spectrum of a light-emitting device in Comparative Example 2-1.

A light-emitting device was produced as in Example 2-1, except that the blue LED (103) was "C460 MB" manufactured by Cree Inc. and the phosphor of the fluorescent unit (104) was a phosphor represented by YAG:Ce emitting light with a wavelength of about 480 nm to 720 nm. The characteristics of the device were similarly evaluated. Table 3 shows the results. FIG. 22 is an emission spectrum of this light-emitting device.

TABLE 3

| | |
|---|---|
| Entire luminous flux | 2.6 lm |
| Emission efficiency | 37 lm/W |
| x | 0.280 |
| y | 0.310 |
| Ra | 74 |
| $R_1$ | 86 |
| $R_2$ | 90 |
| $R_3$ | 73 |
| $R_4$ | 51 |
| $R_5$ | 78 |
| $R_6$ | 93 |
| $R_7$ | 65 |
| $R_8$ | 59 |
| $R_9$ | 22 |
| $R_{10}$ | 81 |
| $R_{11}$ | 53 |
| $R_{12}$ | 59 |
| $R_{13}$ | 93 |
| $R_{14}$ | 85 |
| $R_{15}$ | 74 |
| Chromaticity shift | |
| $x_1(17.5)-x_1(70)$ | 0.002 |
| $y_1(17.5)-y_1(70)$ | 0.051 |

III. Example of White-Light Emitting Device

In the following examples, LED denotes light-emitting diode.

Example 3-1

A surface-mounted white-light emitting device was produced by the following procedure and was evaluated.

First, an LED (ES-CEBL912X10X manufactured by EPISTAR Corp.) emitting light with a wavelength of 460 nm was bonded to a terminal on a cup portion (concave) of a frame for a surface-mounted LED with silver paste (electrically conductive mounting member).

Then, electrodes of the LED and terminals of the frame were wire-bonded with a gold wire (electrically conductive wire) having a diameter of 20 μm.

The wavelength-converting material was a mixture of a first phosphor represented by $Ca_{2.97}Ce_{0.03}Sc_2Si_3O_{12}$ and a second phosphor represented by $Ca_{0.992}AlSiEu0.008N_{2.85}O_{0.15}$. The mixing ratio (weight ratio) was (the first phosphor):(the second phosphor)=93:7. These phosphors absorb the light (primary light) from the LED and respectively emit light with a wavelength of 470 nm to 690 nm and light with a wavelength of 540 nm to 760 nm.

The wavelength-converting material and a silicone resin as a binder were thoroughly mixed at a ratio of one gram of the wavelength-converting material to ten grams of the silicone resin. The resulting mixture of the phosphor and the silicone resin was poured into the concave of the frame provided with the LED by bonding. The silicone resin was cured by being maintained at 150° C. for 2 hr to form a phosphor-containing resin unit in the concave. Thus, a surface-mounted white-light emitting device was obtained.

This surface-mounted white-light emitting device was driven by a current of 20 mA at a room temperature (about 24° C.) to emit white light, and the emission spectrum of the white light emitted by the device was measured. The color rendering indices $R_1$ to $R_8$ were calculated on the basis of the emission spectrum according to JIS Z 8726 and the general color rendering index Ra of the indices $R_1$ to $R_8$ was calculated.

Figure 23:
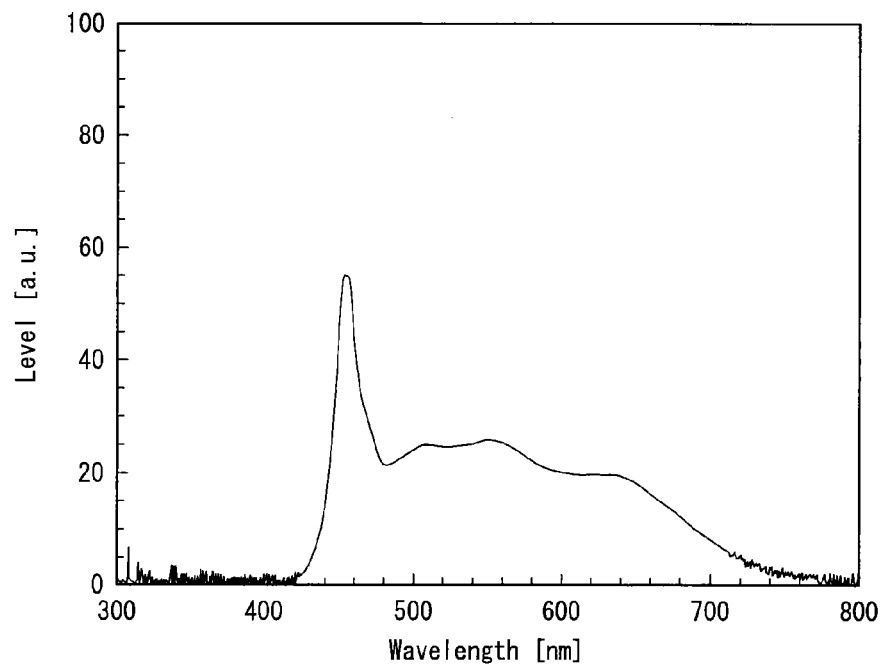
FIG. 23 is an emission spectrum of light emitted by the surface-mounted white-light emitting device in Example 3-1.

The entire light emitted by the surface-mounted white-light emitting device was collected by an integrating sphere and was guided to a spectrometer through an optical fiber for measuring the emission spectrum of the entire light from the surface-mounted white-light emitting device. FIG. 23 is the emission spectrum.

Furthermore, based on the emission spectra of the white light and the entire light, each of the wavelength-converting materials used was subjected to measurement of the internal quantum efficiency and absorption efficiency with respect to the light emitted by the LED, the temperature-dependent coefficient TR (%) of the brightness at 100° C. to that at 25° C., and the flatness [T (ratio)] and the correlated color temperature of the white light emitted by the white-light emitting device in the above-mentioned certain wavelength range. Table 4 shows these characteristics.

Example 3-2

Figure 24:
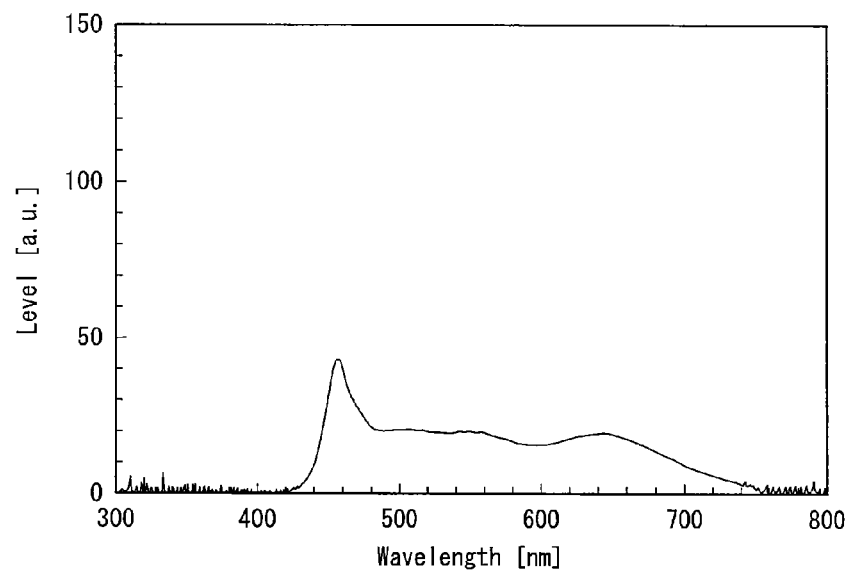
FIG. 24 is an emission spectrum of light emitted by the surface-mounted white-light emitting device in Example 3-2.

A surface-mounted white-light emitting device was produced as in Example 3-1, except that $Ca_{2.97}Ce_{0.03}Sc_{1.94}Mg_{0.06}Si_3O_{12}$ was used as the wavelength-converting material, and the emission spectra of the white light and the entire light from this surface-mounted white-light emitting device were measured. The characteristics were each measured as in Example 3-1. Table 4 shows these characteristics. FIG. 24 is an emission spectrum of the entire light from the surface-mounted white-light emitting device.

Comparative Example 3-1

Figure 25:
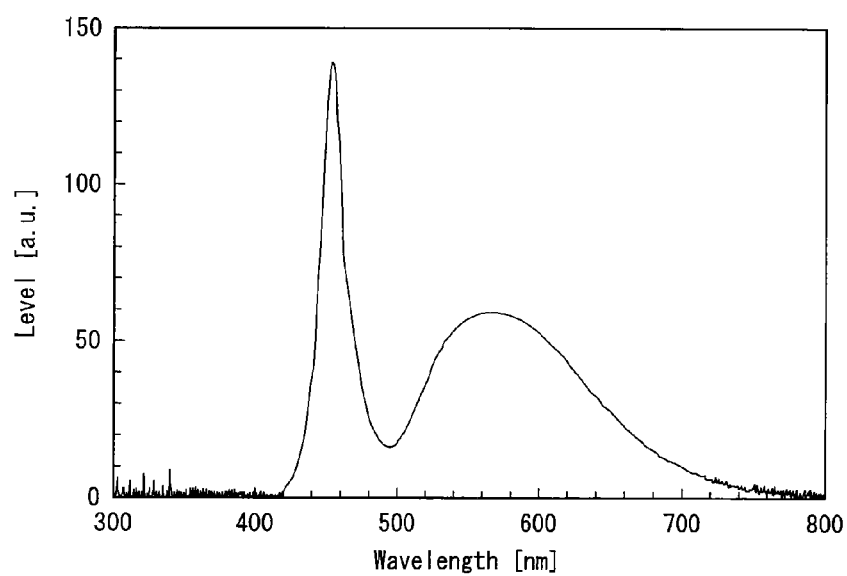
FIG. 25 is an emission spectrum of light emitted by the surface-mounted white-light emitting device in Comparative Example 3-1.

A surface-mounted white-light emitting device was produced as in Example 3-1, except that $(Y,Gd,Ce)_3Al_5O_{12}$ was used as the wavelength-converting material, and the emission spectra of the white light and the entire light emitted by this surface-mounted white-light emitting device were measured. The characteristics were measured as in Example 3-1. Table 4 shows these characteristics. FIG. 25 is an emission spectrum of the entire light emitted by the surface-mounted white-light emitting device.

IV. Example of Image Display Apparatus

Example 4-1

A light-emitting device for a red pixel which was composed of a (In,Ga)N blue LED and a red phosphor was produced. The red phosphor had a chemical composition, $Ca_{0.992}AlSiEu_{0.008}N_3$. This red phosphor absorbs the light emitted by the (In,Ga)N blue LED and emits light with a wavelength of 540 nm to 760 nm.

This red phosphor was synthesized by thoroughly mixing silicon nitride, aluminum nitride, calcium nitride powder, and europium nitride at a predetermined proportion; and heating the mixture at 1800° C. for 2 hr in a graphite resistance electric furnace under a nitrogen atmosphere at 1 MPa.

The red phosphor was subjected to measurement of the emission intensity while the temperature is raised as in the measurement of temperature-dependent coefficient TR described in the above embodiment. No decrease in emission intensity with an increase in temperature was observed. The ratio of the emission intensity at 100° C. to the emission intensity at 25° C. (temperature-dependent coefficient TR) was 109%.

A red light solid light-emitting device, which is similar to that shown in FIG. 12, including this red phosphor was pro-

TABLE 4

| | First phosphor | | | Second phosphor | | | White-light emitting device | | | | |
|---|---|---|---|---|---|---|---|---|---|---|---|
| | Internal quantum efficiency | Absorption efficiency | Temperature-dependent retention [TR] | Internal quantum ciency | Absorption efficiency | Temperature-dependent retention [TR] | Flatness [T (ratio)] | Correlated color temperature | Average of color rendering indices [Ra] | Emission efficiency | Spectrum |
| Example 3-1 | 66% | 74% | 93% | 56% | 77% | 110% | 139% | 6500 K | 94 | 45 lm/W | FIG. 23 |
| Example 3-2 | 69% | 60% | 93% | 53% | 73% | 110% | 113% | 5900 K | 93 | 35 lm/W | FIG. 24 |
| Comparative Example 3-1 | 62% | 82% | 78% | | Not contained | | 307% | 5700 K | 76 | 57 lm/W | FIG. 25 |

Table 4 shows that the color rendering of the white light emitted by the white-light emitting device were enhanced by flattening the emission spectrum in a certain wavelength range of 500 nm to 650 nm to a flatness [T (ratio)] of 150% or less.

The wavelength-converting materials used in Examples 3-1 and 3-2 each have a high temperature-dependent retention of 80% or more. Thereby, the white-light emitting devices produced in Examples 3-1 and 3-2 have a small possibility of a reduction in intensity of the white light by heat generated in the LED with the lapse of time after the operation.

Furthermore, the wavelength-converting materials used in Examples 3-1 and 3-2 each have a high absorption efficiency of 70% or more with respect to the light with the emission wavelength of the LED and have a high internal quantum efficiency of 40% or more. Thereby, the intensity of the light from each white-light emitting device is higher than that of the device of Comparative Example 3-1, and it is therefore conceived that these white-light emitting devices have excellent emission efficiency.

In the white-light emitting device of Comparative Example 3-1, the emission efficiency is higher than those of the white-light emitting devices of Examples 3-1 and 3-2. However, the color rendering and temperature-dependent retention of the used wavelength-converting material are inferior, and thereby the occurrence of a change in color tone due to variable temperature is concerned.

duced according to the process shown below. In the following description, components corresponding to those in FIG. 12 are indicated by the same reference numerals in brackets "[ ]".

An LED (C460-MB290-S0100 (manufactured by Cree Inc.): MB grade, light output: 9 mW to 10 mW) [313] emitting light with a wavelength of 460 nm was bonded to a terminal [315] of a concave [312A] of a frame [312] for a surface-mounted LED with silver paste (conductive mounting member).

Then, electrodes (not shown) of the LED [313] and the terminals [316] of the frame [312] were wire-bonded with gold wire (electrically conductive wire) [317] having a diameter of 20 μm.

The red phosphor [314] and a silicone resin (binder) [318] were thoroughly mixed at a ratio of one gram of the red phosphor to five grams of the silicone resin, and this mixture of the red phosphor and the silicone resin was poured into the concave [312A] of the frame [312] provided with the LED [313] by bonding.

The silicone resin [318] was cured by being maintained at 150° C. for 2 hr to form a phosphor-containing resin unit. Thus, a surface-mounted red light-emitting device [311] was obtained.

This surface-mounted red light-emitting device [311] was driven by 20 mA at a room temperature (about 24° C.) to measure an emission spectrum thereof. Specifically, the entire light from the surface-mounted red light-emitting device [311] was collected by an integrating sphere and was guided to a spectrometer through an optical fiber for measuring its emission spectrum and entire luminous flux.

Figure 26:
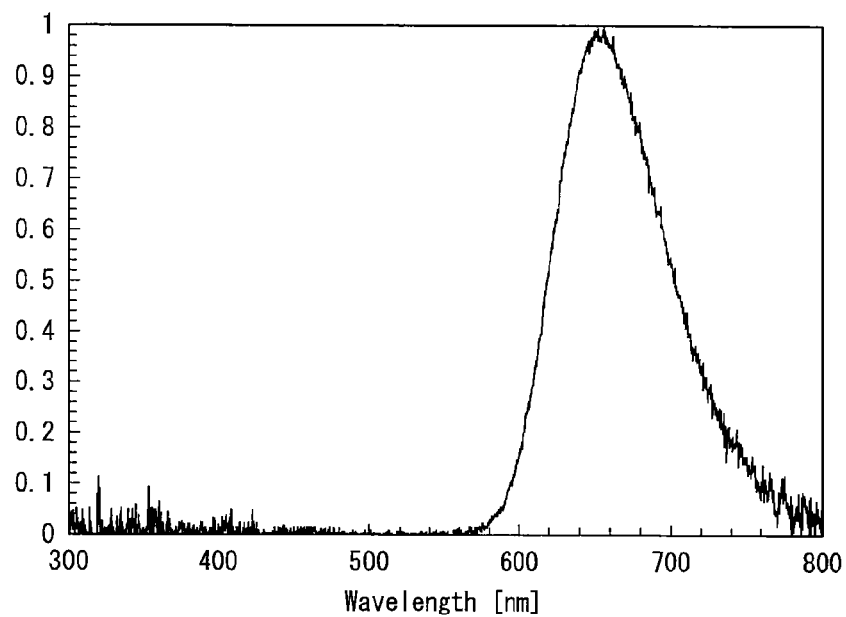
FIG. 26 is an emission spectrum of the red light-emitting device in Example 4-1.

FIG. 26 is an emission spectrum of the red light-emitting device [311].

In the emission spectrum, the CIE color coordinates x and y determined from the emission intensity values in the wavelength range of 380 to 780 nm were x=0.68 and y=0.31.

The internal quantum efficiency of the red phosphor determined from the emission spectrum was 56%.

A green light-emitting device for a green pixel was produced using a blue LED and a green phosphor, $Ca_{2.97}Ce_{0.03}Sc_2Si_3O_{12}$, by a similar process to that in the red light-emitting device [311].

The green phosphor was produced as follows: A predetermined proportion of $CaCO_3$, $Sc_2O_3$, $SiO_2$, and $CeO_2$ and a small amount of ethanol were thoroughly mixed in an agate mortar followed by drying. The dried mixture was wrapped with a platinum foil and was heated at 1500° C. for 3 hr under flowing of nitrogen gas containing 4% by weight of hydrogen to obtain a green phosphor. The resulting green phosphor was washed, pulverized, and classified.

Figure 27:
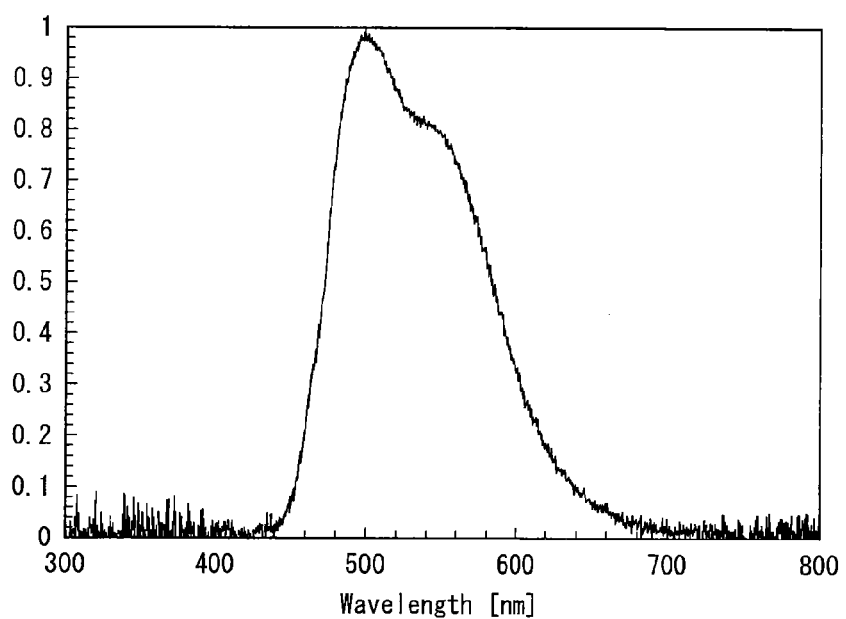
FIG. 27 is an emission spectrum of the green light-emitting device in Example 4-1.

The thus obtained green light-emitting device was subjected to measurement of an emission spectrum, as in the red light-emitting device. FIG. 27 is the emission spectrum of the green light-emitting device.

In the emission spectrum, the CIE color coordinates x and y determined from the emission intensity values in the wavelength range of 380 nm to 780 nm were x=0.29 and y=0.50.

The green phosphor was subjected to measurement of emission intensity at variable temperatures, and the ratio (temperature-dependent coefficient TR) of the emission intensity at 100° C. to the emission intensity at 25° C. was 93%.

Figure 28:
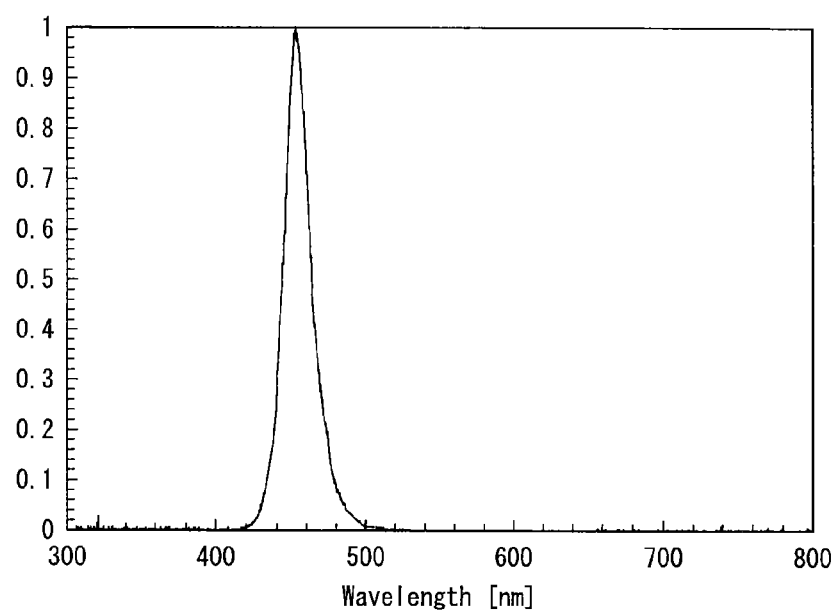
FIG. 28 is an emission spectrum of the blue light-emitting device in Example 4-1.

A blue light-emitting device was produced as in the red light-emitting device [311], except that $TiO_2$ white powder as a diffusing agent was used instead of the red phosphor. The blue light-emitting device was subjected to measurement of an emission spectrum as in the red light-emitting device. FIG. 28 is the emission spectrum of the blue light-emitting device.

By arraying produced red, green, and blue pixels on a plane, and interconnections and forming a controlling circuit for driving, a full-color display apparatus can be produced (display). Since the full-color display apparatus includes red and green pixels each containing a phosphor having high temperature-dependent coefficient TR, the color shift due to a change in temperature can be reduced.

Example 4-2

A full-color display apparatus was produced as in Example 4-1, except that a combination of an (In,Ga)N green light-emitting element and a diffusing agent were used instead of the green light-emitting device constituting a green pixel in Example 4-1.

Figure 29:
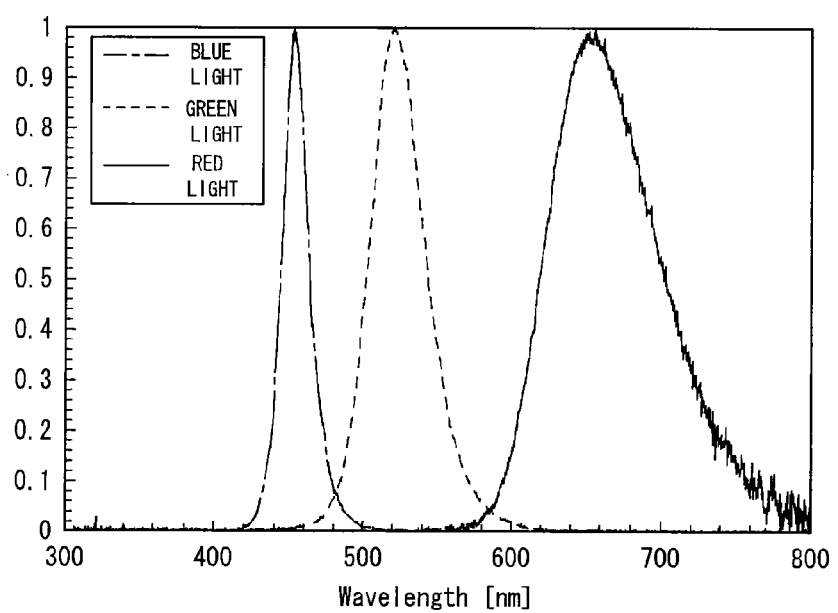
FIG. 29 is emission spectra of the red light-emitting device, the green light-emitting device, and the blue light-emitting device constituting a full-color display apparatus in Example 4-2.

FIG. 29 shows observed emission spectra of three colors of this full-color display apparatus.

Since the full-color display apparatus includes red and green pixels each containing a phosphor having high temperature-dependent coefficient TR, the color shift due to a change in temperature can be reduced.

V. Example of Application of Image Display Apparatus

Green Phosphor

Example 5-1

Figure 30:
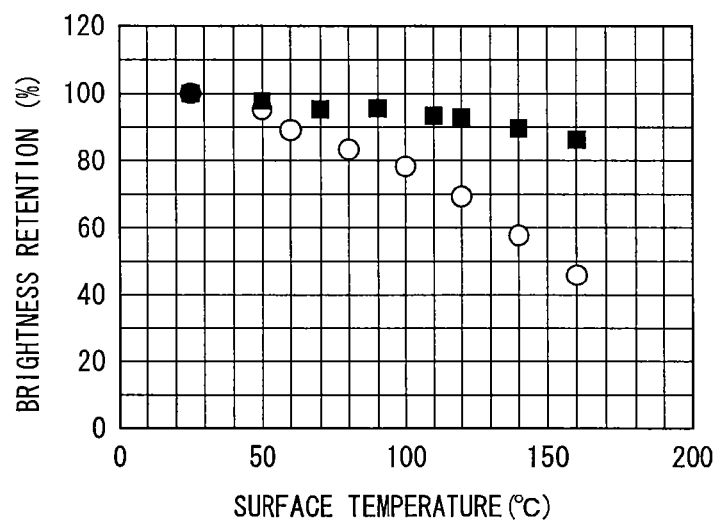
FIG. 30 is a graph showing temperature-dependent retention of the phosphors in Example 5-1 and Comparative Example 5-1.

An oxide phosphor which had a chemical composition of $Ca_3Sc_2Si_3O_{12}$, contained 0.06% by mole of Ce (0.02 mole on the basis of 1 mole of Ca in the chemical composition) as an activator, and had an emission peak wavelength at 505 nm was subjected to measurement of the brightness. The phosphor was excited with blue light having a peak wavelength of 455 nm while being stepwise heated to 160° C. (heating rate: 10° C./min) and being maintained at certain temperatures for 20 seconds so that the brightness at each temperature was measured. FIG. 30 shows the relative brightness (temperature-dependent retention) at each temperature to the 100% brightness at 25° C. In FIG. 30, the plot indicated by squares show the results in Example 5-1.

The brightness was calculated from only the fluorescence spectrum region of 470 nm or more without using the region less than 470 nm of the phosphor in order to avoid the interference with the excitation light with a wavelength of 455 nm.

Comparative Example 5-1

The temperature-dependent retention of a phosphor represented by YAG:Ce was measured as in Example 5-1. FIG. 30 shows the relative brightness (temperature-dependent retention) at each temperature to the 100% brightness at 25° C.

In FIG. 30, the plot indicated by circles show the results in Comparative Example 5-1.

Red Phosphor

Example 5-2

Figure 31:
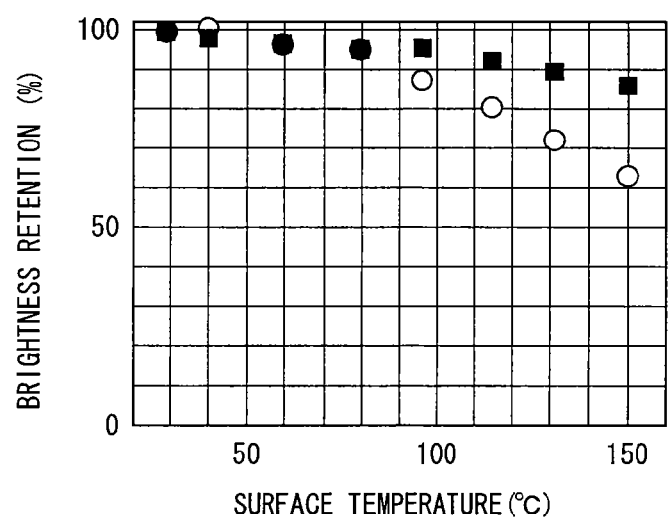
FIG. 31 is a graph showing temperature-dependent retention of the phosphors in Example 5-2 and Comparative Example 5-2.

The temperature-dependent retention of a phosphor having a chemical composition of $CaAlSiN_3$ and containing a activator of 0.8% by mole of Eu (0.008 mole on the basis of 1 mole of Ca in the chemical composition) was measured as in Example 5-1. FIG. 31 shows the relative brightness (temperature-dependent retention) at each temperature to the 100% brightness at 25° C. In FIG. 31, the profile indicated by squares show the results in Example 5-2.

Comparative Example 5-2

The temperature-dependent retention of a phosphor having a chemical composition of $Ca_2Si_5N_8$ and containing an activator of 0.8% by mole of Eu (0.008 mole on the basis of 1 mole of Ca in the chemical composition) was measured as in Example 5-1. FIG. 31 shows the relative brightness (temperature-dependent retention) at each temperature to the 100% brightness at 25° C. In FIG. 31, the plot indicated by circles show the results in comparative Example 5-2.

CONCLUSION

FIG. 30 shows that the phosphor, $Ca_3Sc_2Si_3O_{12}$, used in Example 5-1 has a temperature dependency lower than that of the phosphor, YAG:Ce, used in Comparative Example 5-1. FIG. 31 shows that the phosphor, $CaAlSiN_3$, used in Example 5-2 has a temperature dependency lower than that of the phosphor, $Ca_2Si_5N_8$, used in Comparative Example 5-2. Specifically, these phosphors have high retention of the brightness at 150° C. to that at 25° C. Thus, in display apparatuses including these brightness-retaining phosphors, the color shift in the light from the phosphors due to variable temperature will be small and the color of an image to be displayed can be prevented from shifting from a desired color regardless of temperature conditions.

INDUSTRIAL APPLICABILITY

The present invention can be applied to any industrial field. In particular, the present invention can be preferably applied to interior and exterior lighting systems including light-emitting elements such as LED and image-forming apparatuses such as full-color displays.

The present invention is described in detail with reference to specific embodiments, but it is obvious to those skilled in the art that the present invention can be variously modified without departing from the spirit and the scope of the present invention.

This application claims the benefit of Japanese patent applications: Patent Application No. 2005-080033 filed Mar. 18, 2005, Patent Application No. 2005-092976 filed Mar. 28, 2005, Patent Application No. 2005-103148 filed Mar. 31, 2005, Patent Application No. 2005-151175 filed May 24, 2005, and Patent Application No. 2005-178377 filed Jun. 17, 2005, which are hereby incorporated by reference herein in their entirety.

The invention claimed is:

1. A white light emitting device comprising:
a light source configured to emit light; and
at least one wavelength converting-material configured to absorb at least a part of the light emitted from the light source and configured to emit light having different wavelengths,
wherein the white-light emitting device emits white light comprising the light emitted by the wavelength-converting material,
a maximum intensity of an emission spectrum of the white light at a wavelength range of 500 nm to 650 nm is not higher than 150% of a minimum intensity in the wavelength range, and
said wavelength converting-material comprises at least one green phosphor and comprises at least one red phosphor represented by formula (3):

where M is one or more elements selected from the group consisting of Mn, Ce, Pr, Nd, Sm, Eu, Tb, Dy, Ho, Er, Tm and Yb; A represents one or two elements selected from the group consisting of divalent metallic elements other than the M; D represents one or more elements selected from the group consisting of quadrivalent metallic elements; E represents one or more elements selected from the group consisting of trivalent metallic elements; X represents one or more elements selected from the group consisting of O, N, and F; and a, b, c, d, and e are numbers satisfying:
$0.00001 \le a \le 0.1$,
$a+b=1$,
$0.5 \le c \le 4$,
$0.5 \le d \le 8$,
$0.8 \times (2/3 + 4/3 \times c + d) \le e$, and
$e \le 1.2 \times (2/3 + 4/3 \times c + d)$.

2. The white light emitting device according to claim 1, wherein c and d in the formula (3) satisfy:
$0.5 \le c \le 1.8$, and $0.5 \le d \le 1.8$.

3. The white light emitting device according to claim 1, wherein a luminance of said green phosphor in 100° C. is 80% or more of a luminance of said green phosphor in 25° C.

4. The white light emitting device according to claim 1, wherein said green phosphor is at least one selected from the group consisting of an oxide, a nitride, and an oxynitride.

5. The white light emitting device according to claim 1, wherein said green phosphor is at least one green phosphor selected from the group consisting of $MSi_2N_2O_2$:Eu, M-Si—Al—O—N:Ce, M-Si—Al—O—N:Eu (where M represents one or more alkaline earth metals), and a phosphor which comprises at least Ce as a luminescence center ion in a host crystal represented by formula (1) or (2),

where $M^1$ represents a divalent metallic element, $M^2$ represents a trivalent metallic element, $M^3$ represents a quadrivalent metallic element, and a, b, c, d, and e are numbers satisfying:
$2.7 \le a \le 3.3$,
$1.8 \le b \le 2.2$,
$2.7 \le c \le 3.3$, and
$11.0 \le d \le 13.0$;

where $M^4$ represents a divalent metallic element, $M^5$ represents a trivalent metallic element, and e, f, and g are numbers satisfying:
$0.9 \le e \le 1.1$,
$1.8 \le f \le 2.2$, and
$3.6 \le g \le 4.4$.

6. The white light emitting device according to claim 1, wherein a general color rendering index Ra prescribed in JIS-Z8726 is 90 or greater.

7. The white light emitting device according to claim 1, wherein a brightness of the wavelength-converting material at 100° C. is not less than 80% of a brightness at 25° C.

8. The white light emitting device according to claim 1, wherein an absorption efficiency of the wavelength-converting material for a light with a peak wavelength emitted by the light source is 50% or more, and an internal quantum efficiency of the wavelength-converting material is 40% or more.

9. A lighting system comprising:
the white light emitting device according to claim 1.

10. The white light emitting device according to claim 1, wherein the green phosphor comprises at least one of $Ca_3Sc_2Si_3O_{12}$:Ce and Mg-activated $Ca_3Sc_2Si_3O_{12}$:Ce.

11. The white light emitting device according to claim 1, wherein the green phosphor is $Ca_3Sc_2Si_3O_{12}$:Ce.

12. The white light emitting device according to claim 1, wherein the green phosphor is Mg-activated $Ca_3Sc_2Si_3O_{12}$:Ce.

13. The white light emitting device according to claim 1, wherein the green phosphor comprises at least one of
$Ca_{2.97}Ce_{0.03}Sc_{1.97}Mg_{0.03}Si_3O_{12}$,
$Ca_{2.97}Ce_{0.03}Sc_{1.94}Mg_{0.06}Si_3O_{12}$,
$Ca_{2.94}Ce_{0.03}Sc_{1.94}Mg_{0.06}Si_3O_{12}$,
$Ca_{2.94}Ce_{0.06}Sc_{1.97}Mg_{0.03}Si_3O_{12}$,
$Ca_{2.94}Ce_{0.06}Sc_{1.94}Mg_{0.06}Si_3O_{12}$,
$Ca_{2.94}Ce_{0.06}S_{1.9}Mg_{0.1}Si_3O_{12}$,
$Ca_{2.9}Ce_{0.1}Sc_{1.97}Mg_{0.03}Si_3O_{12}$, and
$Ca_{2.9}Ce_{0.1}Sc_{1.94}Mg_{0.06}Si_3O_{12}$.

14. The white light emitting device according to claim 1, wherein the green phosphor comprises at least one of $Ce_{0.01}Ca_{0.99}Sc_2O_4$, $Ce_{0.007}Ca_{0.993}Sc_2O_4$, and $Ce_{0.013}Ca_{0.987}Sc_2O_4$.

15. The white light emitting device according to claim 1, wherein the green phosphor comprises at least one of $Ce_{0.01}Ca_{0.94}Sr_{0.05}Sc_2O_4$, $Ce_{0.01}Ca_{0.89}Sr_{0.1}Sc_2O_4$, and $Ce_{0.01}Ca_{0.84}Sr_{0.15}Sc_2O_4$.

16. The white light emitting device according to claim 1, wherein in the formula (3), X represents N.

17. The white light emitting device according to claim 1, wherein in the formula (3), X represents a mixture of O and N.

18. The white light emitting device according to claim 1, wherein the wavelength converting-material is a mixture of $Ca_3Sc_2Si_3O_{12}$:Ce and $CaAlSiN_3$:Eu.

* * * * *